United States Patent
Yang et al.

(10) Patent No.: US 11,057,151 B2
(45) Date of Patent: Jul. 6, 2021

(54) MUTUAL INFORMATION BASED POLAR CODE CONSTRUCTION

(71) Applicants: QUALCOMM Incorporated, San Diego, CA (US); Yang Yang, San Diego, CA (US); Jing Jiang, San Diego, CA (US); Gabi Sarkis, San Diego, CA (US); Chao Wei, Beijing (CN); Jian Li, Beijing (CN); Changlong Xu, Beijing (CN); Hari Sankar, San Diego, CA (US); Joseph Binamira Soriaga, San Diego, CA (US)

(72) Inventors: Yang Yang, San Diego, CA (US); Jing Jiang, San Diego, CA (US); Gabi Sarkis, San Diego, CA (US); Chao Wei, Beijing (CN); Jian Li, Beijing (CN); Changlong Xu, Beijing (CN); Hari Sankar, San Diego, CA (US); Joseph Binamira Soriaga, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 71 days.

(21) Appl. No.: 16/487,050

(22) PCT Filed: Dec. 14, 2017

(86) PCT No.: PCT/CN2017/116075
§ 371 (c)(1),
(2) Date: Aug. 19, 2019

(87) PCT Pub. No.: WO2018/166256
PCT Pub. Date: Sep. 20, 2018

(65) Prior Publication Data
US 2021/0135783 A1    May 6, 2021

(30) Foreign Application Priority Data

Mar. 14, 2017   (WO) ................ PCT/CN2017/076585

(51) Int. Cl.
*H04L 1/00* (2006.01)
*G06N 7/00* (2006.01)
(Continued)

(52) U.S. Cl.
CPC .......... *H04L 1/0057* (2013.01); *G06N 7/005* (2013.01); *H03M 13/015* (2013.01);
(Continued)

(58) Field of Classification Search
CPC ... H04L 1/0057; H04L 1/0041; H04L 1/0045; H04L 1/0068; G06N 7/005; H03M 13/015; H03M 13/13
See application file for complete search history.

(56) References Cited

U.S. PATENT DOCUMENTS

2010/0162073 A1   6/2010  Myung et al.
2013/0117344 A1   5/2013  Gross et al.
(Continued)

FOREIGN PATENT DOCUMENTS

CN    103780329 A    5/2014
CN    105656604 A    6/2016
(Continued)

OTHER PUBLICATIONS

International Search Report and Written Opinion—PCT/CN2017/076585—ISA/EPO—dated Dec. 1, 2017 (173068WO1).
(Continued)

*Primary Examiner* — Kyle Vallecillo
(74) *Attorney, Agent, or Firm* — Holland & Hart LLP

(57) ABSTRACT

Methods, systems, and devices for wireless communication are described for mutual information based polar code
(Continued)

construction. A wireless device may receive a codeword over a wireless channel, the codeword encoded using a polar code. The wireless device may identify a set of bit locations of the polar code corresponding to information bits of an encoded information bit vector. The set of bit locations may be determined based at least in part on a reliability order of the bit locations of the polar code, and the reliability order may be determined based at least in part on a recursive model that includes at least one mutual information transfer function that is applied at each polarization stage of multiple polarization stages of the polar code. The wireless device may decode the received codeword to obtain the information bit vector at the set of bit locations.

69 Claims, 29 Drawing Sheets

(51) Int. Cl.
*H03M 13/01* (2006.01)
*H03M 13/13* (2006.01)

(52) U.S. Cl.
CPC .......... *H03M 13/13* (2013.01); *H04L 1/0041* (2013.01); *H04L 1/0045* (2013.01); *H04L 1/0068* (2013.01)

(56) References Cited

U.S. PATENT DOCUMENTS

| | | | |
|---|---|---|---|
| 2015/0092886 A1 | 4/2015 | Ionita et al. | |
| 2015/0194987 A1 | 7/2015 | Li et al. | |
| 2016/0013887 A1 | 1/2016 | Shen et al. | |
| 2016/0164629 A1 | 6/2016 | Ahn et al. | |
| 2016/0204811 A1 | 7/2016 | Goela et al. | |
| 2016/0294418 A1 | 10/2016 | Huang et al. | |
| 2016/0344426 A1 | 11/2016 | Bhatia et al. | |
| 2018/0191459 A1* | 7/2018 | Ge | H03M 13/13 |
| 2018/0248655 A1* | 8/2018 | Belfiore | H03M 13/618 |
| 2019/0034009 A1* | 1/2019 | Ueno | G06F 3/045 |
| 2019/0103883 A1* | 4/2019 | Ye | H04L 1/0042 |
| 2019/0140663 A1* | 5/2019 | Noh | H04L 1/0057 |
| 2019/0207720 A1* | 7/2019 | Li | H03M 13/13 |
| 2019/0305799 A1* | 10/2019 | Gabry | H03M 13/033 |
| 2019/0326933 A1* | 10/2019 | Zhang | H03M 13/618 |
| 2019/0349141 A1* | 11/2019 | Ahn | H03M 13/6362 |
| 2020/0028524 A1* | 1/2020 | Huang | H03M 13/13 |
| 2020/0067531 A1* | 2/2020 | Chen | H03M 13/6318 |

FOREIGN PATENT DOCUMENTS

| | | |
|---|---|---|
| CN | 106130687 A | 11/2016 |
| WO | WO-2016112285 A2 | 7/2016 |
| WO | WO-2018126496 A1 | 7/2018 |

OTHER PUBLICATIONS

International Search Report and Written Opinion—PCT/CN2017/079292—ISA/EPO—dated Nov. 29, 2017 (173068WO2).
International Search Report and Written Opinion—PCT/CN2017/116075—ISA/EPO—dated Feb. 26, 2018 (3068WO3).
QUALCOMM Incorporated: "Polar Code Information Bit Allocation and Nested Extension Construction", 3GPP Draft, R1-1702646, 3GPP TSG-RAN WG1 Meeting #88, Polar Code Information Bit Allocation and Nested Extension Construction, 3rd Generation Partnership Project (3GPP), Mobile Competence Centre, 650, Route Des Lucioles, F-06921, vol. RAN WG1, no. Athens, Greece, Feb. 13, 2017-Feb. 17, 2017, Feb. 12, 2017 (Feb. 12, 2017), XP051209795, pp. 1-13, Retrieved from the Internet: URL:http://www.3gpp.org/ftp/Meetings_3GPP_SYNC/RAN1/Docs/ [retrieved on Feb. 12, 2017] the Whole Document.
Supplementary Partial European Search Report—EP17900489—Search Authority—Munich—Dec. 4, 2020(173068EP).
Kai C., et al., "Practical Polar Code Construction Over Parallel Channels", IET Communications, The Institution of Engineering and Technology, GB, vol. 7, No. 7, May 2013 (May 2013), pp. 620-627, XP006095736, ISSN: 1751-8628, DOI:10.1049/IET-COM. 2012.0428 the Whole Document.
Kai N., et al., "Rate-Compatible Punctured Polar Codes: Optimal Construction Based on Polar Spectra", ARXIV.org, Cornell University Library, 201 Olin Library Cornell University Ithaca, NY 14853, Dec. 5, 2016 (Dec. 5, 2016), XP080736837, pp. 1-14, the Whole Document.
Kern D., et al., "A New Code Construction for Polar Codes Using Min-Sum Density", 2014 8th International Symposium On Turbo Codes and Iterative Information Processing (ISTC), IEEE, Aug. 18, 2014 (Aug. 18, 2014), pp. 228-232, XP032682424, DOI: 10.1109/ISTC.2014.6955119 [retrieved on Nov. 12, 2014] Section III.
Niu K., et al., "Polar Codes: Primary Concepts and Practical Decoding Algorithms", IEEE Communications Magazine, IEEE Service Center, Piscataway, US, vol. 52, No. 7, Jul. 2014, 12 pages, XP011553413, ISSN: 0163-6804, DOI: 10.1109/MCOM.2014. 6852102 [retrieved on Jul. 10, 2014], sections "channel polarization", "channel selection" and Figure 1.
Qualcomm Incorporated: "FRANK Polar Construction: Nested Extension Design of Polar Codes Based on Mutual Information", 3GPP TSG-RAN WG1 #88b, 3GPP Draft, R11706130, Frank Polar Construction Nested Extension Design of Polar Codes Based on Mutual Information, 3rd Generation Partnership Project (3GPP), Mobile Competence Centre, 650, Route Des, vol. RAN WG1, No. Spokane, USA, Apr. 3, 2017-Apr. 7, 2017, Mar. 30, 2017 (Mar. 30, 2017), 24 pages, XP051252420, Retrieved from the Internet: URL: http://www.3gpp.org/ftp/tsg_ran/WG1_RL1/TSGR1_88b/Docs/ [retrieved on Mar. 30, 2017], Section 3.3, Appendix A, Appendix B, the Whole Document.
Supplementary European Search Report—EP17900489—Search Authority—Munich—Apr. 7, 2021.

* cited by examiner

MUTUAL INFORMATION BASED POLAR CODE CONSTRUCTION

CROSS REFERENCES

The present Application is a 371 national phase filing of International Application No. PCT/CN2017/116075 by Yang et al., titled "MUTUAL INFORMATION BASED POLAR CODE CONSTRUCTION", filed Dec. 14, 2017, which claims priority to International Application No. PCT/CN2017/079292 by Yang et al., titled "MUTUAL INFORMATION BASED POLAR CODE CONSTRUCTION", filed Apr. 1, 2017, and to International Application No. PCT/CN2017/076585 by Yang et al., titled "MUTUAL INFORMATION BASED POLAR CODE CONSTRUCTION", filed Mar. 14, 2017, each of which is assigned to the assignee hereof.

BACKGROUND

The following relates generally to wireless communication, and more specifically to mutual information based polar code construction.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDPC) codes, and polar codes. Some coding techniques, such as polar coding, use reliability metrics during encoding and decoding such that information bits may be loaded at bit channels of the encoder (or retrieved from bit channels of the decoder) that are associated with favorable (e.g., high) reliability metrics. Conventional techniques for determining bit channel reliability are deficient.

SUMMARY

The described techniques relate to improved methods, systems, devices, or apparatuses that support mutual information based polar code construction. Generally, the described techniques provide for identifying a set of bit locations of a polar coding scheme at which to load information bits based at least in part on a reliability order for the bit locations. In some examples, a recursive model may be applied to determine a reliability order of bit locations of the polar coding scheme. The model include at least one mutual information transfer function that is recursively applied at each polarization stage of a set of polarization stages of the polar coding scheme to determine a channel capacity, or mutual information, of each of a set of polarized bit channels. The reliability order may rank the polarized bit channels based on the determined channel capacities. Some examples described herein may provide for signal-to-noise ratio (SNR) independent bit channel reliability ordering by sweeping through multiple different target mutual information values, target SNR values, or both.

In some cases, an encoder may load information bits of an information bit vector into bit locations determined to be the most reliable for polar encoding to form a codeword for transmission over a wireless channel. In an example, an encoder of a transmitter may load information bits of the information bit vector on polarized bit channels of the polar coding scheme associated with the highest reliability metrics, and the remaining bits (e.g., parity bits and frozen bits) may be loaded on the remaining polarized bit channels. The polar coding scheme may output a codeword at a set of bit locations from a set of unpolarized bit channels of the polar coding scheme, and the transmitter may transmit the codeword over a wireless channel.

A receiver may receive the codeword via a wireless channel and a decoder may identify the most reliable bit locations of the polar coding scheme for decoding of information bits from the received codeword. The receiver may apply the recursive model for determining the reliability order, or the transmitter may indicate to the receiver, via signaling, the reliability order. The decoder may identify a set of bit locations of the polar code corresponding to information bits of an encoded information bit vector, and decode the received codeword to obtain the information bit vector at the set of bit locations.

A method of wireless communication is described. The method may include receiving a codeword over a wireless channel, the codeword encoded using a polar code, identifying a set of bit locations of the polar code corresponding to information bits of an encoded information bit vector, wherein the set of bit locations is determined based at least in part on a reliability order of the bit locations of the polar code, and wherein the reliability order is determined based at least in part a recursive model that includes at least one mutual information transfer function that is applied at each polarization stage of a plurality of polarization stages of the polar code, and decoding the received codeword to obtain the information bit vector at the set of bit locations.

An apparatus for wireless communication is described. The apparatus may include means for receiving a codeword over a wireless channel, the codeword encoded using a polar code, means for identifying a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code, and means for decoding the received codeword to obtain the information bit vector at the set of bit locations.

Another apparatus for wireless communication is described. The apparatus may include a processor, memory in electronic communication with the processor, and instructions stored in the memory. The instructions may be operable to cause the processor to receive a codeword over a wireless channel, the codeword encoded using a polar code, identify a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code, and decode the received codeword to obtain the information bit vector at the set of bit locations.

A non-transitory computer readable medium for wireless communication is described. The non-transitory computer-readable medium may include instructions operable to cause a processor to receive a codeword over a wireless channel, the codeword encoded using a polar code, identify a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code, and decode the received codeword to obtain the information bit vector at the set of bit locations.

A non-transitory computer readable medium for wireless communication is described. The non-transitory computer-readable medium may include instructions operable to cause a processor to identify an information bit vector for encoding using a polar code, identify a set of bit locations of the polar code to be used for information bits of the information bit vector, wherein the set of bit locations is determined based at least in part on a reliability order of the bit locations of the polar code, and wherein the reliability order is determined based at least in part on a recursive model that includes at least one transfer function that is applied at each polarization stage of a plurality of polarization stages of the polar code, encode the information bit vector mapped to the set of bit locations using the polar code to obtain a codeword, and transmit the codeword over a wireless channel.

The methods, apparatuses, and non-transitory computer-readable mediums described above may further include calculating mutual information of a first subset of bit locations for a current polarization stage of the plurality of polarization stages based at least in part on mutual information of a second subset of the bit locations from a preceding polarization stage of the plurality of polarization stages.

In some examples of the methods, apparatuses, and non-transitory computer-readable mediums described above, the reliability order of the bit locations of the polar code may be constructed based at least in part on the recursive model and a plurality of different target mutual information values.

In some examples of the methods, apparatuses, and non-transitory computer-readable mediums described above, applying the recursive model includes: performing a sweep over the plurality of different target mutual information values to determine at least portions of respective output mutual information value curves for each of the bit locations of the polar code, and determining the reliability order of the bit locations of the polar code corresponding to an order in which each of the respective output mutual information value curves reaches a defined output mutual information value with respect to the plurality of different target mutual information values.

In some examples of the methods, apparatuses, and non-transitory computer-readable mediums described above, a first subset of the set of bit locations may be determined based at least in part on a first reliability order determined from applying the recursive model for a first target mutual information value and a second subset of the set of bit locations may be determined based at least in part on a second reliability order determined from applying the recursive model for a second target mutual information value.

In some examples of the methods, apparatuses, and non-transitory computer-readable mediums described above, the first target mutual information value may be based at least in part on a first number of information bits to be encoded and a number of the bit locations, and the second target mutual information value may be based at least in part on a second number of information bits to be encoded and the number of the bit locations.

In some examples of the methods, apparatuses, and non-transitory computer-readable mediums described above, the recursive model may be a Gaussian approximation density-based evolution model, and wherein the reliability order of the bit locations of the polar code may be constructed based at least in part on the Gaussian approximation density-based evolution model and a plurality of different target SNR values. In some examples of the methods, apparatuses, and non-transitory computer-readable mediums described above, the recursive model includes: performing a sweep over the plurality of different target SNR values to determine at least portions of respective error rate value curves for each of the bit locations of the polar code, and determining the reliability order of the bit locations of the polar code corresponding to an order in which each of the respective error rate value curves reaches a defined error rate value with respect to the plurality of different SNR values:

In some examples of the methods, apparatuses, and non-transitory computer-readable mediums described above, identifying the set of bit locations of the polar code corresponding to the information bits of the encoded information bit vector comprises: retrieving the set of bit locations from a table that includes a plurality of sets of bit locations.

In some examples of the methods, apparatuses, and non-transitory computer-readable mediums described above, storing a table that lists a plurality of sets of bit locations, wherein identifying the set of bit locations of the polar code corresponding to the information bits of the encoded information bit vector comprises: determining that a first bit location of the bit locations corresponds to a punctured bit, and determining not to retrieve any of the plurality of sets of bit locations from the table, wherein applying the recursive model may be performed by a decoder to identify the set of bit locations.

In some examples of the methods, apparatuses, and non-transitory computer-readable mediums described above, a first bit location of the bit locations may correspond to a punctured bit. In some examples of the methods, apparatuses, and non-transitory computer-readable mediums described above, mutual information of the first bit location at a first polarization stage is calculated based at least in part on the at least one mutual information transfer function and mutual information associated with the punctured bit.

In some examples of the methods, apparatuses, and non-transitory computer-readable mediums described above, the mutual information associated with the punctured bit is set to zero for non-shortening based puncturing or is set to a unity value for shortening-based puncturing.

In some examples of the methods, apparatus, and non-transitory computer-readable medium described above, target mutual information for bit channels corresponding to bit locations other than the puncture bit is determined based at least in part on a number of information bits to be encoded and a number of the bit locations excluding the bit channel associated with the punctured bit.

In some examples of the methods, apparatuses, and non-transitory computer-readable mediums described above, the at least one mutual information transfer function is based at least in part on a binary erasure channel (BEC) function and a correction term.

In some examples of the methods, apparatuses, and non-transitory computer-readable mediums described above, the correction term is based at least in part on a bit channel capacity of the each stage of polarization and a capacity imbalance factor. In some examples of the methods, apparatuses, and non-transitory computer-readable mediums described above, the correction term comprises an offset factor applied to the bit channel capacity. In some examples of the method, apparatus, and non-transitory computer-readable medium described above, the correction term comprises a scaling factor applied to the offset bit channel capacity. In some examples of the methods, apparatuses, and non-transitory computer-readable mediums described above, the correction term comprises an offset applied to the scaled and offset bit channel capacity.

In some examples of the methods, apparatuses, and non-transitory computer-readable mediums described above, the codeword comprises at least one repeated bit of a bit location of the polar code. In some examples of the methods, apparatuses, and non-transitory computer-readable mediums described above, a target mutual information for bit channels of the polar code is determined based at least in part on a number of information bits to be encoded and a number of bit locations in the codeword including the repeated bit location.

In some examples of the methods, apparatuses, and non-transitory computer-readable mediums described above, an offset is applied to the target mutual information for the bit channels.

DETAILED DESCRIPTION

Figure 1:
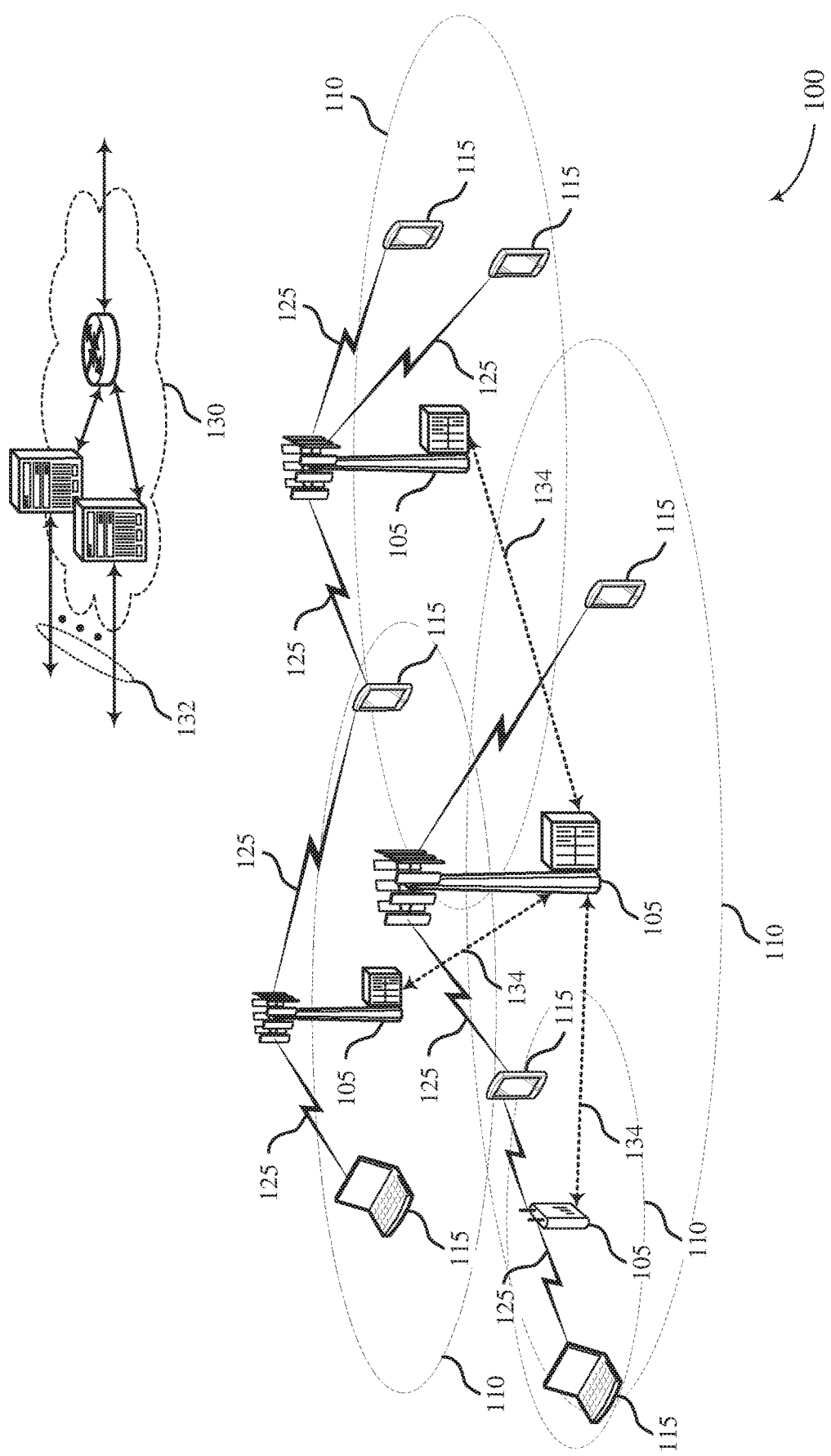
FIG. 1 illustrates an example of a system for wireless communication that supports mutual information based polar code construction in accordance with aspects of the present disclosure.

Techniques are described for mutual information based polar code construction. A wireless device, such as a base station or a user equipment (UE), may encode a set of bits using a polar code to generate a codeword that is transmitted to a receiver via a wireless channel. The number of bits generated by a polar code encoder may be determined based at least in part on a power function (e.g., $2^m$). A transmitting wireless device may identify a number of information bits (e.g., of an information bit vector) to include in the codeword, and may map the information bits to bit locations of different polarized bit channels based on a reliability order. The reliability order may be determined for bit locations of a polar coding scheme based at least in part on a recursive model. The recursive model may include at least one mutual information transfer function that is applied at each polarization stage of multiple polarization stages for determining a capacity of a set of polarized bit channel at a last of the polarization stages. The capacity of a given polarized bit channel may be a function of a reliability metric of that bit channel. Channel capacity may also be referred to herein as mutual information. The recursive model may use channel capacity, and instead of, or in addition to, other metrics, such as signal to noise ratio (SNR), for determining the reliability order of the set of bit channels of the polar coding scheme. Information bits may be loaded on the polarized bit channels associated with the highest reliability metrics, and the remaining bits (e.g., parity bits and frozen bits) may be loaded on the remaining polarized bit channels.

Conventional techniques identify bit channel reliability using a proxy for channel capacity. For example, Polarization Weight (PW) is one technique that estimates bit channel reliability based on the number of repetition operations involved in decoding a particular bit channel. The present techniques provide for more accurate estimates of bit channel reliability using a mutual information (MI) transfer function applied at each of multiple polarization stages based on a target MI. Although an additive white Gaussian noise (AWGN) MI transfer function is a good approximation of channel noise, it may be too computationally complex for many practical applications. Some examples described herein approximate an AWGN MI transfer function by adding a correction term to a binary erasure channel (BEC) MI transfer function. The examples described herein approach the AWGN MI transfer function with a reduced computational complexity, enabling for simpler computation of bit channel reliability. Some examples provide for signal-to-noise ratio (SNR) or signal-to-interference plus noise (SINR) independent bit channel reliability ordering using an incremental construction of a reliability order at various target MI values.

In some cases, examples described herein provide for SNR independent bit channel reliability ordering by sweeping through multiple different target mutual information values to determine at least portions of respective output mutual information value curves for each of the bit locations of the polar code, and by determining the reliability order of the bit locations of the polar code corresponding to an order in which each of the respective output mutual information value curves reaches a defined output mutual information value with respect to the multiple different target mutual information values. In some cases, a Gaussian approximation density-based evolution model may be used for determining SNR independent bit channel reliability ordering. In an example, a sweep over multiple different target SNR values may be performed to determine at least portions of respective error rate value curves for each of the bit locations of the polar code, and the reliability order of the bit locations of the polar code may be determined corresponding to an order in which each of the respective error rate value curves reaches a defined error rate value with respect to the multiple different target SNR values.

In some examples, an encoder may load information bits into bit locations determined to be the most reliable for polar encoding to form a codeword for transmission over a wireless channel. A decoder may identify the most reliable bit locations for decoding of information bits from a codeword received via a wireless channel.

Aspects of the disclosure are initially described in the context of a wireless communications system. Examples of processes that support mutual information based polar code construction are described. Aspects of the disclosure are further illustrated by and described with reference to apparatus diagrams, system diagrams, and flowcharts that relate to mutual information based polar code construction.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

The base station 105 or the UE 115 may operate as a transmitting wireless device, a receiving wireless device, or both. A transmitting wireless device may identify a number of information bits (e.g, of an information bit vector) to include in a codeword, and the transmitting device may map information bits to bit locations of a polar coding scheme based on a reliability order for generating the codeword. In some cases, the set of bit locations may be determined based at least in part on a reliability order of the bit locations. The reliability order may be determined based at least in part on a recursive model. The recursive model may include at least one mutual information transfer function that is applied at each polarization stage of multiple polarization stages of the polar code for determining the reliability order of the bit channels. In some cases, SNR independent bit channel reliability ordering may be determined by sweeping through multiple different target mutual information values, target SNR values, or both. During encoding, the transmitting wireless device may load the information bits into the bit locations of the polar coding scheme based at least in part on the reliability order. The transmitting wireless device may also load other bits (e.g., parity bits and frozen bits) into the remaining bit locations of the polar coding scheme (e.g., into bit locations of less reliable bit channels). The transmitting wireless device may encode the information bits and the other bits mapped to the bit locations using the polar code to obtain a codeword. The transmitting wireless device may transmit the codeword via a wireless channel.

A receiving wireless device may receive, over the wireless channel, a codeword encoded using a polar code. The receiver may identify a set of bit locations of a polar code corresponding to information bits of an encoded information bit vector. As described above, the set of bit locations of the information bits may be determined based at least in part on the reliability order of the bit locations. The receiver may apply the recursive model to determine the reliability order, or the transmitter may indicate to the receiver, via signaling, the reliability order. The receiver may decode the received codeword to obtain the information bit vector at the set of bit locations of the polar code corresponding to information bits.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g, radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g, from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g, a base station 105) to shape and/or steer an overall antenna beam in the direction of a target receiver (e.g, a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g, a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and base station 105 or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s = 1/30,720,000$ seconds). Time resources may be organized according to radio frames of length of 10 ms ($T_f = 307200 T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TT may be shorter than a subframe or may be dynamically selected (e.g, in short TT bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

In some cases, wireless communications system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration may be associated with increased subcarrier spacing. A TTI in an eCC may consist of one or multiple symbols. In some cases, the TT duration (that is, the number of symbols in a TTI) may be variable. In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g, across time) sharing of resources.

In some cases, wireless system 100 may utilize both licensed and unlicensed radio frequency spectrum bands. For example, wireless system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based at least in part on a CA configuration in conjunction with CCs operating in a licensed band. Operations in unlicensed spectrum may include downlink transmissions, uplink transmissions, or both. Duplexing in unlicensed spectrum may be based at least in part on frequency division duplexing (FDD), time division duplexing (TDD) or a combination of both.

Wireless communications system 100 may support efficient techniques for identifying a set of bit locations of a polar code at which to load information bits based at least in part on a reliability order for the bit locations. An encoder may identify a target mutual information for bit channels of a polar coding scheme, and may use the target mutual information for identifying a reliability order for bit locations corresponding to the bit channels. At each stage of polarization of the polar code, a mutual information of each bit channel is determined based at least in part on bit channel capacities of input bit channels from a previous stage of polarization and a mutual information transfer function. A mutual information determined for each bit channel may indicate a reliability of each bit channel, and the mutual information of each bit channel may be ranked to determine a reliability order of the bit channels. The reliability order may be used to determine an order in which to load information bits into the polar coding scheme. In some cases, SNR independent bit channel reliability ordering may be determined by sweeping through multiple different target mutual information values, target SNR values, or both.

Figure 2:
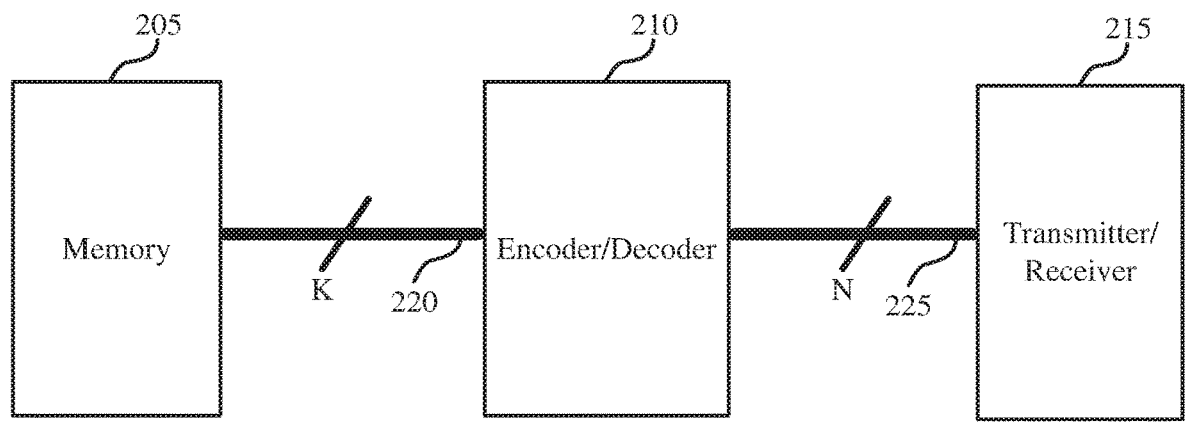
FIG. 2 illustrates an example of a device that supports mutual information based polar code construction in accordance with aspects of the present disclosure.

FIG. 2 illustrates an example of a device 200 that supports mutual information based polar code construction in accordance with various aspects of the present disclosure. Device 200 may include memory 205, encoder/decoder 210, and transmitter/receiver 215. Bus 220 may connect memory 205 and encoder/decoder 210, and bus 225 may connect encoder/decoder 210 and transmitter/receiver 215. In some instances, device 200 may have data stored in memory 205 to be transmitted to another device, such as, a UE 115 or a base station 105. To initiate data transmission, device 200 may retrieve the data, including information bits, from memory 205 for the transmission. The information bits included in memory 205 may be passed on to encoder/decoder 210 via bus 220. The number of information bits to be included per codeword may be represented as a value k, as shown.

Encoder/decoder 210 may encode k information bits and output a codeword having a length N, where k<N. Parity bits may be used in some forms of outer codes to provide redundancy to protect information bits, and frozen bits may be assigned a given value (0, 1, etc.) known to both the encoder and the decoder (i.e., the encoder encoding information bits at a transmitter, and the decoder decoding the codeword received at a receiver). From a transmitting device perspective, device 200 may encode information bits to produce a codeword, and the codeword may be transmitted via transmitter 215. For a receiving device perspective, device 200 may receive encoded data (e.g., a codeword) via receiver 215 and may decode the encoded data using decoder 210 to obtain the information bits.

Device 200 may generate a codeword of length N and dimensionality k (corresponding to the number of information bits) using a polar code. A polar code is an example of a linear block error correcting code and has been shown to approach the theoretical channel capacity as the length of N increases. Polar codes may increase the probability of a successful transmission relative to other codes for a given codeword length and SNR. During encoding, a set of unpolarized bit channels may be transformed into polarized bit channels (e.g., channel instances or sub-channels) that may each be associated with a reliability metric. A reliability metric of a polarized bit channel may approximate the ability of the polarized bit channel to successfully convey an information bit to a receiver. Each polarized bit channel may then be loaded with an information bit or non-information bit for a transmission based at least in part on the reliability metrics of different polarized bit channels.

In various aspects, reliability metrics may be determined based at least in part on a recursive model, such as a recursive mutual information model. The recursive mutual information model may apply at least one mutual information transfer function at each polarization stage of multiple polarization stages of a polar code. Each stage may include multiple bit channels, where the number of bit channels in a polar code is the same as the length N of the codeword. The recursive mutual information model may determine mutual information of each bit channel at each stage. The recursive mutual information model may determine a reliability order of the bit channels using mutual information respectively determined for each bit channel at a last of the multiple polarization stages.

In some examples, a transmitting wireless device may identify a number of information bits to be encoded per codeword (e.g., of an information bit vector), and the transmitting device may map the information bits to bit locations of a polar coding scheme based at least in part on the reliability order. During encoding, encoder 210 may load the information bits into bit locations based the reliability order. The encoder 210 may also load other bits (e.g., parity bits and frozen bits) into remaining bit locations of the polar coding scheme. In an example, the encoder 210 may sequentially load the information bits into the bit locations of the most reliable bit channels, and may load the other bits (e.g., parity bits, frozen bits, etc.) into the other bits locations associated with less reliable bit channels. The encoder 210 may encode the information bits and other bits mapped to the bit locations using the reliability order to obtain a codeword. The encoder 210 may output the codeword to the transmitter 215, and the transmitter 215 may transmit the codeword via a wireless channel.

A receiving wireless device may receive, at receiver 215, a codeword over the wireless channel, the codeword encoded using a polar code. The receiver 215 may provide the codeword to decoder 210 for decoding. The decoder 210 may identify a set of bit locations of the polar code corresponding to information bits of an encoded information bit vector. In some cases, the set of bit locations may be determined based at least in part on a reliability order of the bit locations of the polar code. The reliability order may be determined based at least in part on a recursive model that includes at least one mutual information transfer function that is applied at each polarization stage of a multiple polarization stages of the polar code. The decoder 210 may decode the received codeword to obtain the information bit vector at the set of bit locations.

Figure 3:
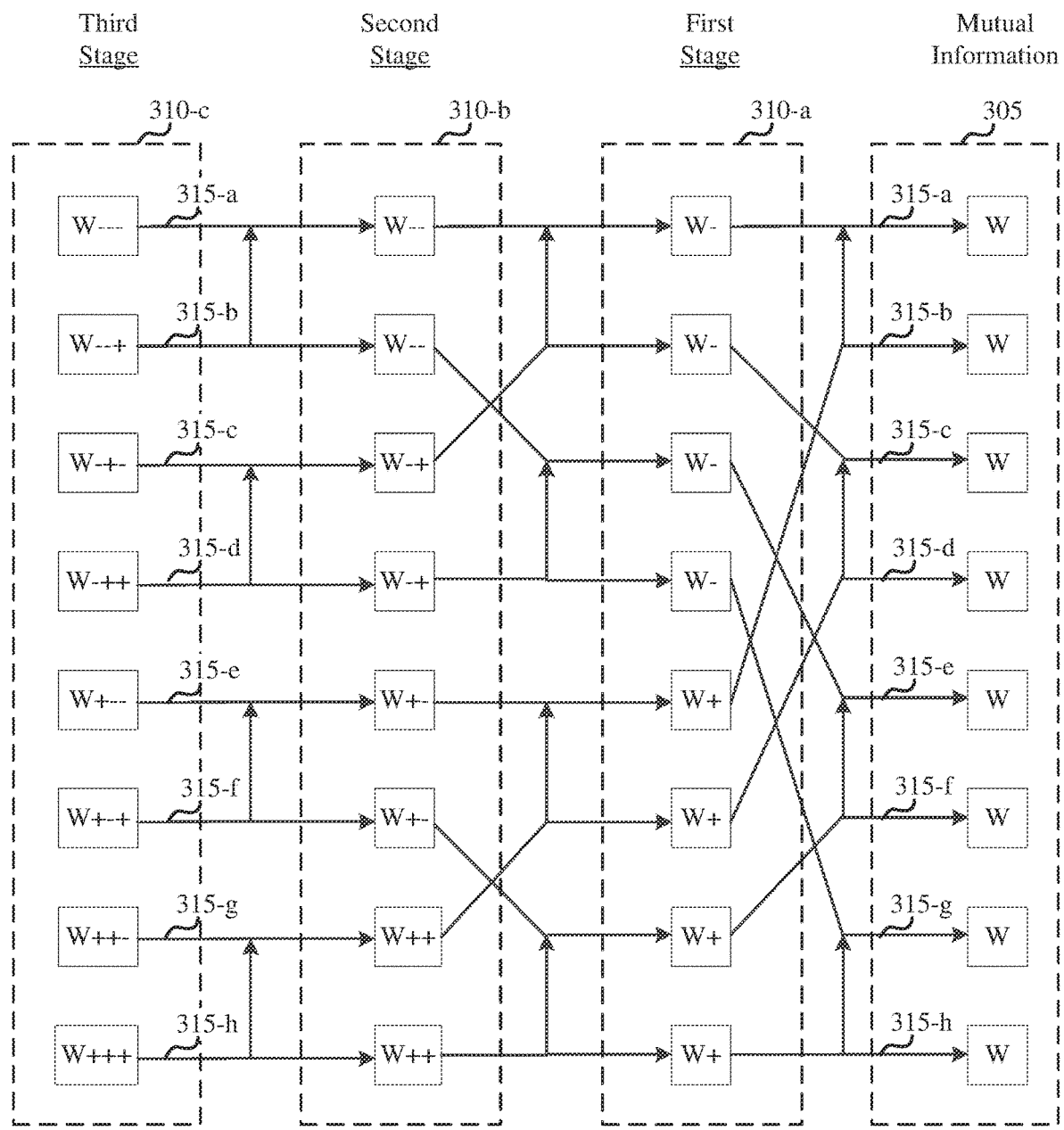
FIG. 3 illustrates an example of a polar coding scheme that supports mutual information based polar code construction in accordance with aspects of the present disclosure.

FIG. 3 illustrates an example of a polar coding scheme 300 that supports mutual information based polar code construction in accordance with various aspects of the present disclosure. In some cases, a transmitting wireless device (e.g., a base station or a UE) may identify information for a transmission to a receiving device over a bit channels of the polar code, each having capacity 'W'. In some examples, the polar coding scheme 300 may be used to generate eight (8) coded bits for transmission (e.g., four (4) information bits (i.e., k=4) and four (4) parity or frozen bits). As shown in polar coding scheme 300, an encoding process may proceed from left to right, while polarization may be understood as occurring in polarization stages 310-a, 310-b, and 310-c proceeding from right to left.

To improve the likelihood that information bits transmitted by the transmitting device can be decoded by the receiving device, the transmitting device may load the information bits at bit locations 315-a to 315-h of bit channels (or sub-channels) of the polar code associated with the highest reliability. As depicted in FIG. 3, the encoder 210 may load bits into bit locations 315-a to 315-h for encoding by the polar coding scheme 300 in a left-most polarization stage, and the polar coding scheme 300 outputs, at 305, encoded bits of a codeword at bit locations 315-a to 315-h.

In some cases, the transmitting device may identify a target mutual information (or code rate) for a transmission, and may use the target mutual information to determine reliability of each bit channel for selecting in which bit locations of a polar coding scheme to load information bits. A target mutual information (or code rate) may be calculated as the number of information bits of a codeword divided by the capacity of a group of bit channels at a specific encoding stage (e.g., polarization stage 310-a). As can be seen in equation 1 below, the capacity W of the bit channels at the first polarization stage 310-a corresponds to the overall capacity of the transmission.

$$\text{Target Mutual Information} = \text{Code rate} = \frac{k}{2^m} \quad (1)$$

Where m=log 2(N) if N is the code length without puncturing. In some cases, the target mutual information may include an offset (e.g., a positive offset, a value proportional to $2^m$, etc.) as a back-off from Shannon capacity limit.

Based on knowing the target mutual information (or code rate) at bit locations 315-a to 315-h, the transmitting device may apply a recursive mutual information model for determining mutual information for each bit channel at each of multiple stages of polarization. The recursive mutual information model may apply a mutual information transfer function to determine mutual information for each bit channel at one polarization stage as a function of the mutual information of bit channels at a preceding polarization stage.

Figure 4:
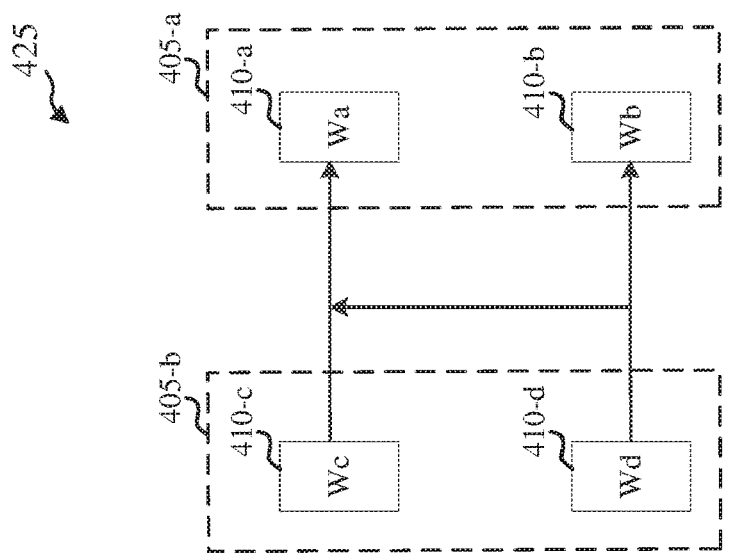
FIG. 4 illustrates an example of a mutual information transfer chart and two-stage polar encoder that supports mutual information based polar code construction in accordance with aspects of the present disclosure.
Figure 4:
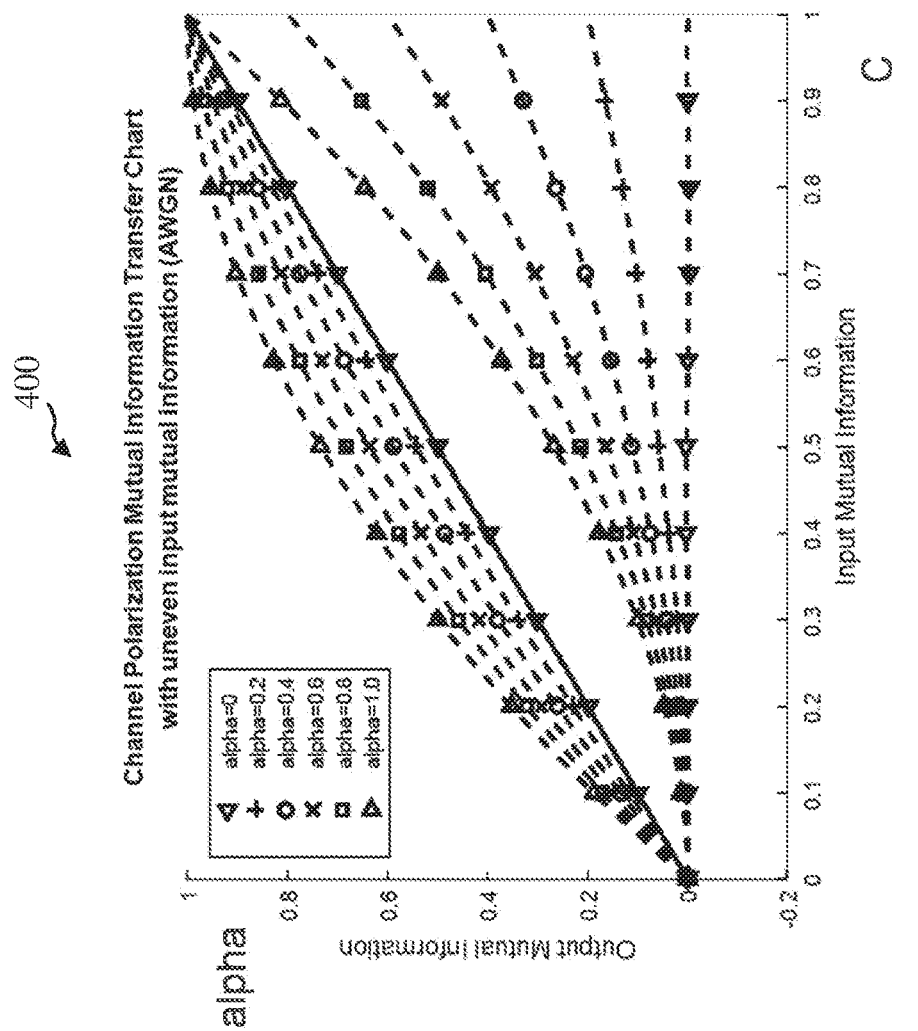

FIG. 4 illustrates an example of a mutual information transfer function chart 400 and a two-stage polar encoder 425 that supports mutual information based polar code construction in accordance with various aspects of the present disclosure. In an example, the mutual information transfer function may be used to derive channel polarization mutual information transfer chart 400 with uneven input mutual information. The sum of the capacity of the polarized bit channels at the output of the polarization stage may be equal to the sum of the capacity of the input bit channels at bit locations 315-a to 315-h. The mutual information transfer function may be used to determine the mutual information of polarized bit channels (e.g., polarized bit channels W+ and W−) based at least in part on the mutual information of a bit channel 'W.' The relationship between capacity of bit channels W+ and W− at a higher polarization stage relative to a bit channel capacity W at a lower polarization stage may be represented by the following equations:

$$\text{Capacity}(W+) \geq \text{Capacity}(W-) \quad (2)$$

$$\text{Capacity}(W+) + \text{Capacity}(W-) = 2*\text{Capacity}(W) \quad (3)$$

The channel polarization mutual information transfer function may be applied recursively for determining the mutual information of increasingly polarized bit channels.

FIG. 4 also depicts a simplified example for determining capacity of a higher polarization stage from a lower polarization stage. Shown is a two-stage polar encoder 425 having a first stage 405-a with a first bit channel having capacity Wa 410-a and a second bit channel having capacity Wb 410-b, and a second stage 405-b with the first bit channel having capacity Wc 410-c and the second bit channel having capacity Wd 410-d. Using the below mutual information transfer function equations, capacities C and alpha for determining Wc 410-c and Wd 410-d may be derived from capacities Wa 410-a and Wb 410-b:

$$C = \max(\text{capacity}(Wa), \text{capacity}(Wb)) \quad (4)$$

$$\text{alpha} = \min(\text{capacity}(Wa), \text{capacity}(Wb))/C \quad (5)$$

In some cases, however, the computational complexity associated with a mutual information transfer function may be high. Conventionally, mutual information transfer functions may be derived based at least in part on an AWGN channel. An AWGN mutual information transfer function is computationally complex to implement, and may not be practical to implement in certain types of wireless devices, such as a UE 115. Thus, less computationally complex mutual information transfer functions may be desirable.

In some examples described herein, the mutual information transfer function may be derived based at least in part on a binary erasure channel (BEC). Equations (6)-(9), below, show the relationship between the BEC capacity of input bit channels and the BEC capacity of output polarized bit channels. Equations (6)-(9) illustrate the simplicity of the computation used to derive the capacity of polarized bit channels as compared to computations associated with other mutual information transfer functions, such as AWGN.

$$\text{Capacity}(Wc) = \text{Capacity}(Wa)*\text{Capacity}(Wb) \quad (6)$$

$$\text{Capacity}(Wd) = \text{Capacity}(Wa) + \text{Capacity}(Wb) - \text{Capacity}(Wa)*\text{Capacity}(Wb) \quad (7)$$

$$\text{Capacity}(Wc) = \text{alpha}*C^2 \quad (8)$$

$$\text{Capacity}(Wd) = (\text{alpha}+1)*C - \text{alpha}*C^2 \quad (9)$$

Figure 5:
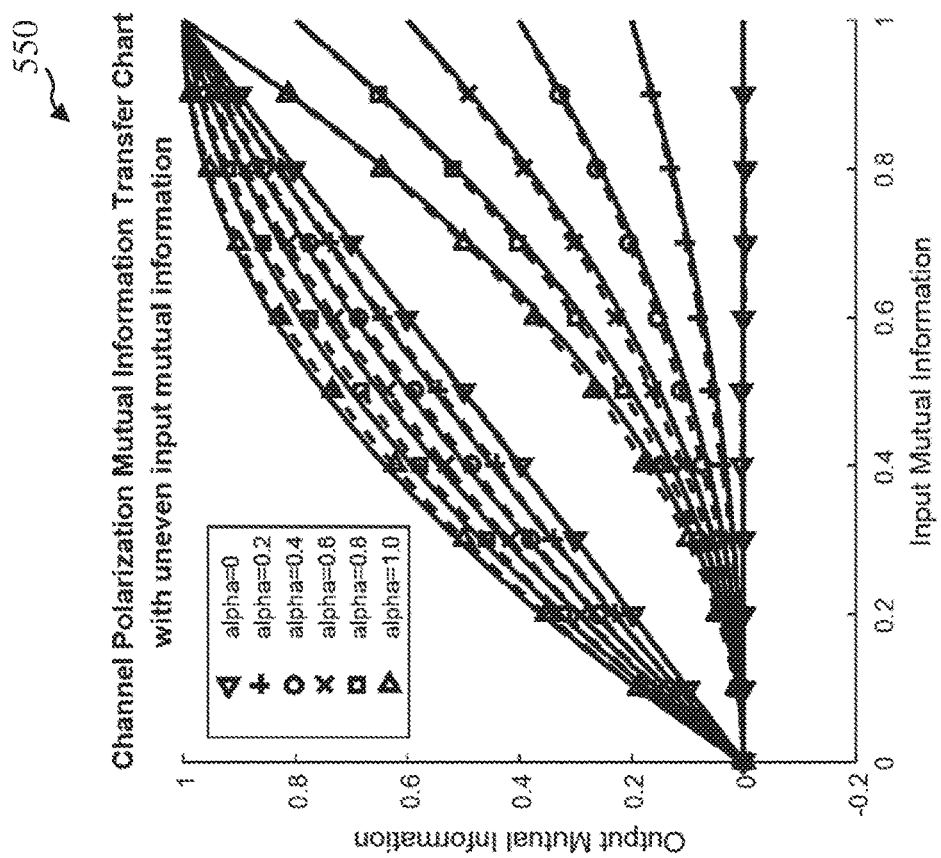
FIG. 5 illustrates an example of mutual information transfer charts that support mutual information based polar code construction in accordance with aspects of the present disclosure.
Figure 5:
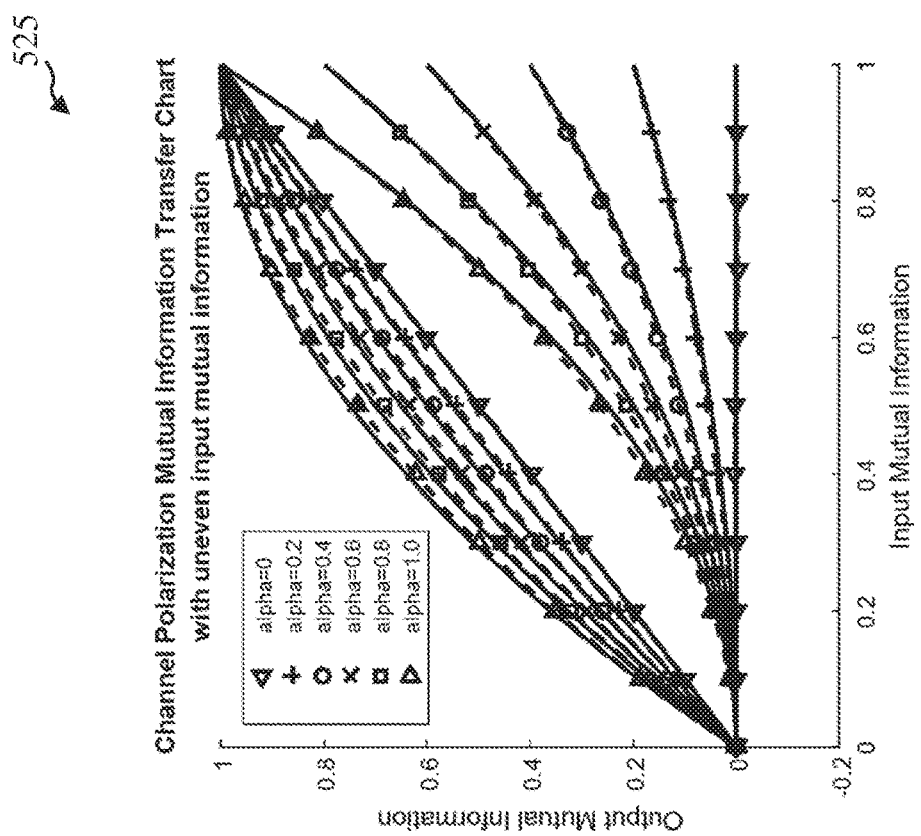

In some cases, however, the mutual information transfer function described in the present example may not align with other mutual information transfer functions derived based at least in part on an AWGN channel. A correction term may be applied to account for the difference. FIG. 5 illustrates an example of mutual information transfer function charts 525, 550 that support mutual information based polar code construction in accordance with various aspects of the present disclosure. To account for the difference, the encoder/decoder 210 may apply a correction term δ to the mutual information transfer functions in equations (6)-(9) derived based at least in part on the BEC to align the functions, as provided below.

Specifically, the output capacity of the mutual information transfer function derived based at least in part on the BEC $$\text{Output Capacity} = (\text{alpha}+1)*C - \text{alpha}*C^2 \quad (10)$$

may be adjusted by a correction term to align the graphs to give $$\text{Output Capacity}=(\text{alpha}+1)*C-\text{alpha}*C^2-\delta \quad (11)$$

where $$\delta=(F1e^{F2}*\text{abs}(C+F3)+F4e^{F5})*\text{alpha} \quad (12)$$

corresponds to an example of the correction term, and C corresponds to a capacity of a bit channel or mutual information associated with a bit channel. In some examples, the factors in the equation above may be defined as follows: F1=−4, F2=−2, F3=−0.5, F4=2, and F5=−2.

Figure 6:
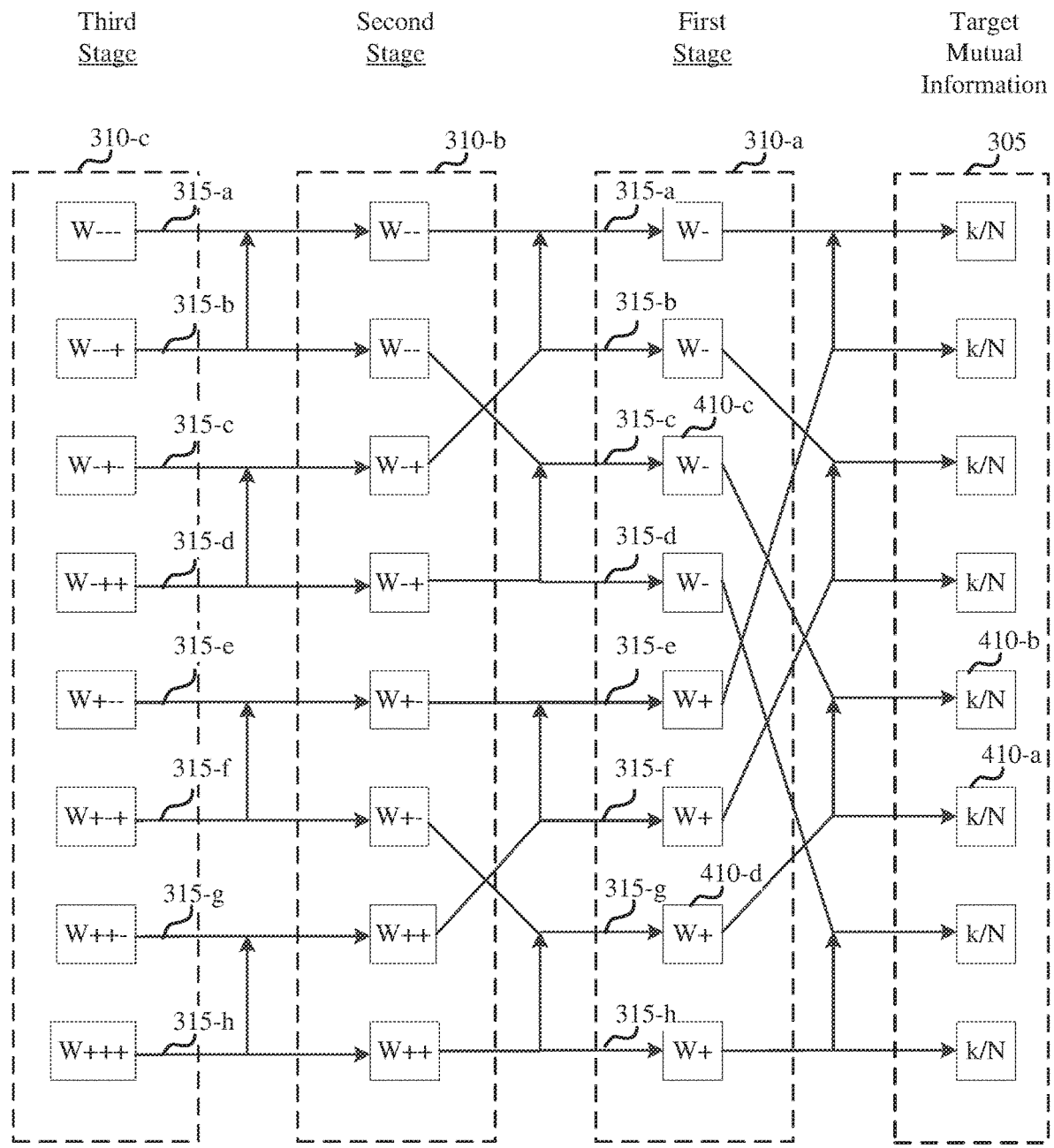
FIG. 6 illustrates an example of a polar coding scheme that supports mutual information based polar code construction in accordance with aspects of the present disclosure.

The principles described in FIGS. 2-5 may be applied for determining a reliability order for bit locations corresponding to bit channels in a polar coding scheme. FIG. 6 illustrates an example of a coding scheme 600 that supports mutual information based polar code construction in accordance with various aspects of the present disclosure. A mutual information model may recursively apply a mutual information transfer function to determine a reliability order of bit channels in the polar coding scheme 600.

In an example, a target mutual information may be selected for the bit channels of each codeword bit at 305 of the polar coding scheme 600. The target mutual information may be a function of the number of information bits k to be included in a codeword, and the length N of a codeword to be output by the polar coding scheme 600. In an example, the target mutual information for each of the bit channels may be the number of information bits k divided by length N.

The mutual information model may recursively apply the mutual information transfer function at each polarization stage of multiple polarization stages of the polar code to determine a reliability of each bit channel at a last stage. In the example shown in FIG. 6, the polar coding scheme 600 include three polarization stages 310-*a*, 310-*b*, and 310-*c*. Using equations (10)-(12) and the target mutual information (e.g., k/N), the recursive mutual information model may determine the mutual information for each bit location 315-*a* to 315-*h* at each bit channel of the first polarization stage 310-*a*. Reference numerals 410-*a* to 410-*d* are included in FIG. 6 to show how the mutual information may be calculated for bit channels at bit locations 315-*c* and 315-*d* using techniques for applying a mutual information transfer function as shown in FIG. 4. The capacity for the remaining bit channels in stage 310-*a* may be calculated in a similar manner. In a like manner, the mutual information transfer function may calculate the mutual information of the bit channels in stage 310-*b* using the mutual information calculated for the bit channels in stage 310-*a*. The recursive mutual information model may proceed from stage to stage and recursively apply the mutual information transfer function for determining the mutual information at each bit channel at each bit location at each polarization stage. It is noted that FIG. 6 depicts three polarization stages 310-*a* to 310-*c* and N bit channels, but the principles described herein may be applied a polar coding scheme having any number of polarization stages and any number of bit channels.

The mutual information model may determine a reliability of the bit channels based at least in part on a mutual information respectively determined for the bit channels at a last stage of the multiple polarization stages. In the polar coding scheme 600, the last stage is the third stage 310-*c*. A higher mutual information indicates that a bit channel is more reliable, and a lower mutual information indicates that a bit channel is less reliable. The mutual information model may rank the mutual information determined at the last stage 310-*c*, and may determine a reliability order of the bit channels at the last stage 310-*c* based at least in part on the ranked mutual information. For example, the mutual information model may determine the following reliability order of the bit locations 315 corresponding to the bit channels ordered from most reliable to least reliable [315-*h*, 315-*g*, 315-*f*, 315-*h*, 315-*c*, 315-*e*, 315-*b*, 315-*a*].

During encoding, the encoder 210 may load k information bits into the k most reliable bit channels, and may load other bits into the remaining bit channels. In the polar coding scheme 600 of FIG. 6, k=3 and the encoder 210 may load three information bits into the 3 most reliable bit channels. For example, if the recursive mutual information model determined that bit location 315-*h* corresponds to the most reliable bit channel, followed by bit location 315-*g*, followed by bit location 315-*f*, the encoder 210 may load information bits into bit location 315-*h*, 315-*g*, and 315-*f*. The encoder 210 may load the other bits (e.g., parity bits, frozen bits, etc.) into bit location 315-*e*, 315-*d*, 315-*c*, 315-*b*, and 315-*a*. The encoder 210 may output encoded bits of a codeword at bit locations 315-*a* to 315-*h*, and the transmitter 215 may transmit the codeword via a wireless channel.

A receiving wireless device may receive the codeword via the wireless channel and decode the codeword to retrieve the information bits. For example, the receiver 215 may provide the codeword to decoder 210 for decoding. The decoder 210 may identify a set of bit locations of the polar code corresponding to information bits of an encoded information bit vector. The receiving wireless device may use the same recursive mutual information model as the transmitting wireless device to determine the set of bit locations of the information bits in the codeword. In some examples, the transmitting wireless device may inform the receiving wireless device of the reliability order without independently requiring the receiving wireless device to determine the reliability order. For example, the transmitting wireless device may dynamically signal the reliability order to the receiving device or the reliability order may be semi-statically set up during connection setup, connection reconfiguration, or the like.

During decoding, the decoder 210 may load the demapped codeword bits (e.g., log-likelihood ratios (LLRs)) into respective bit locations of the polar coding scheme at stage 310-*a*, and may polarize the LLRs at each stage of the polar coding scheme to generate a set of bit channel LLRs that are output at the set of bit channels from a last stage of the polar coding scheme (e.g., output from bit channels of polarization stage 310-*c*). The decoder 210 may perform successive cancellation (SC) or successive cancellation list (SCL) decoding on the output set of bit channel LLRs to determine candidate paths for the information bits, and the other bits (e.g., frozen bits, parity bits, etc.). The decoder 210 may apply the reliability order to determine which bits from the sequential list decoding are information bits, and which are other bits (e.g., frozen bits, parity bits, etc.). If the parity bits indicate that a parity check is passed, the decoder 210 may output the information bits as the information bit vector (e.g., the same information bit vector used to generate the codeword at the encoder).

In some examples, a transmitting wireless device, a receiving wireless device, or both, may perform the recursive mutual information model. In other examples, the recursive mutual information model may be used to generate a table of reliability orders for different combinations of k and N. The transmitting wireless device may signal which combination of k and N are being used to encode a codeword (or the UE may try several hypotheses), and the receiving device may retrieve the reliability order corresponding to the signaled combination of k and N. The transmitting wireless device and the receiving wireless device may use the signaled combination of k and N for encoding and decoding.

In some cases, to achieve a given code rate or codeword size for transmission, more bits may be generated by the polar code than are transmitted for the given code rate or codeword size. In such cases, the transmitting device may puncture the encoded bits to satisfy the given code rate. That is, the transmitting device may rate match the output codeword of the polar code encoder to a number of desired bits for the given code rate by not transmitting some of the encoded bits. A punctured bit may be a bit for which no information is transmitted (e.g., the bit is skipped). Puncturing may include, for example, shortening puncturing (or known bit puncturing), and may consider an indexing type of the bit locations. The indexing type of may be natural order or bit-reversed. A natural order index may refer to the bit locations having indices that increase in the coding scheme from top to bottom. For example, in FIG. 6, the eight bit locations 315-a to 315-h may be assigned an index starting from assigning index 0 to bit location 315-a, and chronologically assigning the index values to the respective bit locations, through assigning index 7 to bit location 315-h. In bit-reversed order, the output bit locations have index values that are bit-reversed (reversing each binary representation of the index values). For example, the number 3 in decimal may be represented as a 011 in binary. Bit-reversal may involve reversing the order of the binary number, thus index 011 becomes 110 (index value 6) after bit reversal.

In natural-order puncturing, a set of most significant bits (MSBs) or later-generated bits of a codeword are punctured, and, in natural-order non-shortening based puncturing (or unknown bit puncturing), a set of least significant bits (LSBs) or earlier-generated bits of a codeword are punctured. In bit-reversed non-shortening based puncturing, a set of LSBs of the bit-reversed order of output bits are punctured, and, in bit-reversed shortening-based puncturing, a set of MSBs of a bit-reversed order of output bits are punctured.

Figure 7:
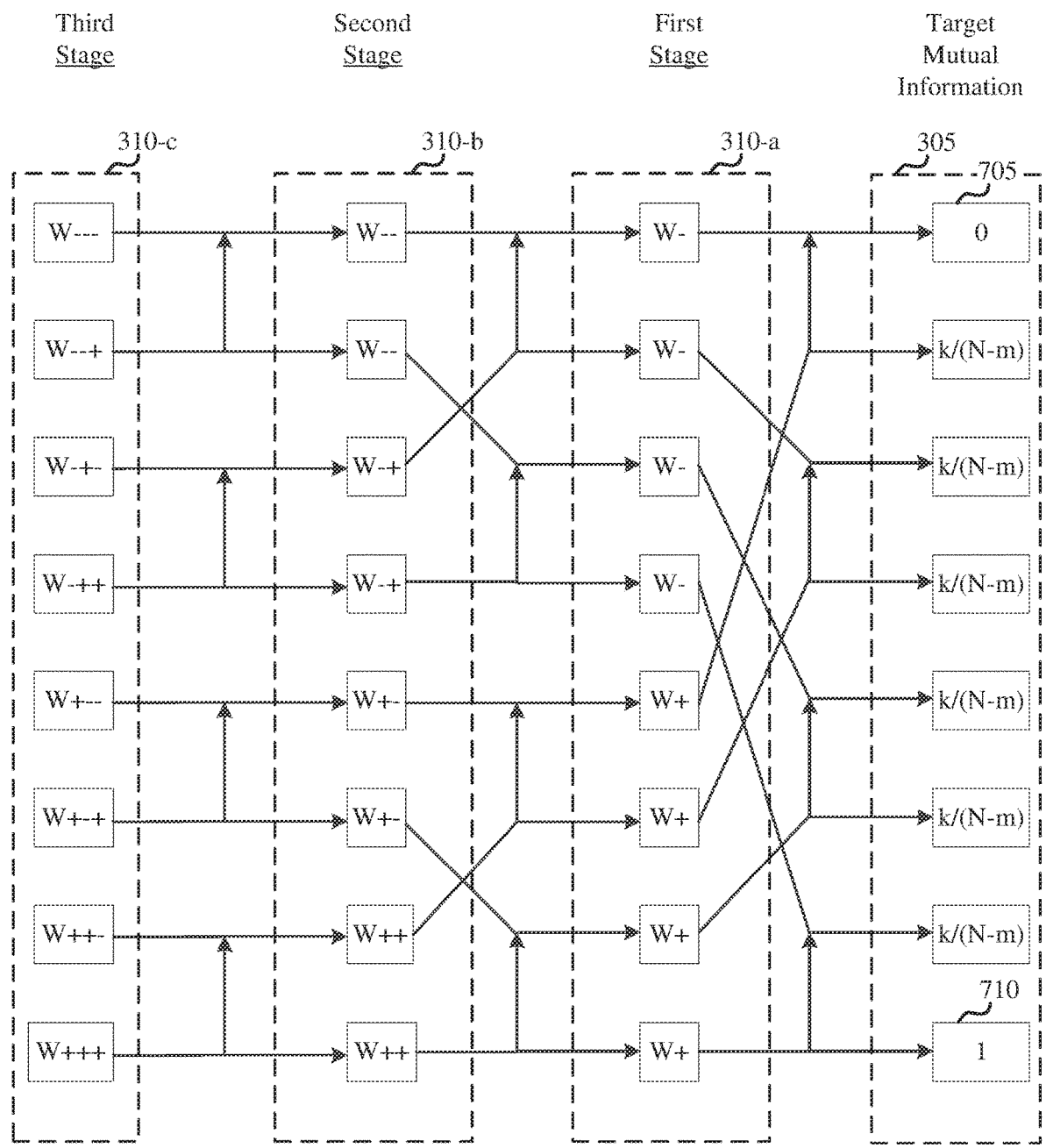
FIG. 7 illustrates an example of a polar coding scheme that supports mutual information based polar code construction in accordance with aspects of the present disclosure.

To facilitate puncturing, the transmitting device may adjust the polar coding scheme based at least in part on the number of punctured bits. FIG. 7 illustrates an example of a polar coding scheme 700 that supports mutual information based polar code construction in accordance with various aspects of the present disclosure. In an example, the target mutual information (or code rate) for the transmission may be adjusted to account for bit puncturing. In some cases, the transmitting device may use non-shortening based puncturing, or shortening-based puncturing, or both, on any of the bit channels within the polar coding scheme. In the depicted example, polar coding scheme 700 uses both non-shortening based puncturing and shortening-based puncturing. The mutual information of a non-shortening based punctured bit 705 may be set to zero (0). The mutual information of a shortening-based punctured bit 710 may be set to unity (1). The target mutual information (or code rate) may be calculated as the number of information bits k divided by the length N of the codeword less the number m of punctured bits. In the depicted example, k=3, N=8, and m=2, and the target mutual information is thus 3/6 (e.g., 3/(8−2)=3/6). The reliability order for the bit channels of polar coding scheme 700 may be determined in the same way as described above for polar coding scheme 600, but using the adjustment to the target mutual information to account for the punctured bits. The encoder/decoder 210 may use the reliability order based at least in part on the adjusted target mutual information to encode and decode in a manner similar to that provided above. It is noted that the examples in FIGS. 2-7 are simple examples with k=3 and codeword length N=8. The principles described herein may be extended to any length k and N, where k<N.

In some examples, the reliability order may be determined using a nested approach. For comparison, the examples of FIGS. 2-7 described determining the reliability order for a particular number of information bits k. In some instances, the transmitting device may apply the recursive mutual information model at both k information bits and k' information bits. In a nested approach, the k most reliable bit channels may be identified from the first iteration, and the k'−k next most reliable subset of the bit channels may be identified from the second iteration. The nested approach may be performed for additional k values, and the resulting reliability order may be code rate or SNR independent (e.g., approximating the reliability order for any given k).

Figure 8:
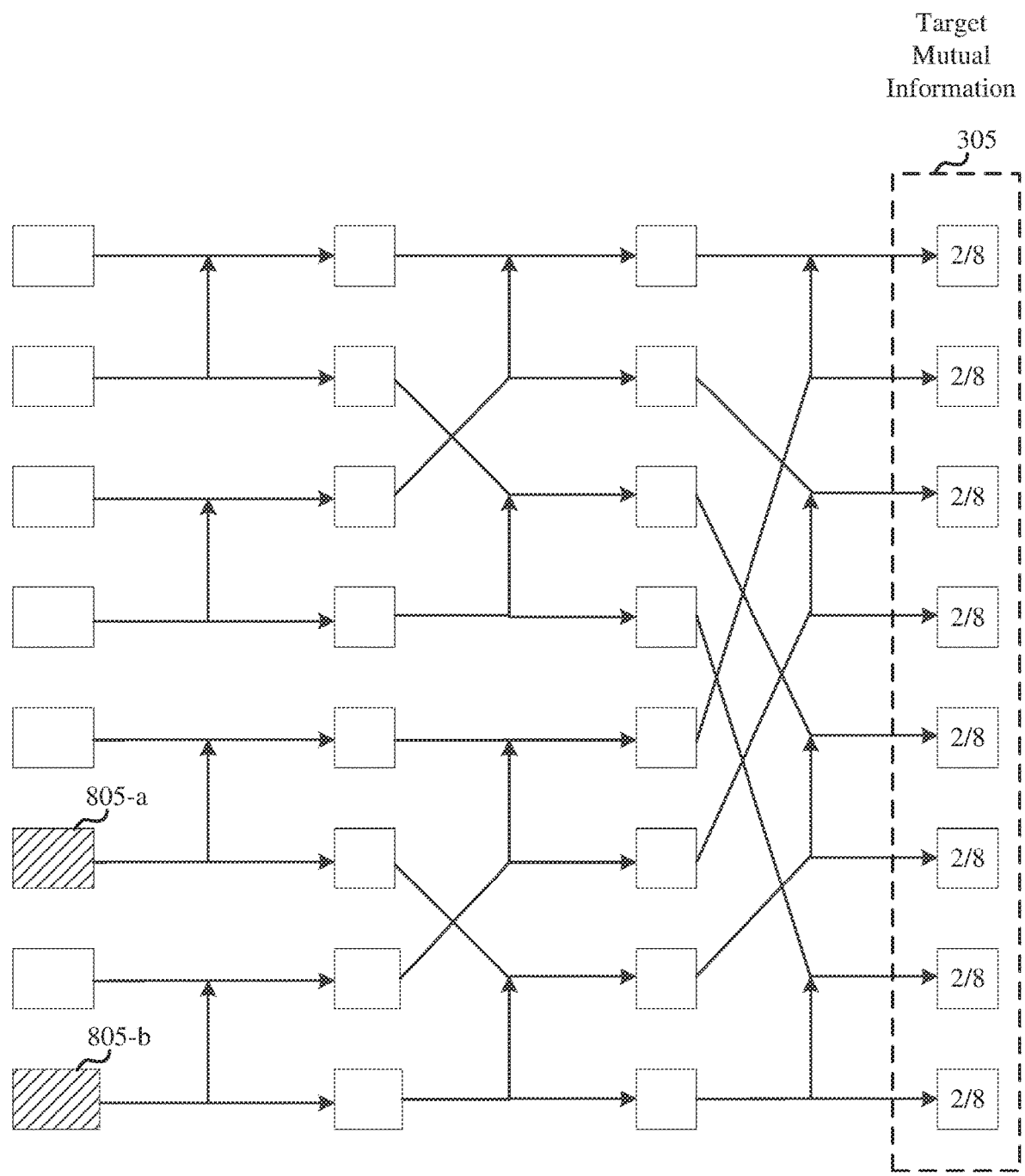
FIG. 8 illustrates an example of a polar coding scheme that supports mutual information based polar code construction in accordance with aspects of the present disclosure.
Figure 9:
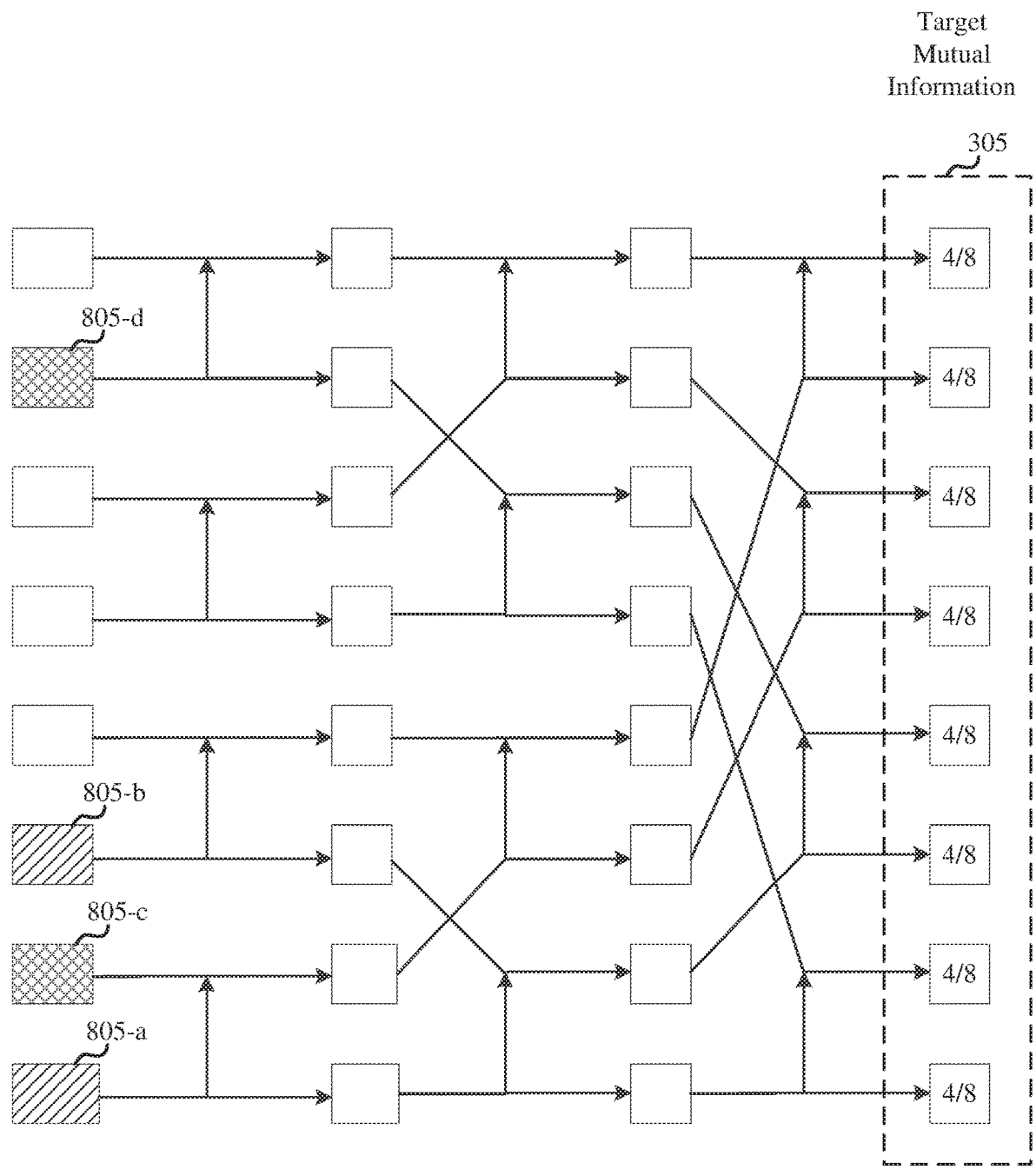
FIG. 9 illustrates an example of a polar coding scheme that supports mutual information based polar code construction in accordance with aspects of the present disclosure.

FIG. 8 illustrates an example of a polar coding scheme 800 for k information bits and FIG. 9 illustrates an example of a polar coding scheme 900 for k' information bits. In the depicted examples of FIGS. 8-9, k=2 and k'=4, and codeword length N=8. Initially, the recursive mutual information model may operate as described above in FIGS. 2-7 with k=2, N=8, and a target mutual information=2/8. In FIG. 8, the recursive mutual information model may identify bit channels 805-a and 805-b as the two most reliable bit channels where k=2, and as shown in FIG. 9, the recursive mutual information model may identify bit channels 805-c and 805-d as the next two reliable bit channels where k'=4. That is, the recursive mutual information model may respectively identify a mutual information for each bit channel, but select the best two bit channels among the bit channels that have not been selected. In the example depicted in FIG. 9, bit channels 805-a and 805-b were previously identified as being the most reliable, and the recursive mutual information model identifies bit channels 805-c and 805-d as having the next two highest mutual information values among the remaining bit channels. This process may be repeated using a given step size s (e.g., k'=k'+s) until k'=N. The resulting reliability order may be used for any value of k, and may provide a reliability order that is independent or pseudo-independent of SNR (e.g., approximates the order that would be achieved by applying the recursive mutual information model at the given value of k). It is noted that this is a simplified example with s=2 and codeword length N=8. The principles described herein may be extended to any codeword length N, with the step size s selected based on a desired or tolerable approximation error.

Figure 10:
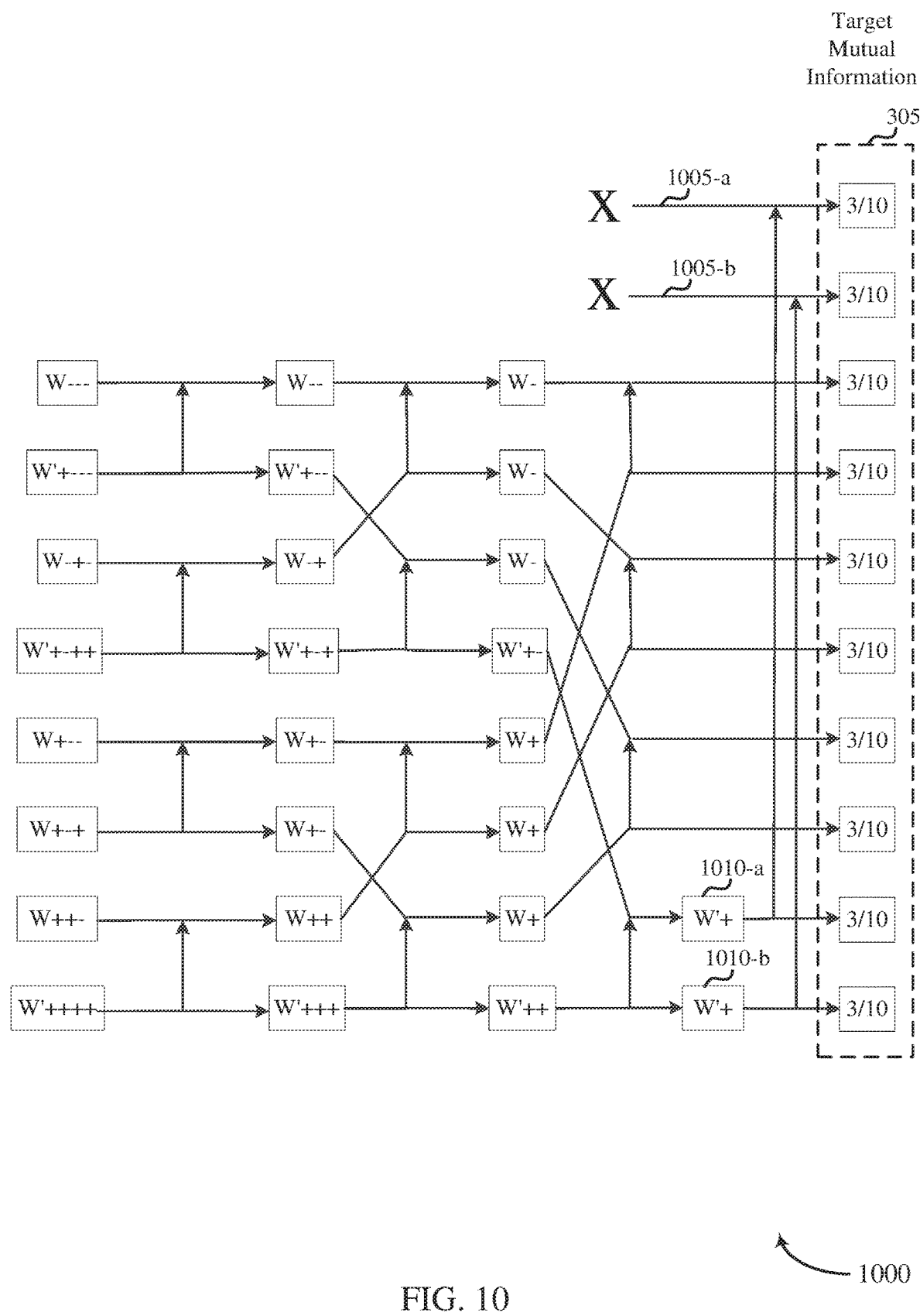
FIG. 10 illustrates an example of a polar coding scheme that supports mutual information based polar code construction in accordance with aspects of the present disclosure.
Figure 11:
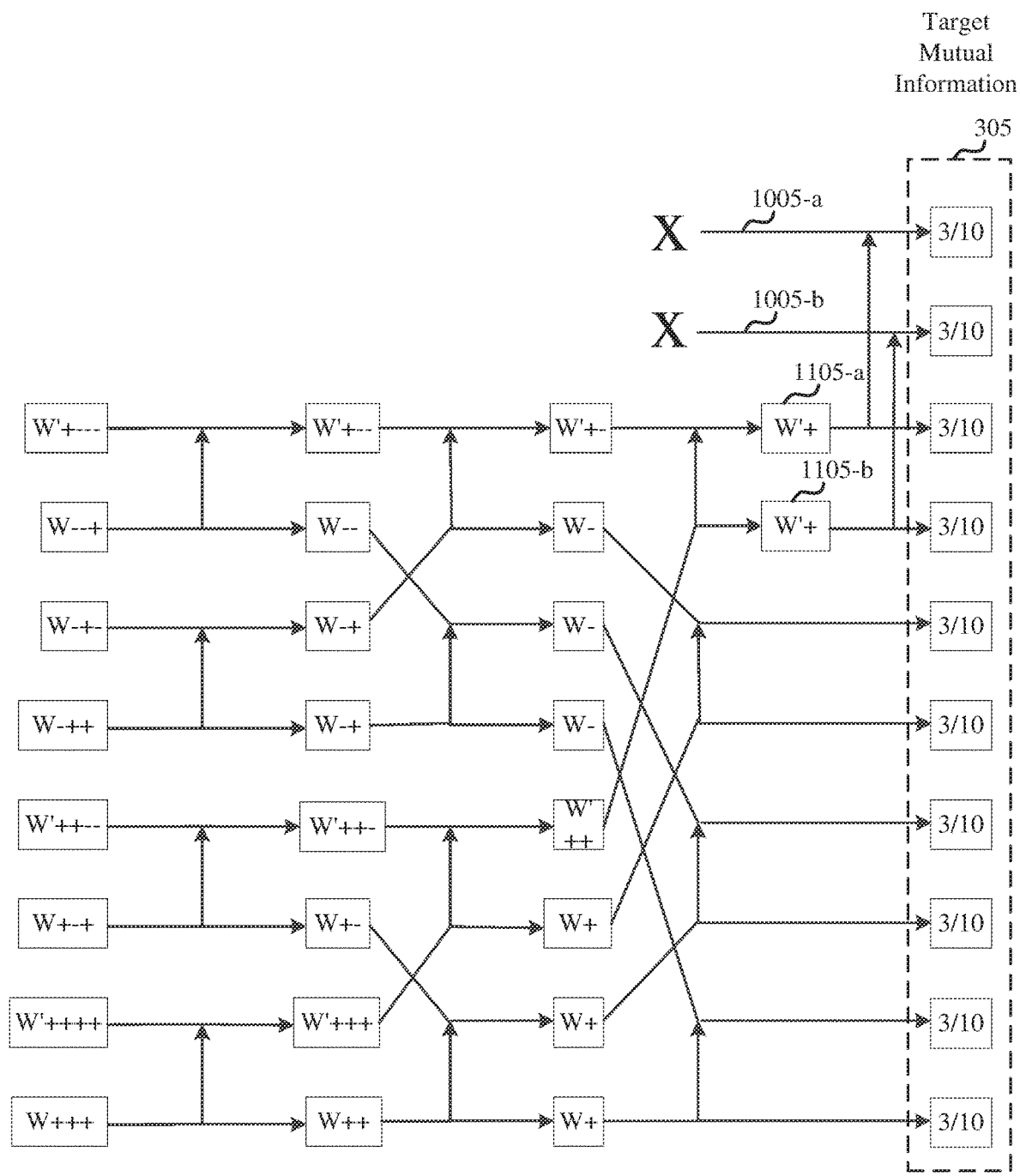
FIG. 11 illustrates an example of a polar coding scheme that supports mutual information based polar code construction in accordance with aspects of the present disclosure.

The examples described herein may also support generation of a codeword having repeated bits. FIG. 10 illustrates a first example of a polar coding scheme 1000 having a repeated bit, and FIG. 11 illustrates a second example of a polar coding scheme 1100 having a repeated bit. In some instances, a value of a bit in a particular bit location may be repeated in the transmitted codeword. Repeating a bit value multiple times in a codeword may be used for rate matching. To repeat a bit, the encoder outputs one or more codeword bits for transmission, resulting in a number of transmitted codeword bits that may be greater than the length of the polar code. FIG. 10 illustrates an example application of the repeated bit during decoding of a codeword received via a wireless channel. In the depicted example, repetition functions 1010-a and 1010-b are used to combine the repeated codeword bits as part of the decoding tree for the polar code while the single parity check values that would otherwise be calculated on bit channels 1005-a and 1005-b are discarded, as indicated by the X. Because two bit channels are being discarded, a sum of the mutual information for the bit locations at the last stage of the multiple polarization stages (e.g., at the U-domain) is not the same as the sum of the target mutual information for the bit locations. In the polar coding scheme 1000, for example, k=3 and N=10. Because two of the bit channels are being discarded, the sum of the target mutual information in the U-domain is less than 3. Because of this difference, instead of setting the target mutual information to be k/N, an offset may be added to the target mutual information. The offset may account for the gap between code performance and the Shannon capacity limit. The offset may reflect a defined back-off value relative to the Shannon capacity limit.

The examples described herein provide techniques for determining a reliability order that is independent or pseudo-independent of SNR. The recursive model described herein may sweep over a range of target mutual information values, SNR values, or both, for determining at least portions of output mutual information curves, output error rate curves, or both. The reliability order may be the order in which the output mutual information curves reach a defined output mutual information value or the output error rate curves reach a defined error rate value.

Figure 12:
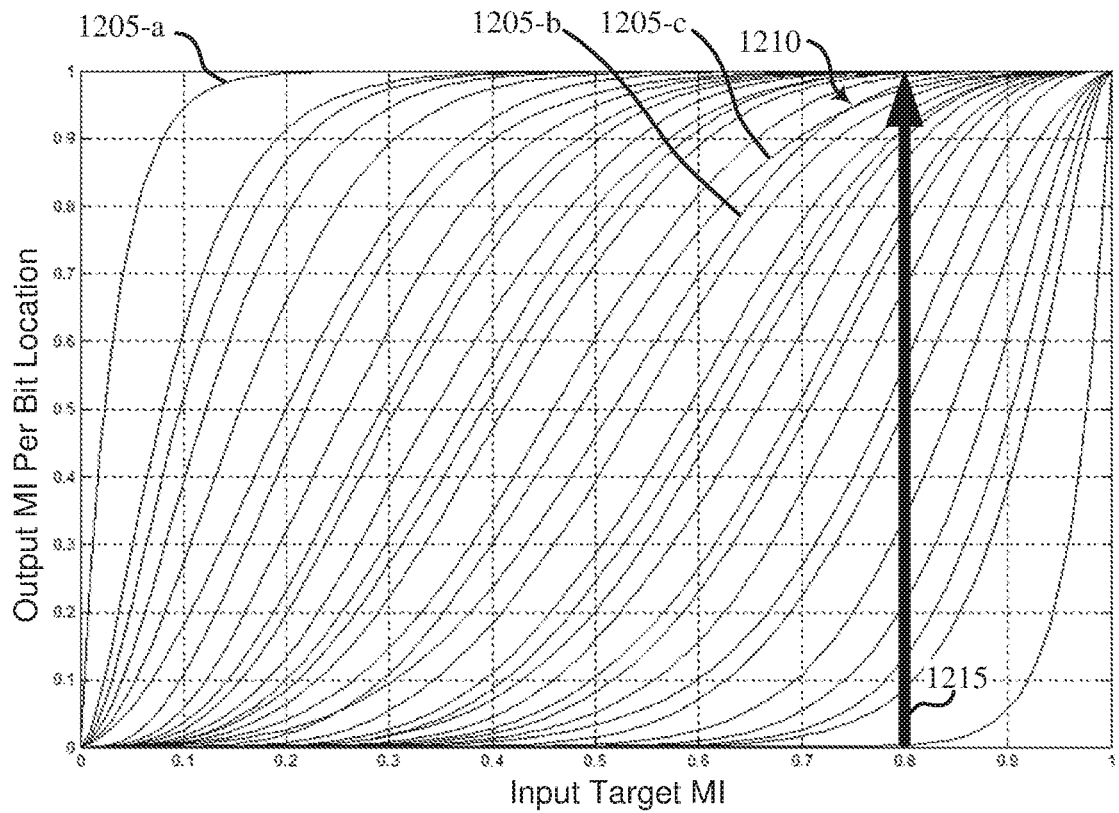
FIG. 12 illustrates an example chart of output mutual information curves that support mutual information based polar code construction in accordance with aspects of the present disclosure.

FIG. 12 shows a chart 1200 including output mutual information curves that support mutual information based polar code construction in accordance with aspects of the present disclosure. The chart 1200 may depict multiple output mutual information curves that are a function of input target mutual information values. The x-axis lists values of the input target mutual information ranging from 0 to 1, and the y-axis lists values of output mutual information also ranging from 0 to 1. The recursive mutual information model may receive an input target mutual information value, and may calculate an output mutual information value for each bit location. For example, y-axis values of line 1215 may represent output mutual information values for each bit location with respect to an input target mutual information value of 0.8.

Each output mutual information curve may correspond to a particular bit location. The recursive mutual information model may perform a sweep over a range of the input target mutual information values (e.g, from 0 to 1), and the chart 1200 depicts a plot of output mutual information curves corresponding to each bit location across the range of input target mutual information values. For example, output mutual information curve 1205-a may depict output mutual information values corresponding to a particular bit location of a polar code as a function of input mutual information values. The recursive mutual information model may sweep over a range of input target mutual information values having any desired granularity (e.g, input target mutual information values separated by 0.2, 0.1, 0.05, 0.01). In an example with reference to FIG. 6, the recursive mutual information model may be applied using a particular input target mutual information value to determine output mutual information values for each bit location. This process may be repeated for each input target mutual information value, and the output mutual information values may be plotted as a curve for each bit location. Chart 1200 includes 32 output mutual information curves 1205 that correspond to a polar code having 32 bit locations. Polar codes of other sizes may also be used.

In some instances, a crossover 1210 may occur between multiple output mutual information curves 1205-b, 1205-c. The crossover 1210 may represent a point where one bit location changes from being more reliable to being less reliable than another bit location. In the depicted example, prior to an input target mutual information value of approximately 0.75, a first bit location corresponding to output mutual information curve 1205-c is more reliable than a second bit location corresponding to output mutual information curve 1205-b. However, after an input target mutual information value of approximately 0.75, the second bit location is more reliable than the first bit location. Thus, the reliability order of the first and second bit channels may depend at least in part on the input target mutual information value.

The examples described herein may select the reliability order corresponding to an order in which the multiple output mutual information curves reach a defined output mutual information value with respect to the input target mutual information values. A bit location corresponding to an output curve that reaches a defined output mutual information value at a lower input target mutual information value is considered to be more reliable than a bit location corresponding to an output curve that reaches a defined output mutual information value at a higher input target mutual information value.

Figure 13:
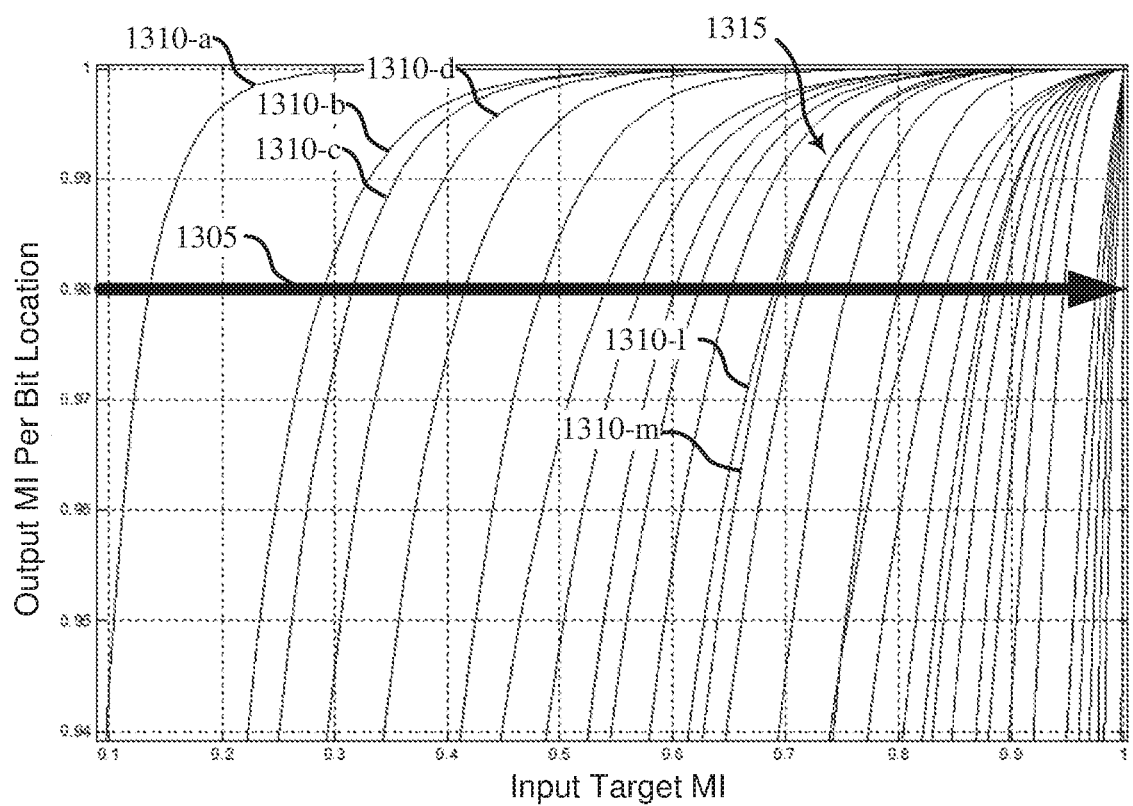
FIG. 13 illustrates an example chart of output mutual information curves that support mutual information based polar code construction in accordance with aspects of the present disclosure.

FIG. 13 shows a chart 1300 including output mutual information curves that support mutual information based polar code construction in accordance with aspects of the present disclosure. Chart 1300 is an enlargement of chart 1200 and depicts only a portion of the same output mutual information curves from chart 1200. A defined output mutual information value may be selected, and the reliability order of the bit channels may be determined in accordance with an order in which the output mutual information curves reach the defined output mutual information value (e.g., a mutual information threshold). Line 1305 corresponds to a defined output mutual information value of 0.98. In a recursive mutual information model example, a sequence of the reliability order may be determined based at least in part on an order in which each bit location in a U-domain reaches a certain mutual information threshold as the input target mutual information value increases.

In the depicted example, output mutual information curve 1310-a reaches the defined output mutual information value 1305 with the lowest input target mutual information value and hence its corresponding bit channel is the most reliable and listed first in the reliability order. Output mutual information curve 1310-b reaches the defined output mutual information value 1305 with the next lowest input target mutual information value and hence its corresponding bit channel is second in the reliability order. Output mutual information curve 1310-c reaches the defined output mutual information value 1305 with the third lowest input target mutual information value and hence its corresponding bit channel is third in the reliability order. Output mutual information curve 1310-d reaches the defined output mutual information value 1305 with the fourth lowest input target mutual information value and hence its corresponding bit channel is fourth in the reliability order. This may continue in the same manner to identify the reliability order for all of the bit channels. In some cases, only a portion of the curves 1310 may be calculated to determine at what input target mutual information value corresponds to an output mutual information value that equals the defined output mutual information value 1305. It is noted that the value of the defined output mutual information impacts the reliability order. A crossover 1315 occurs between output mutual information curve 1310-1 and 1310-m. In the depicted example, prior to an input target mutual information value of approximately 0.74, a first bit location corresponding to output mutual information curve 1310-1 is more reliable than a second bit location corresponding to output mutual information curve 1310-m. However, after an input target mutual information value of approximately 0.74, the second bit location is more reliable than the first bit location. Thus, the reliability order of the first and second bit channels may depend at least in part on the select value of the defined output mutual information.

A similar result may be achieved using a Gaussian approximation density-based evolution model. The sweep may be performed using input target SNR values instead of target mutual information values, and the output may be an output error rate value (e.g., bit error rate value) instead of output mutual information values. The output error rate values may be plotted as a curve corresponding to each bit location in the same or similar manner as the output mutual information curves. In a Gaussian approximation density-based evolution model, a sequence of the reliability order may be determined based at least in part on an order in which each output error rate curve for each bit location in a U-domain reaches a defined error rate threshold as the input target SNR increases.

In some cases, a UE 115, a base station 105, or both, may receive or store one or more tables where each table may list one or more sets of ordered bit locations for a polar code having a length N (e.g., multiple tables may be stored corresponding to different N values). The UE 115, the base station 105, or both, may identify a set of bit locations of the polar code corresponding to information bits of an encoded information bit vector by retrieving a particular set of bit locations from a table. In other examples, the UE 115, the base station 105, or both, may apply a recursive model (e.g., recursive mutual information model, Gaussian approximation density-based evolution model) that includes at least one transfer function (e.g., mutual information transfer function) that is applied at each polarization stage of a multiple polarization stages of the polar code for identifying the particular set of bit locations. In one example, the UE 115, the base station 105, or both, may determine that one or more of the bit locations is a punctured or repeated bit, and may determine whether any of the stored tables account for punctured or repeated bits at that same bit location(s). If a stored table has the corresponding punctured or repeated bit pattern, the UE 115, the base station 105, or both, may retrieve the order for the bit locations corresponding to information bits of an encoded information bit vector from the stored table. If no stored table has the corresponding punctured or repeated bit pattern, the UE 115, the base station 105, or both, may apply the recursive model to generate a set of bit locations corresponding to information bits of an encoded information bit vector that accounts for the punctured bit(s).

Figure 14:
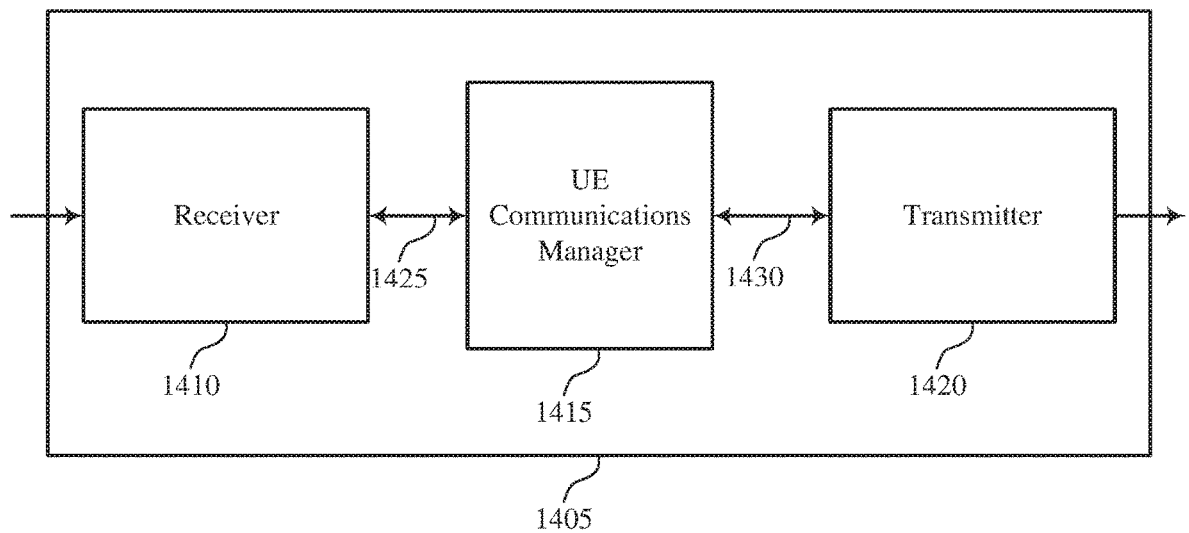
FIGS. 14 through 16 show block diagrams of a device that supports mutual information based polar code construction in accordance with aspects of the present disclosure.

Advantageously, the examples described herein enable efficient identification of which bit locations, and corresponding bit channels, to use based at least in part on a reliability order of the bit channels. Moreover, some examples described herein beneficially approximate an AWGN MI transfer function by adding a correction term to a BEC MI transfer function (e.g., with a correction term). The examples described herein approach the AWGN MI transfer function with a reduced computational complexity, enabling for simpler computation of bit channel reliability. In addition, some examples described herein determine the reliability order where rate matching is applied (e.g., puncturing or repeating bits), and provide for SNR independent generation of reliability order for a given polar code length N and puncturing scheme. Some examples described herein may provide for SNR independent bit channel reliability ordering by sweeping through multiple different target mutual information values, target SNR values, or both FIG. 14 shows a block diagram 1400 of a wireless device 1405 that supports mutual information based polar code construction in accordance with aspects of the present disclosure. Wireless device 1405 may be an example of aspects of a user equipment (UE) 115 as described with reference to FIG. 1. Wireless device 1405 may include receiver 1410 in communication with UE communications manager 1415 via communication link 1425, and in communication with transmitter 1420 communication link 1430. Wireless device 1405 may also include a processor. Each of these components may be in communication with one another (e.g., via one or more buses).

Receiver 1410 may receive a codeword encoded using a polar code and output the codeword to the decoder 210 for decoding. The codeword may have been generated using an information bit vector including one or more information bits and other bits, such as frozen bits and parity check bits. The received codeword may be passed on to other components of the device 1405. The receiver 1410 may be an example of aspects of the transmitter/receiver 215 described with reference to FIG. 2 and the transceiver 1735 described with reference to FIG. 17. The receiver 1410 may utilize a single antenna or a set of antennas.

UE communications manager 1415 may be an example of aspects of the UE communications manager 1715 described with reference to FIG. 17.

UE communications manager 1415 and/or at least some of its various sub-components may be implemented in hardware, software executed by a processor, firmware, or any combination thereof. If implemented in software executed by a processor, the functions of the UE communications manager 1415 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The UE communications manager 1415 and/or at least some of its various sub-components may be physically located at various positions, including being distributed such that portions of functions are implemented at different physical locations by one or more physical devices. In some examples, UE communications manager 1415 and/or at least some of its various sub-components may be a separate and distinct component in accordance with various aspects of the present disclosure. In other examples, UE communications manager 1415 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 1415 may receive a codeword over a wireless channel, the codeword encoded using a polar code, identify a set of bit locations of the polar code corresponding to information bits of an encoded information bit vector, where the set of bit locations is determined based at least in part on a reliability order of the bit locations of the polar code, and where the reliability order is determined based at least in part on a recursive model that includes at least one mutual information transfer function that is applied at each polarization stage of a set of polarization stages of the polar code, and decode the received codeword to obtain the information bit vector at the set of bit locations.

Transmitter 1420 may transmit signals generated by other components of the device. Transmitter 1420 may receive a codeword output by encoder 210 and transmit the codeword via a wireless channel. In some examples, the transmitter 1420 may be collocated with a receiver 1410 in a transceiver module. For example, the transmitter 1420 may be an example of aspects of the transmitter/receiver 215 described with reference to FIG. 2 and the transceiver 1735 described with reference to FIG. 17. The transmitter 1420 may utilize a single antenna or a set of antennas.

Figure 15:
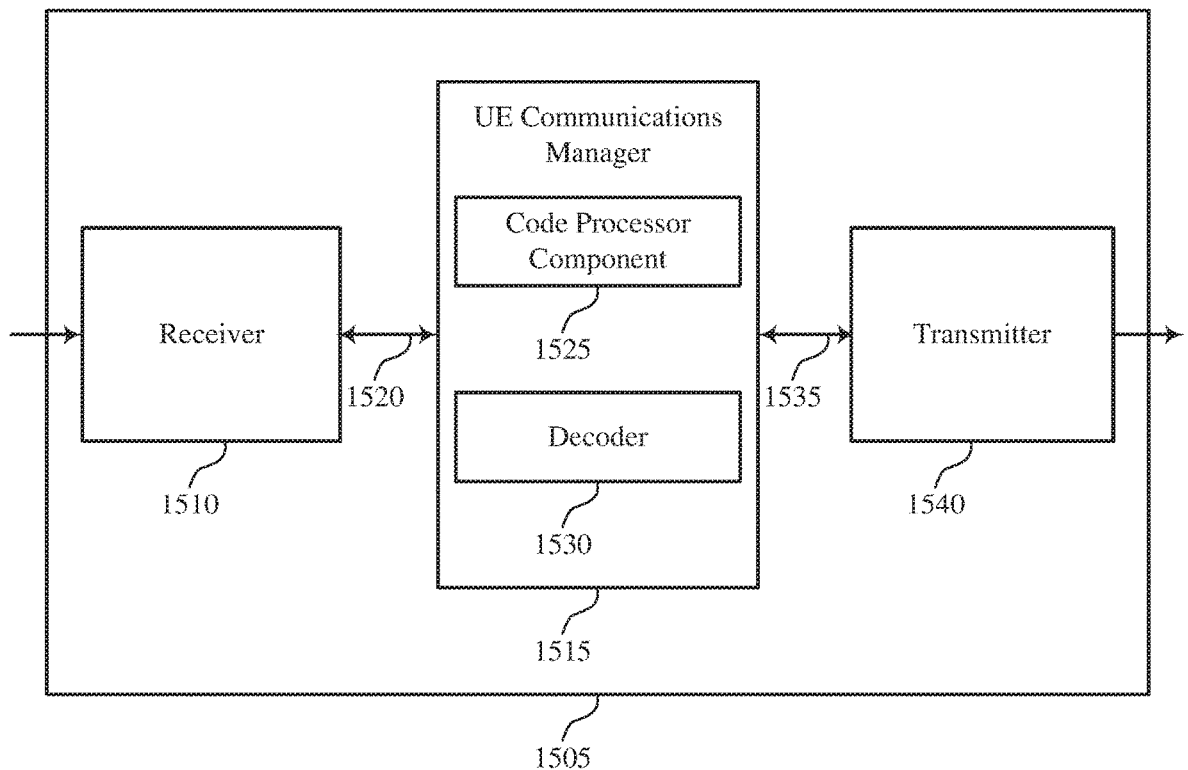

FIG. 15 shows a block diagram 1500 of a wireless device 1505 that supports mutual information based polar code construction in accordance with aspects of the present disclosure. Wireless device 1505 may be an example of aspects of a wireless device 1405 or a UE 115 as described with reference to FIGS. 1 and 14. Wireless device 1505 may include receiver 1510 in communication with UE communications manager 1515 via communications link 1520, in communication with transmitter 1540 via communications link 1535. Wireless device 1505 may also include a processor. Each of these components may be in communication with one another (e.g., via one or more buses).

Receiver 1510 may receive a codeword encoded using a polar code and output the codeword to the decoder 210 for decoding. The codeword may have been generated using an information bit vector including one or more information bits and other bits, such as frozen bits and parity check bits. The received codeword may be passed on to other components of the device 1505. The receiver 1510 may be an example of aspects of the transmitter/receiver 215 described with reference to FIG. 2 and transceiver 1735 described with reference to FIG. 17. The receiver 1510 may utilize a single antenna or a set of antennas.

UE communications manager 1515 may be an example of aspects of the UE communications manager 1715 described with reference to FIG. 17.

UE communications manager 1515 may also include code processor component 1525 and decoder 1530.

Code processor component 1525 may receive a codeword over a wireless channel, the codeword encoded using a polar code, and identify a set of bit locations of the polar code corresponding to information bits of an encoded information bit vector. In some cases, the set of bit locations may be determined based at least in part on a reliability order of the bit locations of the polar code. In some cases, the reliability order may be determined based at least in part on a recursive model that includes at least one transfer function that is applied at each polarization stage of a set of polarization stages of the polar code. In some cases, the recursive model may be a recursive mutual information model, a Gaussian approximation density-based evolution model, or the like.

Decoder 1530 may decode the received codeword to obtain the information bit vector at the set of bit locations.

Transmitter 1540 may transmit signals generated by other components of the device. Transmitter 1540 may receive a codeword output by encoder 210 and transmit the codeword via a wireless channel. In some examples, the transmitter 1540 may be collocated with a receiver 1510 in a transceiver module. For example, the transmitter 1540 may be an example of aspects of the transmitter/receiver 215 described with reference to FIG. 2 and the transceiver 1735 described with reference to FIG. 17. The transmitter 1540 may utilize a single antenna or a set of antennas.

Figure 16:
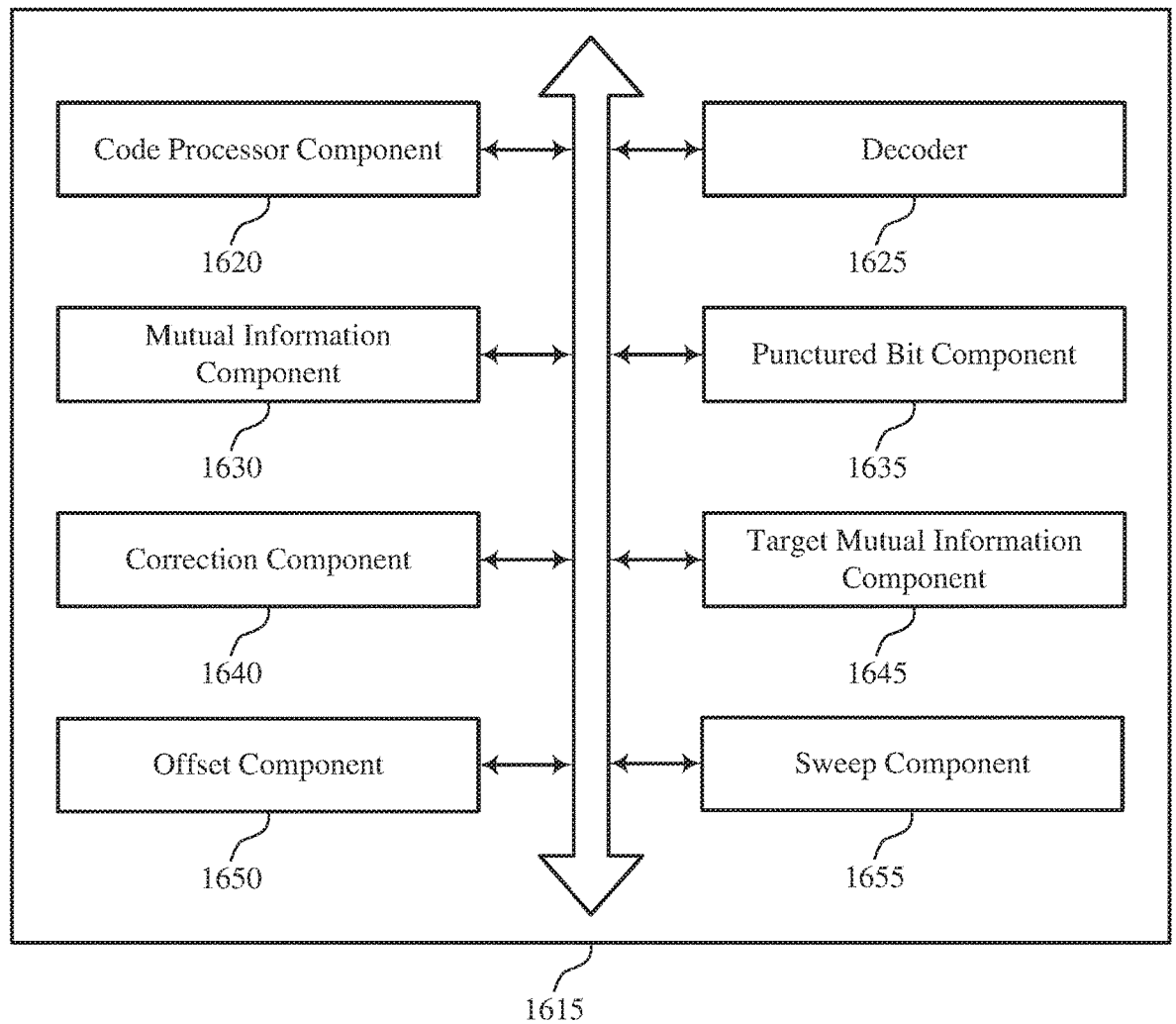

FIG. 16 shows a block diagram 1600 of a UE communications manager 1615 that supports mutual information based polar code construction in accordance with aspects of the present disclosure. The UE communications manager 1615 may be an example of aspects of a UE communications manager 1415, a UE communications manager 1515, or a UE communications manager 1715 described with reference to FIGS. 14, 15, and 17. The UE communications manager 1615 may include code processor component 1620, decoder 1625, mutual information component 1630, punctured bit component 1635, correction component 1640, target mutual information component 1645, offset component 1650, and sweep component 1655. Each of these modules may communicate, directly or indirectly, with one another (e.g., via one or more buses).

Code processor component 1620 may receive a codeword over a wireless channel, the codeword encoded using a polar code, and identify a set of bit locations of the polar code corresponding to information bits of an encoded information bit vector. In some cases, the set of bit locations may be determined based at least in part on a reliability order of the bit locations of the polar code. In some cases, the reliability order may be determined based at least in part on a recursive model that includes at least one mutual information transfer function that is applied at each polarization stage of a set of polarization stages of the polar code.

Decoder 1625 may decode a received codeword to obtain an information bit vector at the set of bit locations.

Mutual information component 1630 may apply a mutual information transfer function that includes calculating mutual information of a first subset of the bit locations for a current polarization stage of the set of polarization stages based at least in part on mutual information of a second subset of the bit locations from a preceding polarization stage of the set of polarization stages. In some cases, the reliability order of the bit locations of the polar code may be constructed based at least in part on the mutual information model and a set of different target mutual information values. In some cases, a first subset of the set of bit locations may be determined based at least in part on a first reliability order determined from applying the mutual information model for a first target mutual information value and a second subset of the set of bit locations are determined based at least in part on a second reliability order determined from applying the mutual information model for a second target mutual information value. In some cases, the first target mutual information value may be based at least in part on a first number of information bits to be encoded and a number of the bit locations, and the second target mutual information value is based at least in part on a second number of information bits to be encoded and the number of the bit locations.

Punctured bit component 1635 may calculate mutual information of a first bit location at a first polarization stage of a set of polarization stages based at least in part on the mutual information transfer function and mutual information associated with the punctured bit. In some cases, the first bit location of the bit locations corresponds to a punctured bit. In some cases, the mutual information of the bit channel associated with the punctured bit may be set to zero for non-shortening based puncturing or is set to a unity value for shortening-based puncturing. In some cases, a target mutual information for bit channels corresponding to bit locations other than the punctured bit may be determined based at least in part on a number of information bits to be encoded and a number of the bit locations excluding the bit channel associated with the punctured bit.

Correction component 1640 may apply a mutual information transfer function based at least in part on a BEC function and a correction term. In some cases, the correction term may be based at least in part on a bit channel capacity of the each stage of polarization and a capacity imbalance factor. In some cases, the correction term may include an offset factor applied to the bit channel capacity. In some cases, the correction term may include a scaling factor applied to the offset bit channel capacity. In some cases, the correction term may include an offset applied to the scaled and offset bit channel capacity.

Target mutual information component 1645 may determine a target mutual information for bit channels of the polar code based at least in part on a number of information bits to be encoded and a number of bit locations in the codeword which may include a repeated bit location. In some cases, the codeword includes at least one repeated bit of a bit location of the polar code.

Offset component 1650 may apply an offset to the target mutual information for the bit channels.

Sweep component 1655 may apply a recursive mutual information model by performing a sweep over the plurality of different target mutual information values to determine at least portions of respective output mutual information value curves for each of the bit locations of the polar code, and determining the reliability order of the bit locations of the polar code corresponding to an order in which each of the respective output mutual information value curves reaches a defined output mutual information value with respect to the plurality of different target mutual information values. In some cases, for a recursive model is a Gaussian approximation density-based evolution model, the sweep component 1655 may apply the recursive model by performing a sweep over a plurality of different target SNR values to determine at least portions of respective error rate value curves for each of the bit locations of the polar code, and determining the reliability order of the bit locations of the polar code corresponding to an order in which each of the respective error rate value curves reaches a defined error rate value with respect to the plurality of different target SNR values. In some cases, sweep component 1655 may retrieve a set of bit locations from a table that includes a plurality of sets of bit locations. In some cases, sweep component 1655 may store a table that lists a plurality of sets of bit locations, wherein identifying the set of bit locations of the polar code corresponding to the information bits of the encoded information bit vector includes determining that a first bit location of the bit locations corresponds to a punctured bit, determining not to retrieve any of the plurality of sets of bit locations from the table, and applying the recursive model by the sweep component 1655, a decoder, or the like, to identify the set of bit locations.

Figure 17:
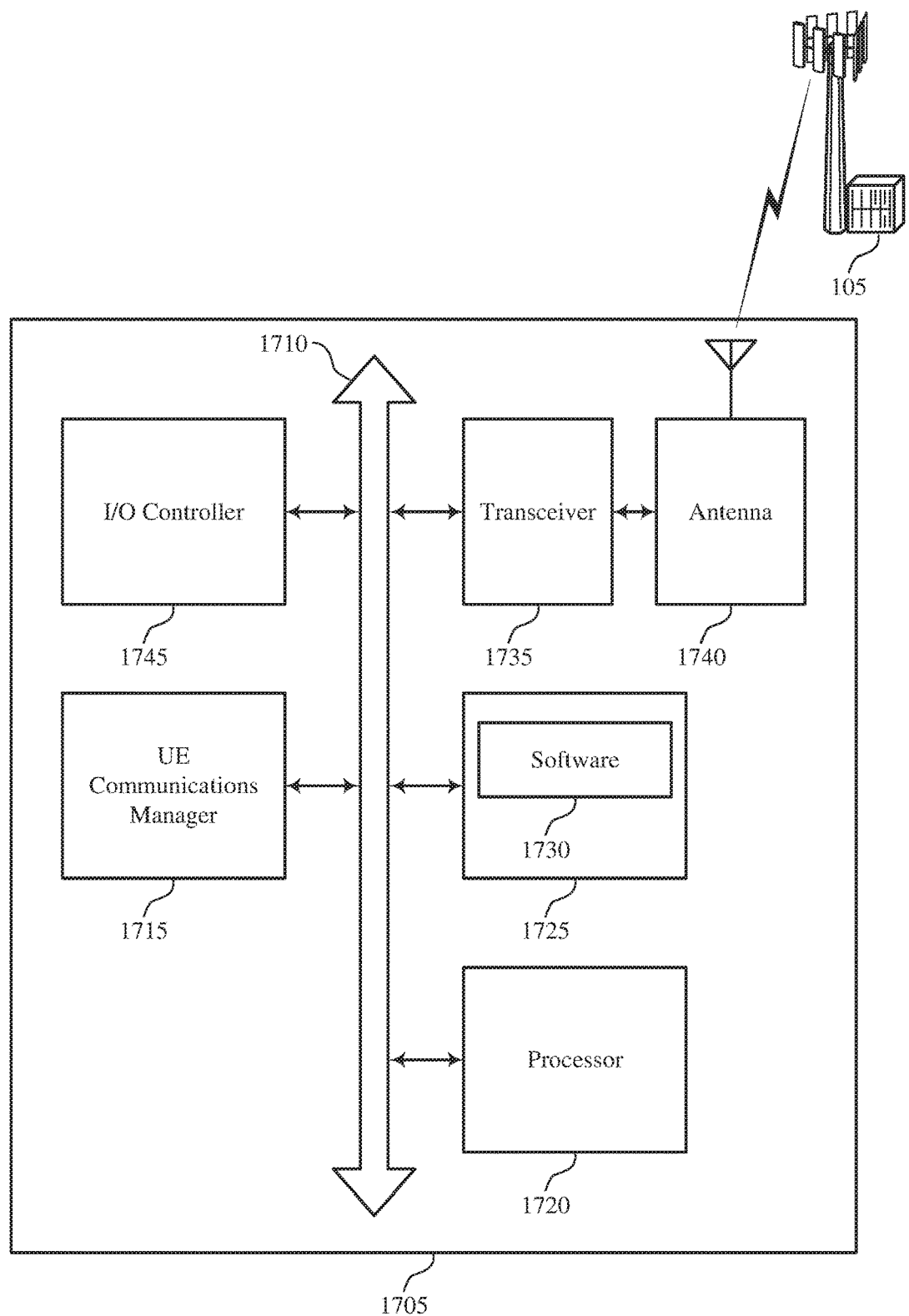
FIG. 17 illustrates a block diagram of a system including a UE that supports mutual information based polar code construction in accordance with aspects of the present disclosure.

FIG. 17 shows a diagram of a system 1700 including a device 1705 that supports mutual information based polar code construction in accordance with aspects of the present disclosure. Device 1705 may be an example of or include the components of wireless device 1405, wireless device 1505, or a UE 115 as described above, e.g., with reference to FIGS. 1, 14 and 15. Device 1705 may include components for bi-directional voice and data communications including components for transmitting and receiving communications, including UE communications manager 1715, processor 1720, memory 1725, software 1730, transceiver 1735, antenna 1740, and I/O controller 1745. These components may be in electronic communication via one or more busses (e.g., bus 1710). Device 1705 may communicate wirelessly with one or more base stations 105.

Processor 1720 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1720 may be configured to operate a memory array using a memory controller. In other cases, a memory controller may be integrated into processor 1720. Processor 1720 may be configured to execute computer-readable instructions stored in a memory to perform various functions (e.g., functions or tasks supporting mutual information based polar code construction).

Memory 1725 may include random access memory (RAM) and read only memory (ROM). The memory 1725 may store computer-readable, computer-executable software 1730 including instructions that, when executed, cause the processor to perform various functions described herein. In some cases, the memory 1725 may contain, among other things, a basic input/output system (BIOS) which may control basic hardware and/or software operation such as the interaction with peripheral components or devices.

Software 1730 may include code to implement aspects of the present disclosure, including code to support mutual information based polar code construction. Software 1730 may be stored in a non-transitory computer-readable medium such as system memory or other memory. In some cases, the software 1730 may not be directly executable by the processor but may cause a computer (e.g., when compiled and executed) to perform functions described herein.

Transceiver 1735 may communicate bi-directionally, via one or more antennas, wired, or wireless links as described above. For example, the transceiver 1735 may represent a wireless transceiver and may communicate bi-directionally with another wireless transceiver. The transceiver 1735 for transmitting codewords via a wireless channel and receiving codewords via the wireless channel may be implemented as the transmitter/receiver 215 discussed previously. The transceiver 1735 may also include a modem to modulate the packets and provide the modulated packets to the antennas for transmission, and to demodulate packets received from the antennas.

In some cases, the wireless device may include a single antenna 1740. However, in some cases the device may have more than one antenna 1740, which may be capable of concurrently transmitting or receiving multiple wireless transmissions.

I/O controller 1745 may manage input and output signals for device 1705. I/O controller 1745 may also manage peripherals not integrated into device 1705. In some cases, I/O controller 1745 may represent a physical connection or port to an external peripheral. In some cases, I/O controller 1745 may utilize an operating system such as iOS®, ANDROID®, MS-DOS, MS-WINDOWS®, OS/2®, UNIX®, LINUX®, or another known operating system. In other cases, I/O controller 1745 may represent or interact with a modem, a keyboard, a mouse, a touchscreen, or a similar device. In some cases, I/O controller 1745 may be implemented as part of a processor. In some cases, a user may interact with device 1705 via I/O controller 1745 or via hardware components controlled by I/O controller 1745.

Figure 18:
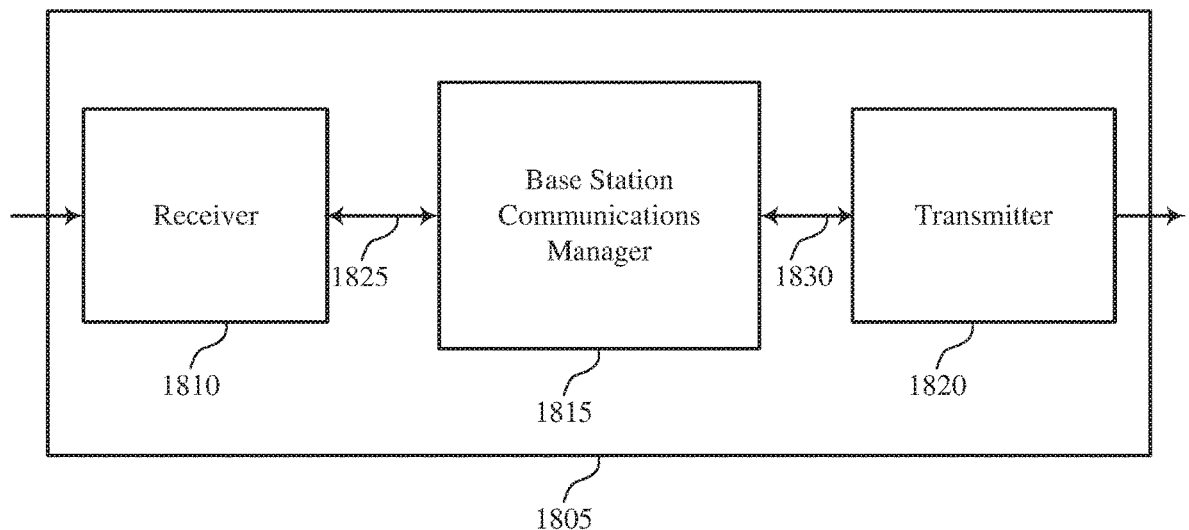
FIGS. 18 through 20 show block diagrams of a device that supports mutual information based polar code construction in accordance with aspects of the present disclosure.

FIG. 18 shows a block diagram 1800 of a wireless device 1805 that supports mutual information based polar code construction in accordance with aspects of the present disclosure. Wireless device 1805 may be an example of aspects of a base station 105 as described with reference to FIG. 1. Wireless device 1805 may include receiver 1810 in communication with base station communications manager 1815 via communication link 1825, and in communication with transmitter 1820 via communication link 1830. Wireless device 1805 may also include a processor. Each of these components may be in communication with one another (e.g., via one or more buses).

Receiver 1810 may receive a codeword encoded using a polar code. The codeword may have been generated using an information bit vector including one or more information bits and other bits, such as frozen bits and parity check bits. The received codeword may be passed on to other components of the device 1805. The receiver 1810 may be an example of aspects of the transmitter/receiver 215 described with reference to FIG. 2 and the transceiver 2135 described with reference to FIG. 21. The receiver 1810 may utilize a single antenna or a set of antennas.

Base station communications manager 1815 may be an example of aspects of the base station communications manager 2115 described with reference to FIG. 21.

Base station communications manager 1815 and/or at least some of its various sub-components may be implemented in hardware, software executed by a processor, firmware, or any combination thereof. If implemented in software executed by a processor, the functions of the base station communications manager 1815 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The base station communications manager 1815 and/or at least some of its various sub-components may be physically located at various positions, including being distributed such that portions of functions are implemented at different physical locations by one or more physical devices. In some examples, base station communications manager 1815 and/or at least some of its various sub-components may be a separate and distinct component in accordance with various aspects of the present disclosure. In other examples, base station communications manager 1815 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station communications manager 1815 may identify an information bit vector for encoding using a polar code, identify a set of bit locations of the polar code to be used for information bits of the information bit vector, where the set of bit locations is determined based at least in part on a reliability order of the bit locations of the polar code, and where the reliability order is determined based at least in part on a recursive model that includes at least one mutual information transfer function that is applied at each polarization stage of a set of polarization stages of the polar code, encode the information bit vector mapped to the set of bit locations using the polar code to obtain a codeword, and transmit the codeword over a wireless channel.

Transmitter 1820 may transmit signals generated by other components of the device. Transmitter 1820 may receive a codeword output by encoder 210 and transmit the codeword via a wireless channel. In some examples, the transmitter 1820 may be collocated with a receiver 1810 in a transceiver module. For example, the transmitter 1820 may be an example of aspects of the transmitter/receiver 215 described with reference to FIG. 2 and transceiver 2135 described with reference to FIG. 21. The transmitter 1820 may utilize a single antenna or a set of antennas.

Figure 19:
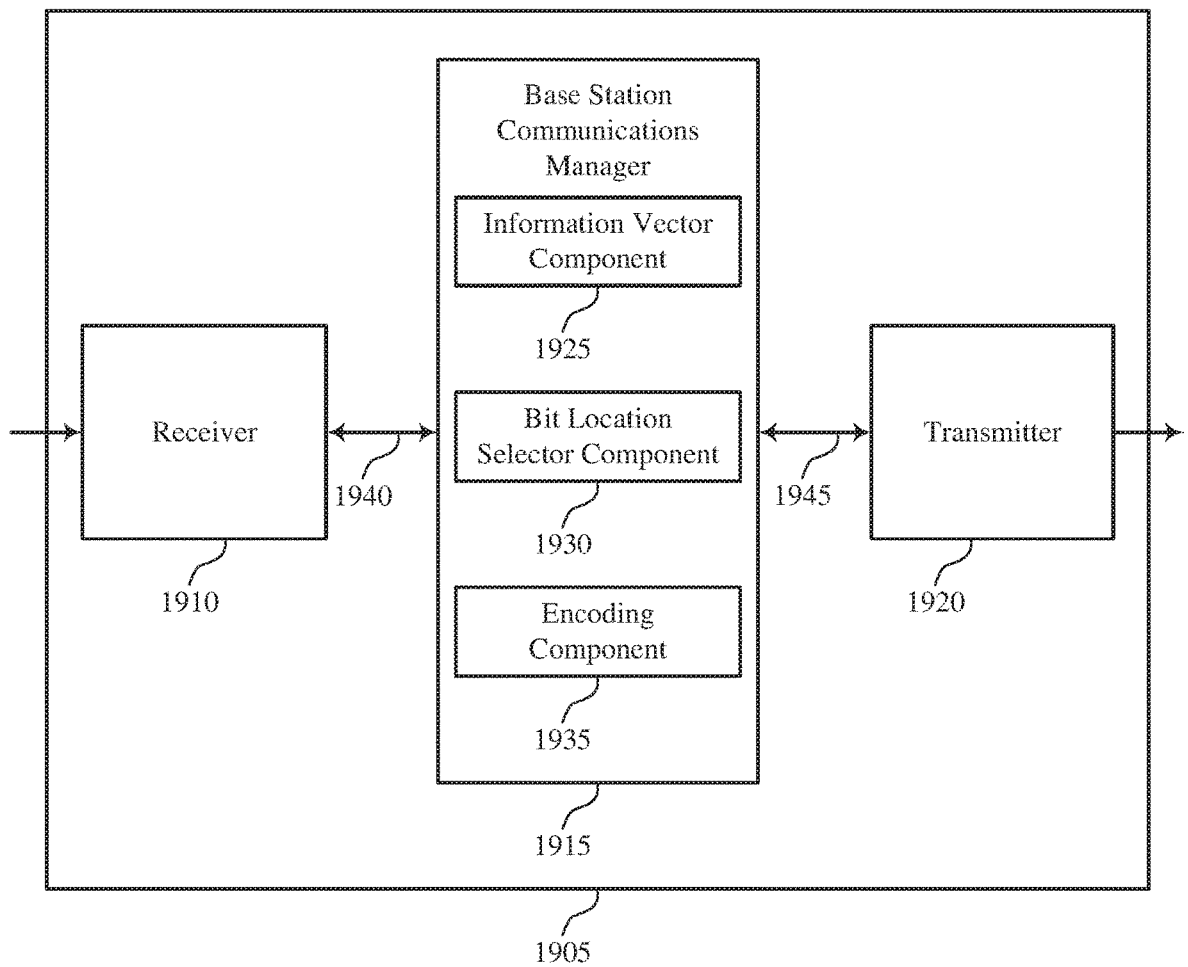

FIG. 19 shows a block diagram 1900 of a wireless device 1905 that supports mutual information based polar code construction in accordance with aspects of the present disclosure. Wireless device 1905 may be an example of aspects of a wireless device 1805 or a base station 105 as described with reference to FIGS. 1 and 18. Wireless device 1905 may include receiver 1910 in communication with base station communications manager 1915 via communication link 1940, and in communication with transmitter 1920 via communication link 1945. Wireless device 1905 may also include a processor. Each of these components may be in communication with one another (e.g., via one or more buses).

Receiver 1910 may receive a codeword encoded using a polar code. The codeword may have been generated using an information bit vector including one or more information bits and other bits, such as frozen bits and parity check bits. The received codeword may be passed on to other components of the device 1905. The receiver 1910 may be an example of aspects of the transmitter/receiver 215 described with reference to FIG. 2 and the transceiver 2135 described with reference to FIG. 21. The receiver 1910 may utilize a single antenna or a set of antennas.

Base station communications manager 1915 may be an example of aspects of the base station communications manager 2115 described with reference to FIG. 21.

Base station communications manager 1915 may also include information vector component 1925, bit location selector component 1930, and encoding component 1935.

Information vector component 1925 may identify an information bit vector for encoding using a polar code.

Bit location selector component 1930 may identify a set of bit locations of the polar code to be used for information bits of the information bit vector, where the set of bit locations is determined based at least in part on a reliability order of the bit locations of the polar code, and where the reliability order is determined based at least in part on a recursive model that includes at least one mutual information transfer function that is applied at each polarization stage of a set of polarization stages of the polar code.

Encoding component 1935 may encode the information bit vector mapped to the set of bit locations using the polar code to obtain a codeword and transmit the codeword over a wireless channel.

Transmitter 1920 may transmit signals generated by other components of the device. Transmitter 1920 may receive a codeword output by encoder 210 and transmit the codeword via a wireless channel. In some examples, the transmitter 1920 may be collocated with a receiver 1910 in a transceiver module. For example, the transmitter 1920 may be an example of aspects of the transmitter/receiver 215 described with reference to FIG. 2 and the transceiver 2135 described with reference to FIG. 21. The transmitter 1920 may utilize a single antenna or a set of antennas.

Figure 20:
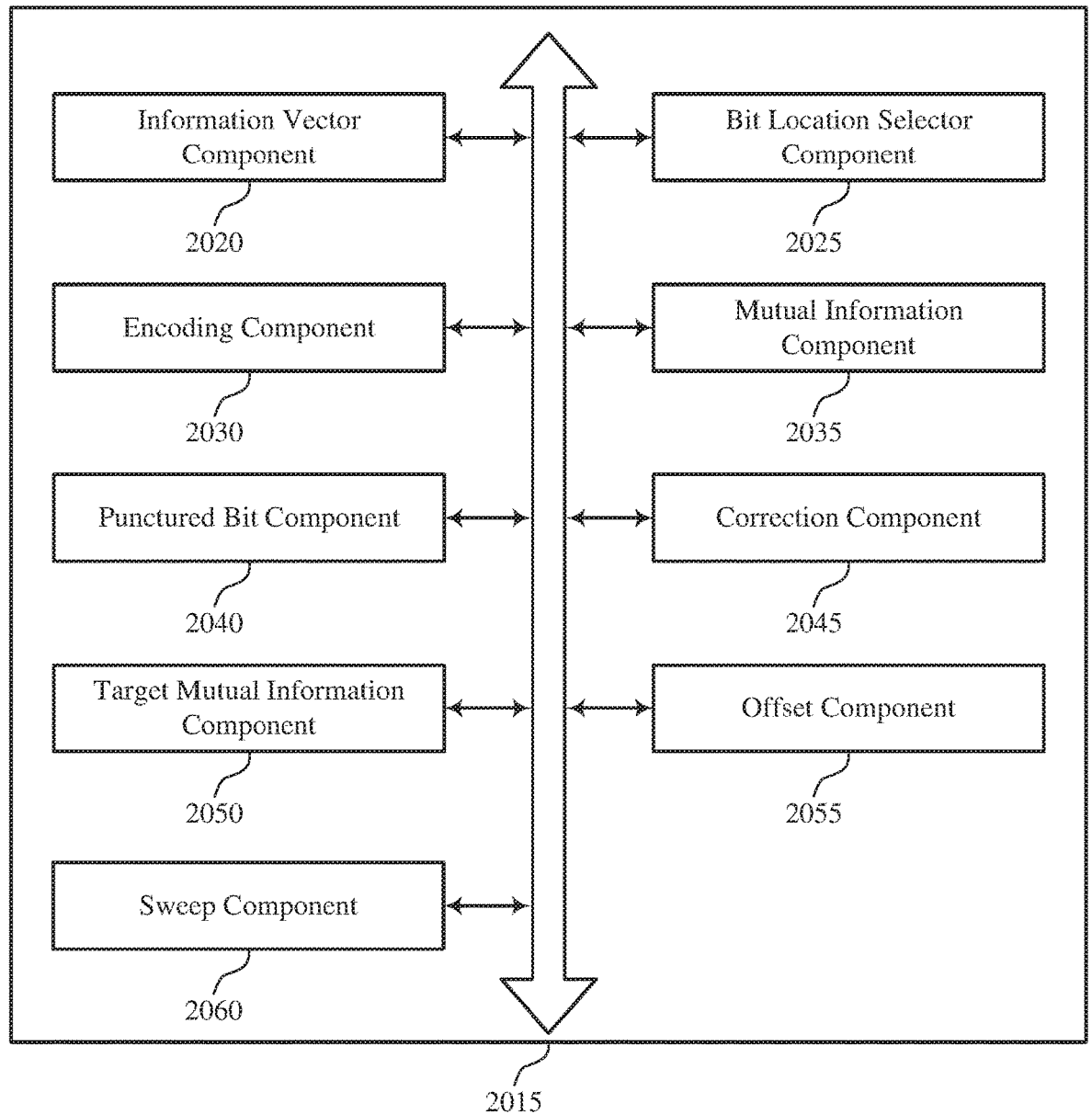

FIG. 20 shows a block diagram 2000 of a base station communications manager 2015 that supports mutual information based polar code construction in accordance with aspects of the present disclosure. The base station communications manager 2015 may be an example of aspects of a base station communications manager 2115 described with reference to FIGS. 18, 19, and 21. The base station communications manager 2015 may include information vector component 2020, bit location selector component 2025, encoding component 2030, mutual information component 2035, punctured bit component 2040, correction component 2045, target mutual information component 2050, offset component 2055, and sweep component 2060. Each of these modules may communicate, directly or indirectly, with one another (e.g., via one or more buses).

Information vector component 2020 may identify an information bit vector for encoding using a polar code.

Bit location selector component 2025 may identify a set of bit locations of the polar code to be used for information bits of the information bit vector, where the set of bit locations is determined based at least in part on a reliability order of the bit locations of the polar code, and where the reliability order is determined based at least in part on a recursive model that includes at least one mutual information transfer function that is applied at each polarization stage of a set of polarization stages of the polar code.

Encoding component 2030 may encode the information bit vector mapped to the set of bit locations using the polar code to obtain a codeword and transmit the codeword over a wireless channel.

Mutual information component 2035 may apply the mutual information transfer function includes calculating mutual information of a first subset of the bit locations for a current polarization stage of the set of polarization stages based at least in part on mutual information of a second subset of bit locations from a preceding polarization stage of the set of polarization stages. In some cases, the reliability order of the bit locations of the polar code is constructed based at least in part on the mutual information model and a set of different target mutual information values. In some cases, a first subset of the set of bit locations are determined based at least in part on a first reliability order determined from applying the mutual information model for a first target mutual information value and a second subset of the set of bit locations are determined based at least in part on a second reliability order determined from applying the mutual information model for a second target mutual information value. In some cases, the first target mutual information value is based at least in part on a first number of information bits to be encoded and a number of the bit locations, and the second target mutual information value is based at least in part on a second number of information bits to be encoded and the number of the bit locations.

Punctured bit component 2040 may mutual information of the first bit location at a first polarization stage of the set of polarization stages is calculated based at least in part on the mutual information transfer function and mutual information associated with the punctured bit. In some cases, a first bit location of the bit locations corresponds to a punctured bit. In some cases, the mutual information of the bit channel associated with the punctured bit is set to zero for non-shortening based puncturing or is set to a unity value for shortening-based puncturing. In some cases, a target mutual information for bit channels corresponding to bit locations other than the punctured is determined based at least in part on a number of information bits to be encoded and a number of the bit locations excluding the hit channel associated with the punctured bit.

Correction component 2045 may apply a mutual information transfer function that is based at least in part on a binary erasure channel (BEC) function and a correction term. In some cases, the correction term is based at least in part on a bit channel capacity of the each stage of polarization and a capacity imbalance factor. In some cases, the correction term includes an offset factor applied to the bit channel capacity. In some cases, the correction term includes a scaling factor applied to the offset bit channel capacity. In some cases, the correction term includes an offset applied to the scaled and offset bit channel capacity.

Target mutual information component 2050 may determine a target mutual information for bit channels of a polar code based at least in part on a number of information bits to be encoded and a number of bit locations in the codeword, which may include repeated bit location. In some cases, the codeword includes at least one repeated bit of a bit location of the polar code.

Offset component 2055 may apply an offset to the target mutual information for the bit channels.

Sweep component 2060 may apply a recursive mutual information model by performing a sweep over the plurality of different target mutual information values to determine at least portions of respective output mutual information value curves for each of the bit locations of the polar code, and determining the reliability order of the bit locations of the polar code corresponding to an order in which each of the respective output mutual information value curves reaches a defined output mutual information value with respect to the plurality of different target mutual information values. In some cases, for a recursive model is a Gaussian approximation density-based evolution model, the sweep component 2060 may apply the recursive model by performing a sweep over a plurality of different target SNR values to determine at least portions of respective error rate value curves for each of the bit locations of the polar code, and determining the reliability order of the bit locations of the polar code corresponding to an order in which each of the respective error rate value curves reaches a defined error rate value with respect to the plurality of different target SNR values. In some cases, sweep component 2060 may retrieve a set of bit locations from a table that includes a plurality of sets of bit locations. In some cases, sweep component 2060 may store a table that lists a plurality of sets of bit locations, wherein identifying the set of bit locations of the polar code corresponding to the information bits of the encoded information bit vector includes determining that a first bit location of the bit locations corresponds to a punctured bit, and determining not to retrieve any of the plurality of sets of bit locations from the table, wherein applying the recursive model is performed by the sweep component 2060, a decoder, or the like, to identify the set of bit locations.

Figure 21:
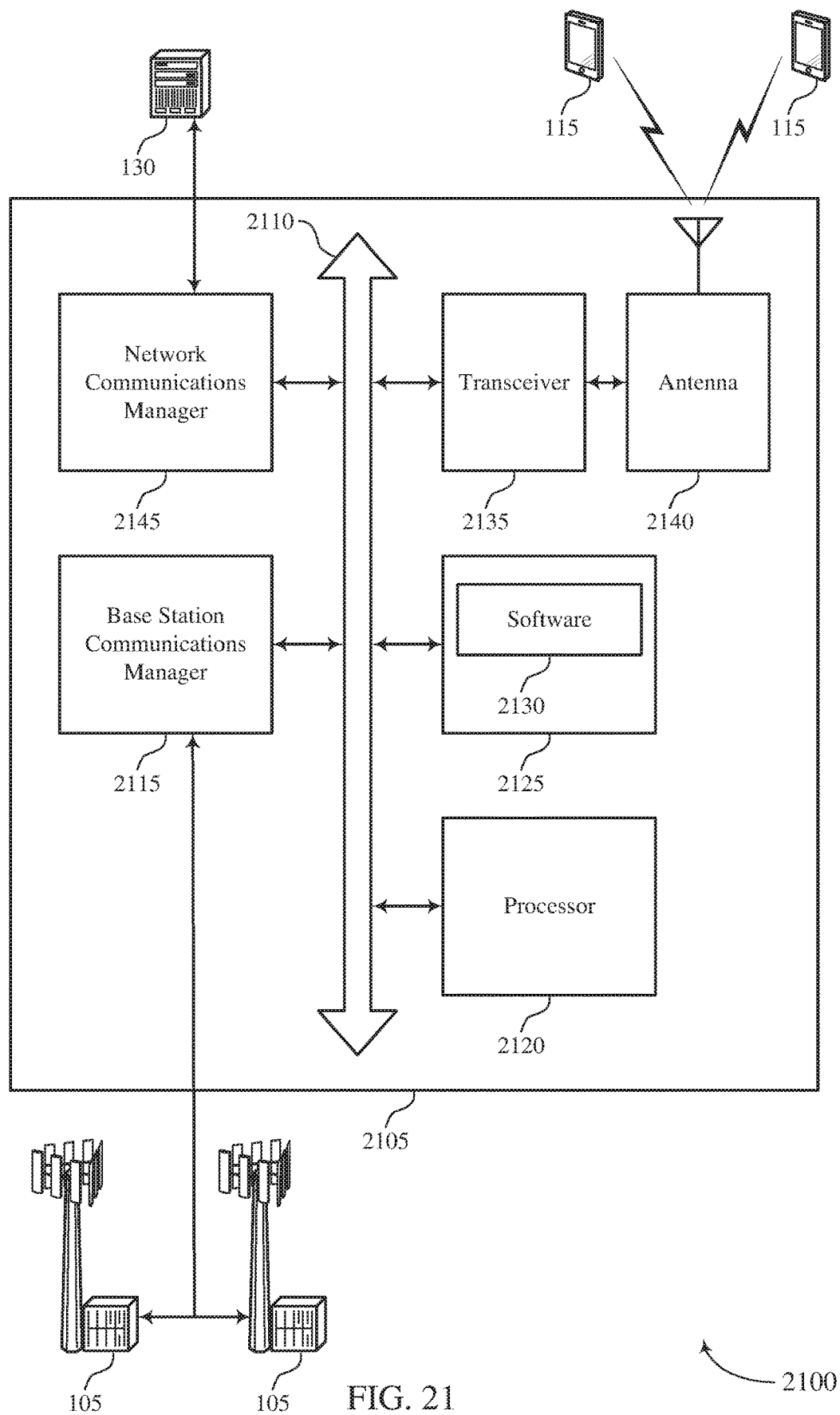
FIG. 21 illustrates a block diagram of a system including a base station that supports mutual information based polar code construction in accordance with aspects of the present disclosure.

FIG. 21 shows a diagram of a system 2100 including a device 2105 that supports mutual information based polar code construction in accordance with aspects of the present disclosure. Device 2105 may be an example of or include the components of base station 105 as described above, e.g., with reference to FIG. 1. Device 2105 may include components for bi-directional voice and data communications including components for transmitting and receiving communications, including base station communications manager 2115, processor 2120, memory 2125, software 2130, transceiver 2135, antenna 2140, network communications manager 2145, and base station communications manager 2115. These components may be in electronic communication via one or more busses (e.g., bus 2110). Device 2105 may communicate wirelessly with one or more UEs 115.

Processor 2120 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 2120 may be configured to operate a memory array using a memory controller. In other cases, a memory controller may be integrated into processor 2120. Processor 2120 may be configured to execute computer-readable instructions stored in a memory to perform various functions (e.g., functions or tasks supporting mutual information based polar code construction).

Memory 2125 may include RAM and ROM. The memory 2125 may store computer-readable, computer-executable software 2130 including instructions that, when executed, cause the processor to perform various functions described herein. In some cases, the memory 2125 may contain, among other things, a BIOS which may control basic hardware and/or software operation such as the interaction with peripheral components or devices.

Software 2130 may include code to implement aspects of the present disclosure, including code to support mutual information based polar code construction. Software 2130 may be stored in a non-transitory computer-readable medium such as system memory or other memory. In some cases, the software 2130 may not be directly executable by the processor but may cause a computer (e.g., when compiled and executed) to perform functions described herein.

Transceiver 2135 may communicate bi-directionally, via one or more antennas, wired, or wireless links as described above. For example, the transceiver 2135 may represent a wireless transceiver and may communicate bi-directionally with another wireless transceiver. Transceiver 2135 may be an example of transmitter/receiver 215 described with reference to FIG. 2. The transceiver 2135 may also include a modem to modulate the packets and provide the modulated packets to the antennas for transmission, and to demodulate packets received from the antennas.

In some cases, the wireless device may include a single antenna 2140. However, in some cases the device may have more than one antenna 2140, which may be capable of concurrently transmitting or receiving multiple wireless transmissions.

Network communications manager 2145 may manage communications with the core network (e.g., via one or more wired backhaul links). For example, the network communications manager 2145 may manage the transfer of data communications for client devices, such as one or more UEs 115.

Base station communications manager 2115 may manage communications with other base station 105, and may include a controller or scheduler for controlling communications with UEs 115 in cooperation with other base stations 105. For example, the base station communications manager 2115 may coordinate scheduling for transmissions to UEs 115 for various interference mitigation techniques such as beamforming or joint transmission. In some examples, base station communications manager 2150 may provide an X2 interface within an LTE/LTE-A wireless communication network technology to provide communication between base stations 105.

Figure 22:
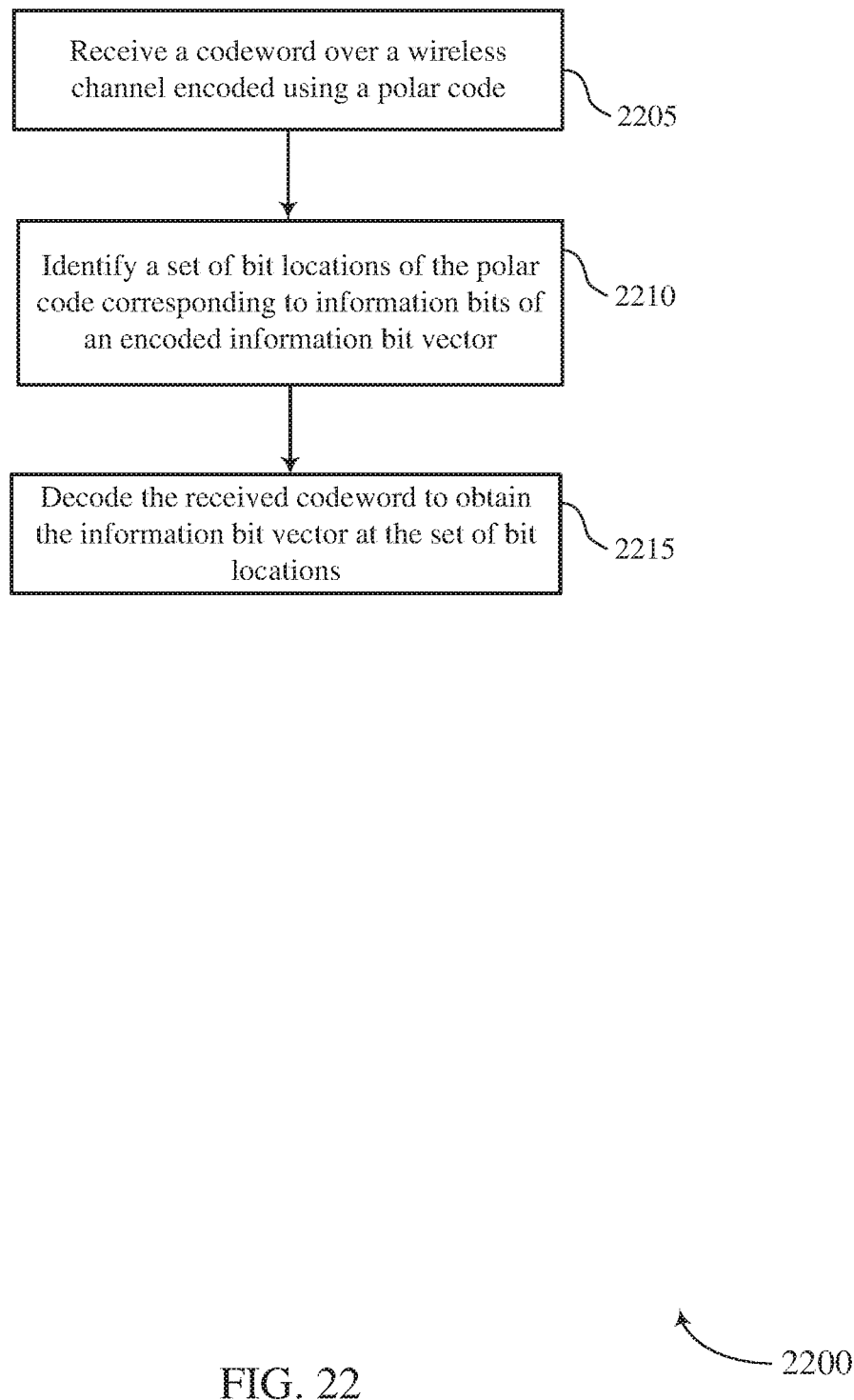
FIGS. 22 through 29 illustrate methods for mutual information based polar code construction in accordance with aspects of the present disclosure.

FIG. 22 shows a flowchart illustrating a method 2200 for mutual information based polar code construction in accordance with aspects of the present disclosure. The operations of method 2200 may be implemented by a UE 115 or its components as described herein. For example, the operations of method 2200 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2205, the UE 115 may receive a codeword over a wireless channel using a polar code. The UE 115 may include a receiver 215 to receive the codeword via a wireless channel. The codeword may be generated using an information bit vector including one or more information bits and other bits, such as frozen bits and parity check bits, that is encoded using a polar code. The operations of block 2205 may be performed according to the methods described with reference to FIGS. 1 through 13. In certain examples, aspects of the operations of block 2205 may be performed by a code processor component as described with reference to FIGS. 14 through 17.

At block 2210, the UE 115 may identify a set of bit locations of the polar code corresponding to information bits of an encoded information bit vector. Furthermore, the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code. In some cases, the UE 115 may apply a recursive model to determine the reliability order. In some examples, a transmission, such as a base station 105, may generate control information indicating a number of information bits k and a length N of a codeword, and the UE 115 may access a stored table using number k and length N to determine the reliability order. The operations of block 2210 may be performed according to the methods described with reference to FIGS. 1 through 13. In certain examples, aspects of the operations of block 2210 may be performed by a code processor component as described with reference to FIGS. 14 through 17.

At block 2215, the UE 115 may decode the received codeword to obtain the information bit vector at the set of bit locations. For example, the UE 115 may provide the codeword to a decoder 210 for decoding, where the decoder 210 may identify a set of bit locations of the polar code corresponding to information bits of an encoded information bit vector. The operations of block 2215 may be performed according to the methods described with reference to FIGS. 1 through 13. In certain examples, aspects of the operations of block 2215 may be performed by a decoder as described with reference to FIGS. 14 through 17.

Figure 23:
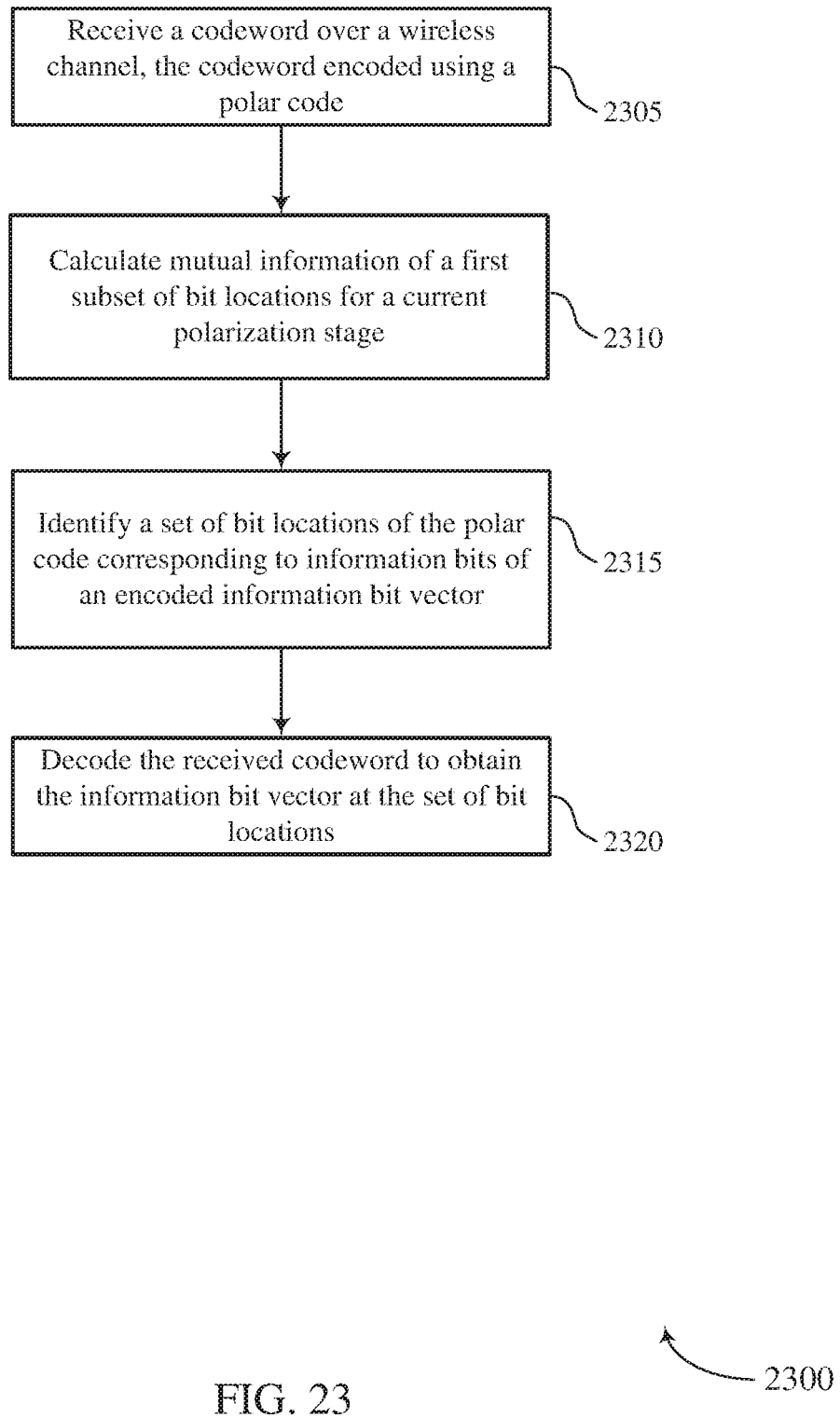

FIG. 23 shows a flowchart illustrating a method 2300 for mutual information based polar code construction in accordance with aspects of the present disclosure. The operations of method 2300 may be implemented by a UE 115 or its components as described herein. For example, the operations of method 2300 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2305, the UE 115 may receive a codeword over a wireless channel using a polar code. The UE 115 may include a receiver 215 to receive the codeword via the wireless channel. The codeword may be generated using an information bit vector including one or more information bits and other bits, such as frozen bits and parity check bits, that is encoded using a polar code. The operations of block 2305 may be performed according to the methods described with reference to FIGS. 1 through 13. In certain examples, aspects of the operations of block 2305 may be performed by a code processor component as described with reference to FIGS. 14 through 17.

At block 2310, the UE 115 may calculate mutual information of a first subset of bit locations for a current polarization stage. For example, a decoder 210 of the UE 115 may calculate the mutual information of the first subset of bit locations based at least in part on mutual information of a second subset of the bit locations from a preceding polarization stage of the plurality of polarization stages. The operations of block 2310 may be performed according to the methods described with reference to FIGS. 1 through 13. In certain examples, aspects of the operations of block 2310 may be performed by a mutual information component as described with reference to FIGS. 14 through 17.

At block 2315, the UE 115 may identify the set of bit locations of the polar code corresponding to information bits of an encoded information bit vector. For example, a decoder 210 of the UE 115 may determine the set of bit locations based at least in part on a reliability order of the bit locations of the polar code. In some examples, the decoder 210 of the UE 115 may determine the reliability order based at least in part on a recursive model that includes at least one mutual information transfer function that is applied at each polarization stage of a plurality of polarization stages of the polar code. The operations of block 2315 may be performed according to the methods described with reference to FIGS. 1 through 13. In certain examples, aspects of the operations of block 2315 may be performed by a code processor component as described with reference to FIGS. 14 through 17.

At block 2320, the UE 115 may decode the received codeword to obtain the information bit vector at the set of bit locations. For example, the receiver 215 of the UE 115 may provide the codeword to the decoder 210 for decoding, and the decoder 210 may identify a set of bit locations of the polar code corresponding to information bits of an encoded information bit vector. The operations of block 2320 may be performed according to the methods described with reference to FIGS. 1 through 13. In certain examples, aspects of the operations of block 2320 may be performed by a decoder as described with reference to FIGS. 14 through 17.

Figure 24:
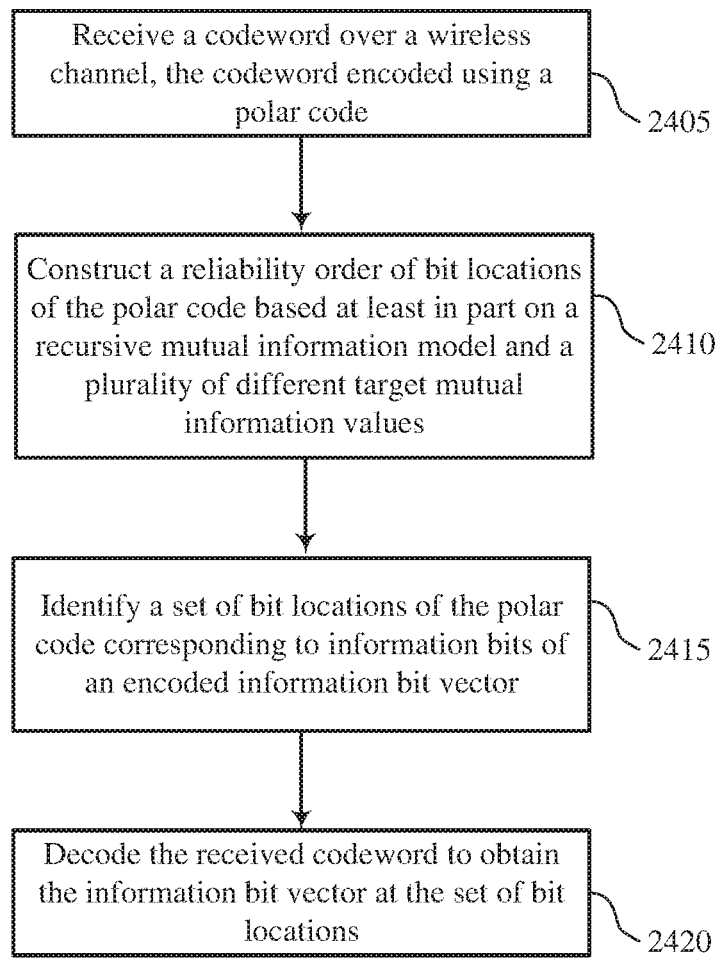

FIG. 24 shows a flowchart illustrating a method 2400 for mutual information based polar code construction in accordance with aspects of the present disclosure. The operations of method 2400 may be implemented by a UE 115 or its components as described herein. For example, the operations of method 2400 may be performed by a UE communications manager as described with reference to FIGS. 14 through 17. In some examples, a UE 115 may execute a set of codes to control the functional elements of the device to perform the functions described below. Additionally or alternatively, the UE 115 may perform aspects of the functions described below using special-purpose hardware.

At block 2405, the UE 115 may receive a codeword over a wireless channel using a polar code. The UE 115 may include a receiver 215 to receive the codeword via a wireless channel. The codeword may be generated using an information bit vector including one or more information bits and other bits, such as frozen bits and parity check bits, that is encoded using a polar code. The operations of block 2405 may be performed according to the methods described with reference to FIGS. 1 through 13. In certain examples, aspects of the operations of block 2405 may be performed by a code processor component as described with reference to FIGS. 14 through 17.

At block 2410, the UE 115 may construct a reliability order of bit locations of the polar code based at least in part on a recursive mutual information model and a plurality of different target mutual information values. In some examples, a decoder 210 of the UE 115 may determine the reliability order based on an order in which each of the respective output mutual information value curves reaches a defined output mutual information value with respect to the plurality of different target mutual information values. The operations of block 2410 may be performed according to the methods described with reference to FIGS. 1 through 13. In certain examples, aspects of the operations of block 2410 may be performed by a mutual information component as described with reference to FIGS. 14 through 17.

At block 2415, the UE 115 may identify the set of bit locations of the polar code corresponding to information bits of an encoded information bit vector. In some examples, a decoder 210 of the UE 115 may determine the set of bit locations based at least in part on a reliability order of the bit locations of the polar code. In some examples, the decoder 210 may determine the reliability order based at least in part on a recursive model that includes at least one mutual information transfer function that is applied at each polarization stage of a plurality of polarization stages of the polar code. The operations of block 2415 may be performed according to the methods described with reference to FIGS. 1 through 13. In certain examples, aspects of the operations of block 2415 may be performed by a code processor component as described with reference to FIGS. 14 through 17.

At block 2420, the UE 115 may decode the received codeword to obtain the information bit vector at the set of bit locations. For example, the receiver 215 of the UE 115 may provide the codeword to the decoder 210 for decoding, and the decoder 210 may identify a set of bit locations of the polar code corresponding to information bits of an encoded information bit vector. The operations of block 2420 may be performed according to the methods described with reference to FIGS. 1 through 13. In certain examples, aspects of the operations of block 2420 may be performed by a decoder as described with reference to FIGS. 14 through 17.

Figure 25:
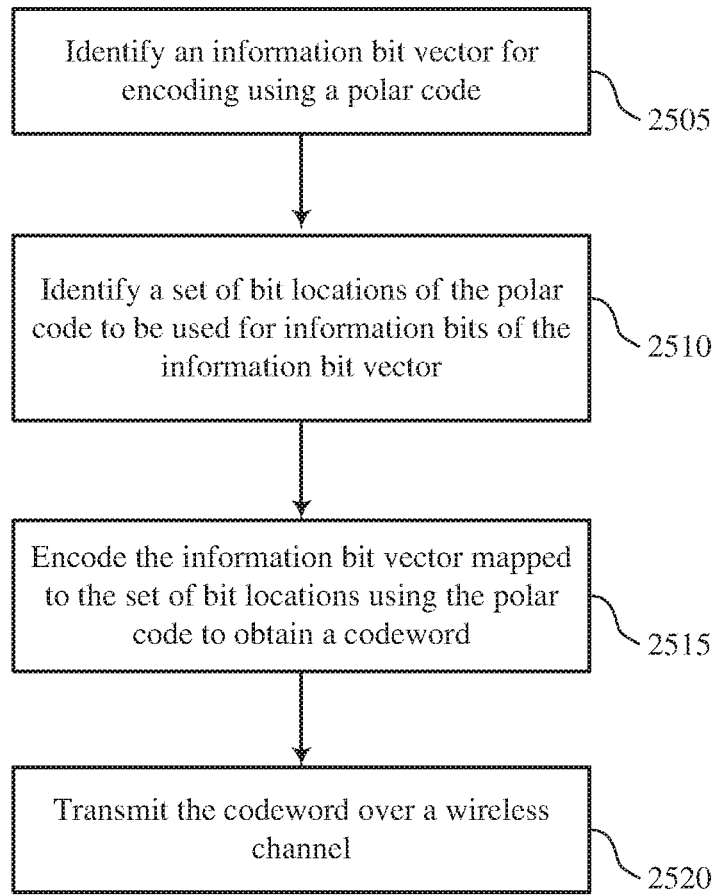

FIG. 25 shows a flowchart illustrating a method 2500 for mutual information based polar code construction in accordance with aspects of the present disclosure. The operations of method 2500 may be implemented by a base station 105 or its components as described herein. For example, the operations of method 2500 may be performed by a base station communications manager as described with reference to FIGS. 18 through 21. In some examples, a base station 105 may execute a set of codes to control the functional elements of the device to perform the functions described below. Additionally or alternatively, the base station 105 may perform aspects of the functions described below using special-purpose hardware.

At block 2505, the base station 105 may identify an information bit vector for encoding using a polar code. For example, an encoder 210 of the base station 105 may identify a set of bit locations that correspond to information bits of an encoded information bit vector. The operations of block 2505 may be performed according to the methods described with reference to FIGS. 1 through 13. In certain examples, aspects of the operations of block 2505 may be performed by an information vector component as described with reference to FIGS. 18 through 21.

At block 2510, the base station 105 may identify a set of bit locations of the polar code to be used for information bits of the information bit vector. For example, the encoder 210 of the base station 105 may determine the set of bit locations based at least in part on a reliability order of the bit locations of the polar code. In some cases, the encoder 210 of the base station 105 may determine the reliability order based at least in part on a recursive model that includes at least one mutual information transfer function that is applied at each polarization stage of a plurality of polarization stages of the polar code. The operations of block 2510 may be performed according to the methods described with reference to FIGS. 1 through 13. In certain examples, aspects of the operations of block 2510 may be performed by a bit location selector component as described with reference to FIGS. 18 through 21.

At block 2515, the base station 105 may encode the information bit vector mapped to the set of bit locations using the polar code to obtain a codeword. In an example, the encoder 210 of the base station 105 may load information bits into bit locations determined to be the most reliable for polar encoding to form a codeword for transmission over a wireless channel. In addition, the encoder 210 may encode k information bits and output a codeword having a length N, where k<N. Parity bits may be used in some forms of outer codes to provide redundancy to protect information bits, and frozen bits may be denoted by a given value (0, 1, etc.) known to both the encoder 210 of the base station 105 and the decoder of the UE 115 (i.e., the encoder encoding information bits at a transmitter, and the decoder decoding the codeword received at a receiver). The operations of block 2515 may be performed according to the methods described with reference to FIGS. 1 through 13. In certain examples, aspects of the operations of block 2515 may be performed by a encoding component as described with reference to FIGS. 18 through 21.

At block 2520, the base station 105 may transmit the codeword over a wireless channel by way of a transmitter. In an example, transmitter 215 of the base station 105 may transmit the codeword. The operations of block 2520 may be performed according to the methods described with reference to FIGS. 1 through 13. In certain examples, aspects of the operations of block 2520 may be performed by a encoding component as described with reference to FIGS. 18 through 21.

Figure 26:
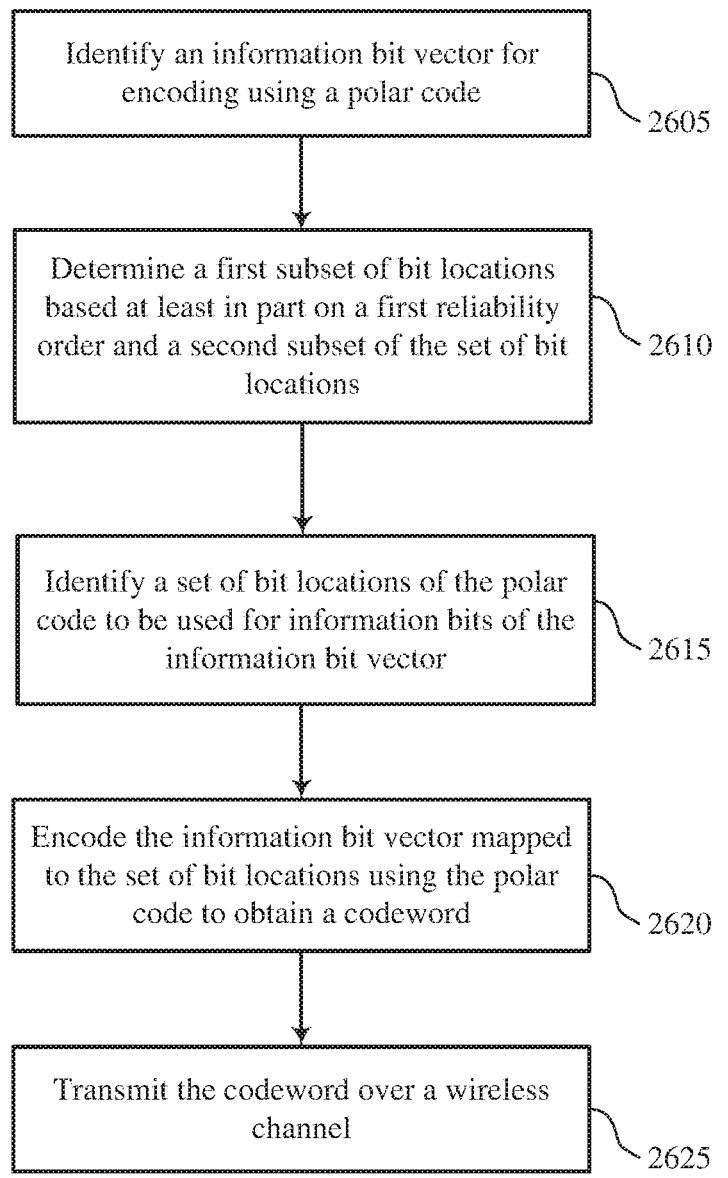

FIG. 26 shows a flowchart illustrating a method 2600 for mutual information based polar code construction in accordance with aspects of the present disclosure. The operations of method 2600 may be implemented by a base station 105 or its components as described herein. For example, the operations of method 2600 may be performed by a base station communications manager as described with reference to FIGS. 18 through 21. In some examples, a base station 105 may execute a set of codes to control the functional elements of the device to perform the functions described below. Additionally or alternatively, the base station 105 may perform aspects of the functions described below using special-purpose hardware.

At block 2605, the base station 105 may identify an information bit vector for encoding using a polar code. For example, an encoder 210 of the base station 105 may identify a set of bit locations that correspond to information bits of an encoded information bit vector. The operations of block 2605 may be performed according to the methods described with reference to FIGS. 1 through 13. In certain examples, aspects of the operations of block 2605 may be performed by an information vector component as described with reference to FIGS. 18 through 21.

At block 2610, the base station 105 may determine a first subset of a set of bit locations. For example, the encoder 210 of the base station 105 may determine the first subset of the set of bit locations based at least in part on a first reliability order determined from a recursive model for a first target mutual information value and a second subset of the set of bit locations based at least in part on a second reliability order determined from applying the mutual information model for a second target mutual information value. The operations of block 2610 may be performed according to the methods described with reference to FIGS. 1 through 13. In certain examples, aspects of the operations of block 2610 may be performed by a mutual information component as described with reference to FIGS. 18 through 21.

At block 2615, the base station 105 may identify a set of bit locations of the polar code to be used for information bits of the information bit vector. For example, the encoder 210 of the base station 105 may determine the set of bit locations based at least in part on a reliability order of the bit locations of the polar code. In some examples, the encoder 210 of the base station 105 may determine the reliability order based at least in part on a recursive model that includes at least one mutual information transfer function that is applied at each polarization stage of a plurality of polarization stages of the polar code. The operations of block 2615 may be performed according to the methods described with reference to FIGS. 1 through 13. In certain examples, aspects of the operations of block 2615 may be performed by a bit location selector component as described with reference to FIGS. 18 through 21.

At block 2620, the base station 105 may encode the information bit vector mapped to the set of bit locations using the polar code to obtain a codeword. The encoder 210 may load information bits into bit locations determined to be the most reliable for polar encoding to form a codeword for transmission over a wireless channel. In addition, the encoder 210 may encode k information bits and output a codeword having a length N, where k<N. Parity bits may be used in some forms of outer codes to provide redundancy to protect information bits, and frozen bits may be denoted by a given value (0, 1, etc.) known to both the encoder of the base station 105 and the decoder of the UE 115 (i.e., the encoder encoding information bits at a transmitter, and the decoder decoding the codeword received at a receiver). The operations of block 2620 may be performed according to the methods described with reference to FIGS. 1 through 13. In certain examples, aspects of the operations of block 2620 may be performed by a encoding component as described with reference to FIGS. 18 through 21.

At block 2625, the base station 105 may transmit the codeword over a wireless channel by way of a transmitter. In an example, transmitter 215 of the base station 105 may transmit the codeword. The operations of block 2625 may be performed according to the methods described with reference to FIGS. 1 through 13. In certain examples, aspects of the operations of block 2625 may be performed by a encoding component as described with reference to FIGS. 18 through 21.

Figure 27:
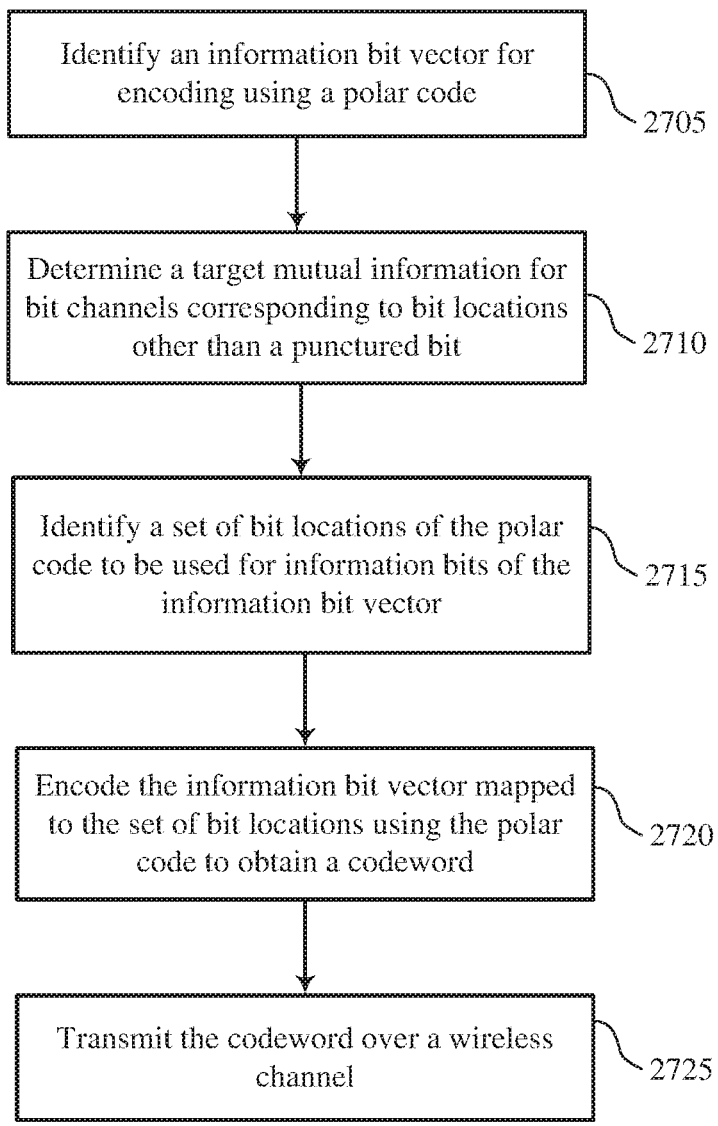

FIG. 27 shows a flowchart illustrating a method 2700 for mutual information based polar code construction in accordance with aspects of the present disclosure. The operations of method 2700 may be implemented by a base station 105 or its components as described herein. For example, the operations of method 2700 may be performed by a base station communications manager as described with reference to FIGS. 18 through 21. In some examples, a base station 105 may execute a set of codes to control the functional elements of the device to perform the functions described below. Additionally or alternatively, the base station 105 may perform aspects of the functions described below using special-purpose hardware.

At block 2705, the base station 105 may identify an information bit vector for encoding using a polar code. For example, an encoder 210 of the base station 105 may identify a set of bit locations that correspond to information bits of an encoded information bit vector. The operations of block 2705 may be performed according to the methods described with reference to FIGS. 1 through 13. In certain examples, aspects of the operations of block 2705 may be performed by an information vector component as described with reference to FIGS. 18 through 21.

At block 2710, the base station 105 may determine a target mutual information for bit channels corresponding to bit locations other than a punctured bit based at least in part on a number of information bits to be encoded and a number of the bit locations excluding a bit channel associated with the punctured bit. For example, an encoder 210 of the base station 105 may determine the target mutual information for each of the bit channels as the number of information bits k divided by length N. The operations of block 2710 may be performed according to the methods described with reference to FIGS. 1 through 13. In certain examples, aspects of the operations of block 2710 may be performed by a target mutual information component as described with reference to FIGS. 18 through 21.

At block 2715, the base station 105 may identify a set of bit locations of the polar code to be used for information bits of the information bit vector. For example, the encoder 210 of the base station 105 may determine the set of bit locations based at least in part on a reliability order of the bit locations of the polar code. In some examples, the encoder 210 of the base station 105 may determine the reliability order based at least in part on a recursive model that includes at least one mutual information transfer function that is applied at each polarization stage of a plurality of polarization stages of the polar code. The operations of block 2715 may be performed according to the methods described with reference to FIGS. 1 through 13. In certain examples, aspects of the operations of block 2715 may be performed by a bit location selector component as described with reference to FIGS. 18 through 21.

At block 2720, the base station 105 may encode the information bit vector mapped to the set of bit locations using the polar code to obtain a codeword. The encoder 210 may load information bits into bit locations determined to be the most reliable for polar encoding to form a codeword for transmission over a wireless channel. In addition, the encoder 210 may encode k information bits and output a codeword having a length N, where k<N. Parity bits may be used in some forms of outer codes to provide redundancy to protect information bits, and frozen bits may be denoted by a given value (0, 1, etc.) known to both the encoder of the base station 105 and the decoder of the UE 115 (i.e., the encoder encoding information bits at a transmitter, and the decoder decoding the codeword received at a receiver). The operations of block 2720 may be performed according to the methods described with reference to FIGS. 1 through 13. In certain examples, aspects of the operations of block 2720 may be performed by a encoding component as described with reference to FIGS. 18 through 21.

At block 2725, the base station 105 may transmit the codeword over a wireless channel. In an example, transmitter 215 of the base station 105 may transmit the codeword. The operations of block 2725 may be performed according to the methods described with reference to FIGS. 1 through 13. In certain examples, aspects of the operations of block 2725 may be performed by a encoding component as described with reference to FIGS. 18 through 21.

Figure 28:
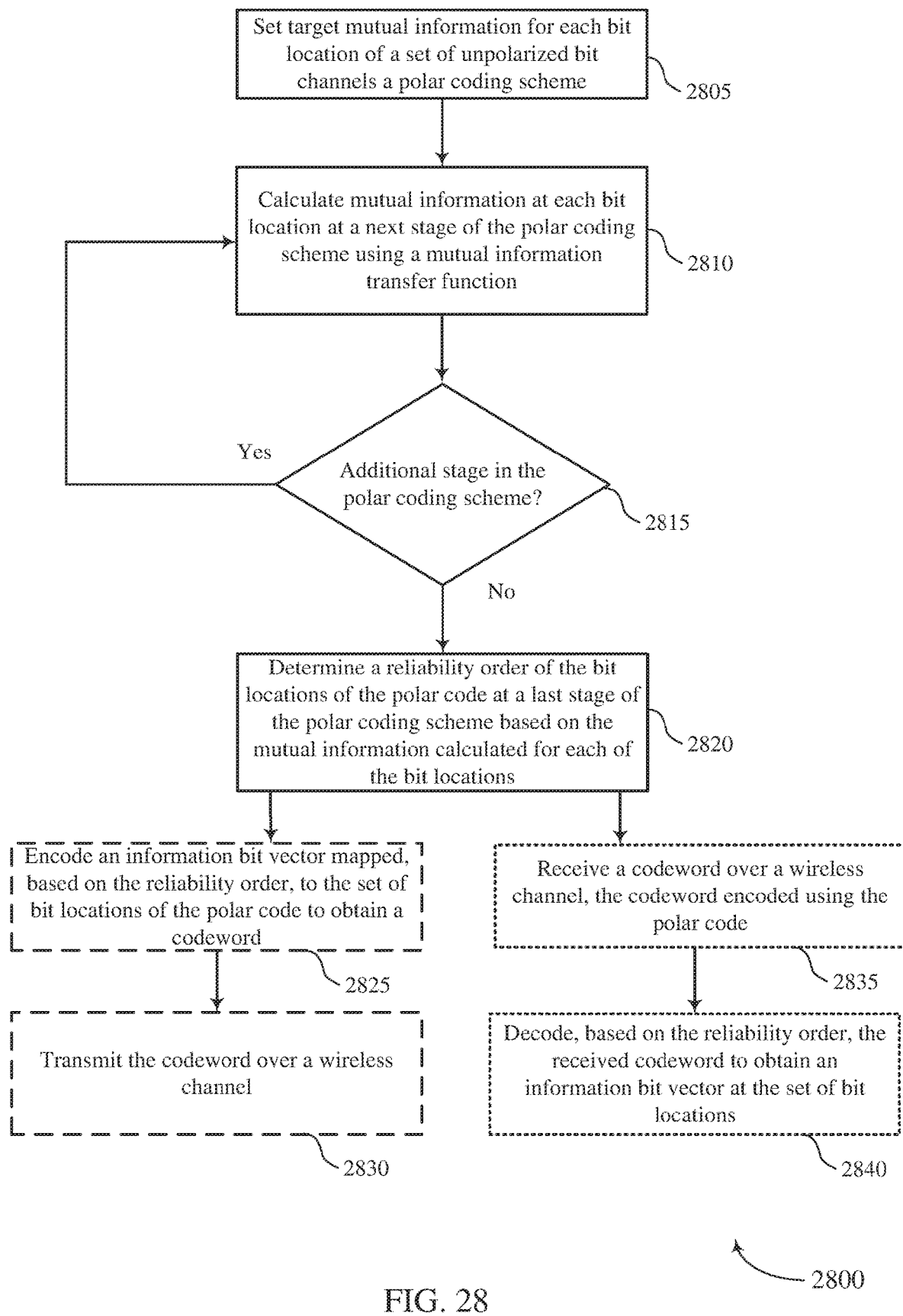

FIG. 28 shows a flowchart illustrating a method 2800 for mutual information based polar code construction in accordance with aspects of the present disclosure. The operations of method 2800 may be implemented by a base station 105, or a UE 115, or its components as described herein. For example, the operations of method 2800 may be performed by a UE communications manager as described with reference to FIGS. 14 through 17 or a base station communications manager as described with reference to FIGS. 18 through 21. In some examples, a base station 105 or a UE 115 may execute a set of codes to control the functional elements of the device to perform the functions described below. Additionally or alternatively, the base station 105 or a UE 115 may perform aspects of the functions described below using special-purpose hardware.

At block 2805, the base station 105 or UE 115 may set target mutual information for each bit location of a set of unpolarized bit channels of a polar coding scheme. For example, the target mutual information may be a function of the number of information bits k to be included in a codeword, and the length N of a codeword to be output by the polar coding scheme. The operations of block 2805 may be performed according to the methods described with reference to FIGS. 1 through 13. In certain examples, aspects of the operations of block 2805 may be performed by a decoder or an encoding component as described with reference to FIGS. 14 through 21.

At block 2810, the base station 105 or UE 115 may calculate mutual information at each bit location at a next stage of the polar coding scheme using a mutual information transfer function. For example, an encoder 210 of the base station 105 or the UE 115 may determine that mutual information of a first subset of the bit locations for a current polarization stage of the set of polarization stage may be based at least in part on mutual information of a second subset of the bit locations from a preceding polarization stage of the set of polarization stages. The operations of block 2810 may be performed according to the methods described with reference to FIGS. 1 through 13. In certain examples, aspects of the operations of block 2810 may be performed by a mutual information component as described with reference to FIGS. 14 through 21.

At block 2815, the base station 105 or UE 115 may determine if there is an additional polarization stage in the polar coding scheme. If there is an additional polarization stage, the flowchart returns to block 2810 and the base station 105 or UE 115 may calculate mutual information at each bit location at the additional stage of the polar coding scheme. If there is not an additional polarization stage in the polar coding scheme, the flowchart continues to block 2820, where the base station 105 or UE 115 may determine a reliability order of the bit locations of the polar code at a last stage of the polar coding scheme based on the mutual information calculated for each of the bit locations. The operations of block 2815 may be performed according to the methods described with reference to FIGS. 1 through 13. In certain examples, aspects of the operations of block 2815 may be performed by a mutual information component as described with reference to FIGS. 14 through 21.

In some cases, at block 2825, the base station 105 or UE 115 may encode an information bit vector mapped, based on the reliability order, to the set of bit locations of the polar code to obtain a codeword. For example, the encoder 210 of the base station 105 or UE 115 may load information bits to bit locations of different polarized bit channels for polar encoding based on a reliability order of the bit channels, and output a codeword. The operations of block 2825 may be performed according to the methods described with reference to FIGS. 1 through 13. In certain examples, aspects of the operations of block 2825 may be performed by an encoding component as described with reference to FIGS. 14 through 21.

At block 2830, the base station 105 or UE 115 may transmit the codeword over a wireless channel. For example, the transmitter 215 of the base station 105 or UE 115 may receive a codeword output by an encoder 210 and transmit the codeword via a wireless channel. The operations of block 2830 may be performed according to the methods described with reference to FIGS. 1 through 13. In certain examples, aspects of the operations of block 2830 may be performed by a decoder or encoding component as described with reference to FIGS. 14 through 21.

In some cases, at block 2835, the base station 105 or UE 115 may receive a codeword over a wireless channel, the codeword encoded using the polar code. For example, the codeword may be generated using an information bit vector including one or more information bits and other bits, such as frozen bits and parity check bits, and then encoded using a polar code. In some examples, a receiver 215 of the base station 105 or UE 115 may receive the codeword over the wireless channel. The operations of block 2835 may be performed according to the methods described with reference to FIGS. 1 through 13. In certain examples, aspects of the operations of block 2835 may be performed by a receiver as described with reference to FIGS. 1 through 13. In certain examples, aspects of the operations of block 2825 may be performed by a decoder or encoding component as described with reference to FIGS. 14 through 21.

At block 2840, the base station 105 or UE 115 may decode, based on the reliability order, the received codeword to obtain an information bit vector at the set of bit locations. For example, a receiver 210 of the base station 105 or UE 115 may provide the codeword to a decoder 210 for decoding, and the decoder 210 may identify a set of bit locations of the polar code corresponding to information bits of an encoded information bit vector. The operations of block 2840 may be performed according to the methods described with reference to FIGS. 1 through 13. In certain examples, aspects of the operations of block 2840 may be performed by a decoder as described with reference to FIGS. 14 through 21.

Figure 29:
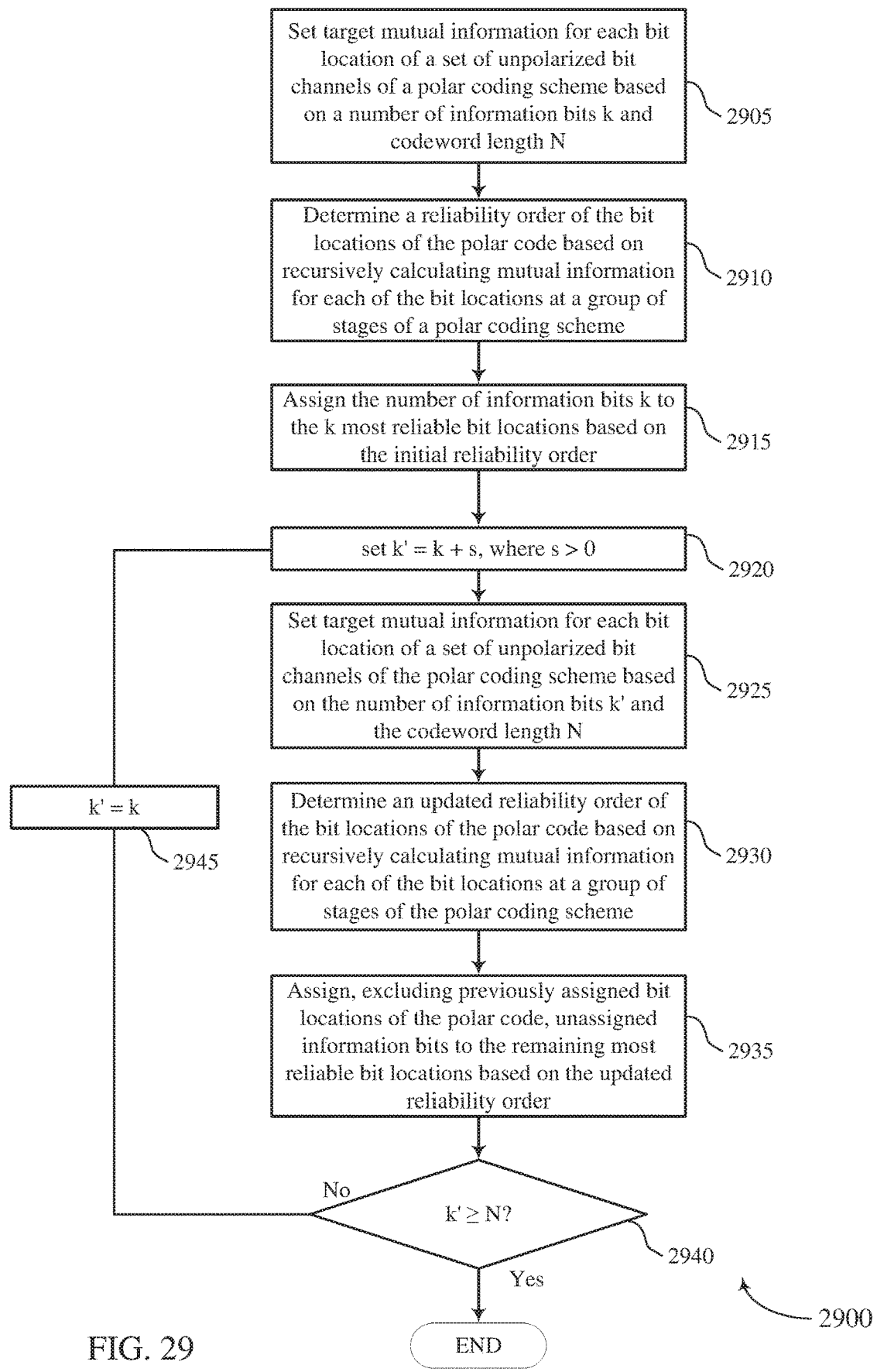

FIG. 29 shows a flowchart illustrating a method 2900 for mutual information based polar code construction in accordance with aspects of the present disclosure. The operations of method 2900 may be implemented by a base station 105, a UE 115, or its components as described herein. For example, the operations of method 2900 may be performed by a UE communications manager as described with reference to FIGS. 14 through 17 or a base station communications manager as described with reference to FIGS. 18 through 21. In some examples, a base station 105 or a UE 115 may execute a set of codes to control the functional elements of the device to perform the functions described below. Additionally or alternatively, the base station 105 or a UE 115 may perform aspects of the functions described below using special-purpose hardware.

At block 2905, the base station 105 or UE 115 may set target mutual information for each bit location of a set of unpolarized bit channels of a polar coding scheme based on a number of information bits k and codeword length N. For example, an encoder/decoder 210 of the base station 105 or UE 115 may set the target mutual information to the result of dividing a number of information bits k by codeword length N. The operations of block 2905 may be performed according to the methods described with reference to FIGS. 1 through 13. In certain examples, aspects of the operations of block 2840 may be performed by a mutual information component as described with reference to FIGS. 14 through 21.

At block 2910, the base station 105 or UE 115 may determine a reliability order of the bit locations of the polar code based on recursively calculating mutual information for each of the bit locations at a group of stages of a polar coding scheme. For example, the reliability order may be determined using a nested approach. The base station 105 or UE 115 may apply the recursive model at both a k information bits and k' information bits. In a nested approach, the k most reliable bit channels may be identified from the first iteration, and the k'−k next most reliable subset of the bit channels may be identified from the second iteration. The operations of block 2910 may be performed according to the methods described with reference to FIGS. 1 through 13. In certain examples, aspects of the operations of block 2840 may be performed by a mutual information component as described with reference to FIGS. 14 through 21.

At block 2915, the base station 105 or UE 115 may assign the number of information bits k to the k most reliable bit locations based on the initial reliability order. For example, where k=2, the base station 105 or UE 115 may identify the 2 most reliable bit channels, and load information bits into those 2 channels. The operations of block 2915 may be performed according to the methods described with reference to FIGS. 1 through 13. In certain examples, aspects of the operations of block 2840 may be performed by a mutual information component as described with reference to FIGS. 14 through 21.

At block 2920, the base station 105 or UE 115 may set k'=k+s, where s>0. For example, in a simplified example, s=2 and codeword length N=8, where any codeword length N, and step size s may be selected based on a desired or tolerable approximation error. The operations of block 2920 may be performed according to the methods described with reference to FIGS. 1 through 13. In certain examples, aspects of the operations of block 2825 may be performed by a decoder or encoding component as described with reference to FIGS. 14 through 21.

At block 2925, the base station 105 or UE 115 may set target mutual information for each bit location of a set of unpolarized bit channels of the polar coding scheme based on the number of information bits k' and the codeword length N. For example, an encoder/decoder 210 of the base station 105 or UE 115 may set the target mutual information to the result of dividing a number of information bits k' by codeword length N. The operations of block 2925 may be performed according to the methods described with reference to FIGS. 1 through 13. In certain examples, aspects of the operations of block 2840 may be performed by a mutual information component as described with reference to FIGS. 14 through 21.

At block 2930, the base station 105 or UE 115 may determine an updated reliability order of the bit locations of the polar code based on recursively calculating mutual information for each of the bit locations at a group of stages of the polar coding scheme. For example, the base station 105 or UE 115 may apply the recursive model at k' information bits. The operations of block 2930 may be performed according to the methods described with reference to FIGS. 1 through 13. In certain examples, aspects of the operations of block 2840 may be performed by a mutual information component as described with reference to FIGS. 14 through 21.

At block 2935, the base station 105 or UE 115 may assign, excluding previously assigned bit locations of the polar code, unassigned information bits to the remaining most reliable bit locations based on the updated reliability order. For example, as depicted in FIG. 9, bit channels 805-a and 805-b were previously identified as being the most reliable where k=2 information bits, and the recursive mutual information model identifies bit channels 805-c and 805-d as having the next two highest mutual information values among the remaining bit channels where k'=4 information bits. The operations of block 2935 may be performed according to the methods described with reference to FIGS. 1 through 13. In certain examples, aspects of the operations of block 2840 may be performed by a mutual information component as described with reference to FIGS. 14 through 21.

At block 2940, the base station 105 or UE 115 may determine if k'>N. For example, the process may be repeated using a given step size s (e.g., k'=k'+s) until k'=N. If not, then, at block 2945, k'=k, and the flowchart returns to set 2920. If yes, then the method ends. The operations of block 2940 may be performed according to the methods described with reference to FIGS. 1 through 13. In certain examples, aspects of the operations of block 2840 may be performed by a mutual information component as described with reference to FIGS. 14 through 21.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    receiving a codeword over a wireless channel, the codeword encoded using a polar code;
    identifying a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code; and
    decoding the received codeword to obtain the information bit vector at the set of bit locations.

2. The method of claim 1, further comprising:
    calculating mutual information of a first subset of the bit locations for a current polarization stage of the plurality of polarization stages based at least in part on mutual information of a second subset of the bit locations from a preceding polarization stage of the plurality of polarization stages.

3. The method of claim 1, wherein the reliability order of the bit locations of the polar code is constructed based at least in part on the recursive model and a plurality of different target mutual information values.

4. The method of claim 3, further comprising:
performing a sweep over the plurality of different target mutual information values to determine at least portions of respective output mutual information value curves for each of the bit locations of the polar code, and
determining the reliability order of the bit locations of the polar code corresponding to an order in which each of the respective output mutual information value curves reaches a defined output mutual information value with respect to the plurality of different target mutual information values.

5. The method of claim 3, wherein a first subset of the set of bit locations is determined based at least in part on a first reliability order determined from applying the recursive model for a first target mutual information value and a second subset of the set of bit locations is determined based at least in part on a second reliability order determined from applying the recursive model for a second target mutual information value.

6. The method of claim 5, wherein the first target mutual information value is based at least in part on a first number of information bits to be encoded and a number of the bit locations, and the second target mutual information value is based at least in part on a second number of information bits to be encoded and the number of the bit locations.

7. The method of claim 1, wherein a first bit location of the bit locations corresponds to a punctured bit.

8. The method of claim 7, wherein mutual information of the first bit location at a first polarization stage is calculated based at least in part on the at least one mutual information transfer function and mutual information associated with the punctured bit.

9. The method of claim 8, wherein the mutual information associated with the punctured bit is set to zero for non-shortening based puncturing or is set to a unity value for shortening-based puncturing.

10. The method of claim 7, wherein a target mutual information for bit channels corresponding to bit locations other than the punctured bit is determined based at least in part on a number of information bits to be encoded and a number of the bit locations excluding a bit channel associated with the punctured bit.

11. The method of claim 1, wherein the at least one mutual information transfer function is based at least in part on a binary erasure channel (BEC) function and a correction term.

12. The method of claim 11, wherein the correction term is based at least in part on a bit channel capacity of the each polarization stage and a capacity imbalance factor.

13. The method of claim 12, wherein the correction term comprises an offset factor applied to the bit channel capacity.

14. The method of claim 13, wherein the correction term comprises a scaling factor applied to the offset bit channel capacity.

15. The method of claim 14, wherein the correction term comprises an offset applied to the scaled and offset bit channel capacity.

16. The method of claim 1, wherein the codeword comprises at least one repeated bit of a bit location of the polar code, and wherein a target mutual information for bit channels of the polar code is determined based at least in part on a number of information bits to be encoded and a number of bit locations in the codeword including the repeated bit location.

17. The method of claim 16, wherein an offset is applied to the target mutual information for the bit channels.

18. The method of claim 1, wherein the recursive model is a Gaussian approximation density-based evolution model, and wherein the reliability order of the bit locations of the polar code is constructed based at least in part on the Gaussian approximation density-based evolution model and a plurality of different target signal to noise ratio (SNR) values.

19. The method of claim 18, further comprising:
performing a sweep over the plurality of different target SNR values to determine at least portions of respective error rate value curves for each of the bit locations of the polar code, and
determining the reliability order of the bit locations of the polar code corresponding to an order in which each of the respective error rate value curves reaches a defined error rate value with respect to the plurality of different target SNR values.

20. The method of claim 1, wherein identifying the set of bit locations of the polar code corresponding to the information bits of the encoded information bit vector comprises:
retrieving the set of bit locations from a table that includes a plurality of sets of bit locations.

21. The method of claim 1, further comprising:
storing a table that lists a plurality of sets of bit locations, wherein identifying the set of bit locations of the polar code corresponding to the information bits of the encoded information bit vector comprises:
determining that a first bit location of the bit locations corresponds to a punctured bit;
determining not to retrieve any of the plurality of sets of bit locations from the table; and
applying the recursive model by a decoder to identify the set of bit locations.

22. A method for wireless communication, comprising:
identifying an information bit vector for encoding using a polar code;
identifying a set of bit locations of the polar code to be used for information bits of the information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code;
encoding the information bit vector mapped to the set of bit locations using the polar code to obtain a codeword; and
transmitting the codeword over a wireless channel.

23. The method of claim 22, further comprising:
calculating mutual information of a first subset of the bit locations for a current polarization stage of the plurality of polarization stages based at least in part on mutual information of a second subset of bit locations from a preceding polarization stage of the plurality of polarization stages.

24. The method of claim 22, wherein the reliability order of the bit locations of the polar code is constructed based at least in part on the recursive model and a plurality of different target mutual information values.

25. The method of claim 24, further comprising:
performing a sweep over the plurality of different target mutual information values to determine at least portions of respective output mutual information value curves for each of the bit locations of the polar code, and determining the reliability order of the bit locations of the polar code corresponding to an order in which each of the respective output mutual information value curves reaches a defined output mutual information value with respect to the plurality of different target mutual information values.

26. The method of claim 24, wherein a first subset of the set of bit locations is determined based at least in part on a first reliability order determined from applying the recursive model for a first target mutual information value and a second subset of the set of bit locations is determined based at least in part on a second reliability order determined from applying the recursive model for a second target mutual information value.

27. The method of claim 26, wherein the first target mutual information value is based at least in part on a first number of information bits to be encoded and a number of the bit locations, and the second target mutual information value is based at least in part on a second number of information bits to be encoded and the number of the bit locations.

28. The method of claim 22, wherein a first bit location of the bit locations corresponds to a punctured bit.

29. The method of claim 28, wherein mutual information of the first bit location at a first polarization stage of the plurality of polarization stages is calculated based at least in part on the at least one mutual information transfer function and mutual information associated with the punctured bit.

30. The method of claim 29, wherein the mutual information associated with the punctured bit is set to zero for non-shortening-based puncturing or is set to a unity value for shortening-based puncturing.

31. The method of claim 28, wherein a target mutual information for bit channels corresponding to bit locations other than the punctured bit is determined based at least in part on a number of information bits to be encoded and a number of the bit locations excluding a bit channel associated with the punctured bit.

32. The method of claim 22, wherein the recursive model is a Gaussian approximation density-based evolution model, and wherein the reliability order of the bit locations of the polar code is constructed based at least in part on the Gaussian approximation density-based evolution model and a plurality of different target signal to noise ratio (SNR) values.

33. The method of claim 32, further comprising:
performing a sweep over the plurality of different target SNR values to determine at least portions of respective error rate value curves for each of the bit locations of the polar code, and
determining the reliability order of the bit locations of the polar code corresponding to an order in which each of the respective error rate value curves reaches a defined error rate value with respect to the plurality of different target SNR values.

34. The method of claim 22, wherein the at least one mutual information transfer function is based at least in part on a binary erasure channel (BEC) function and a correction term.

35. The method of claim 34, wherein the correction term is based at least in part on a bit channel capacity of the each stage of polarization and a capacity imbalance factor.

36. The method of claim 35, wherein the correction term comprises an offset factor applied to the bit channel capacity.

37. The method of claim 36, wherein the correction term comprises a scaling factor applied to the offset bit channel capacity.

38. The method of claim 37, wherein the correction term comprises an offset applied to the scaled and offset bit channel capacity.

39. The method of claim 22, wherein the codeword comprises at least one repeated bit of a bit location of the polar code, and wherein a target mutual information for bit channels of the polar code is determined based at least in part on a number of information bits to be encoded and a number of bit locations in the codeword including the repeated bit location.

40. The method of claim 39, wherein an offset is applied to the target mutual information for the bit channels.

41. The method of claim 22, wherein identifying the set of bit locations of the polar code corresponding to the information bits of the encoded information bit vector comprises:
retrieving the set of bit locations from a table that includes a plurality of sets of bit locations.

42. The method of claim 22, further comprising:
storing a table that lists a plurality of sets of bit locations, wherein identifying the set of bit locations of the polar code corresponding to the information bits of the encoded information bit vector comprises:
determining that a first bit location of the bit locations corresponds to a punctured bit;
determining not to retrieve any of the plurality of sets of bit locations from the table; and
applying the recursive model by an encoder to identify the set of bit locations.

43. An apparatus for wireless communication, comprising:
a memory;
a receiver configured to receive a codeword over a wireless channel, the codeword encoded using a polar code; and
a processor coupled to the memory and the receiver, the processor configured to:
identify a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code; and
decode the received codeword to obtain the information bit vector at the set of bit locations.

44. The apparatus of claim 43, the processor further configured to:
calculate mutual information of a first subset of the bit locations for a current polarization stage of the plurality of polarization stages based at least in part on mutual information of a second subset of the bit locations from a preceding polarization stage of the plurality of polarization stages.

45. The apparatus of claim 43, wherein the reliability order of the bit locations of the polar code is constructed based at least in part on the recursive model and a plurality of different target mutual information values.

46. The apparatus of claim 45, the processor further configured to:
perform a sweep over the plurality of different target mutual information values to determine at least portions of respective output mutual information value curves for each of the bit locations of the polar code, and
determine the reliability order of the bit locations of the polar code corresponding to an order in which each of the respective output mutual information value curves reaches a defined output mutual information value with respect to the plurality of different target mutual information values.

47. The apparatus of claim 45, wherein a first subset of the set of bit locations is determined based at least in part on a first reliability order determined from applying the recursive model for a first target mutual information value and a second subset of the set of bit locations is determined based at least in part on a second reliability order determined from applying the recursive model for a second target mutual information value.

48. The apparatus of claim 47, wherein the first target mutual information value is based at least in part on a first number of information bits to be encoded and a number of the bit locations, and the second target mutual information value is based at least in part on a second number of information bits to be encoded and the number of the bit locations.

49. The apparatus of claim 43, wherein the recursive model is a Gaussian approximation density-based evolution model, and wherein the reliability order of the bit locations of the polar code is constructed based at least in part on the Gaussian approximation density-based evolution model and a plurality of different target signal to noise ratio (SNR) values.

50. An apparatus for wireless communication, comprising:
a memory;
a processor coupled to the memory, the processor configured to:
identify an information bit vector for encoding using a polar code;
identify a set of bit locations of the polar code to be used for information bits of the information bit vector, wherein the set of bit locations is determined based at least in part on a reliability order of the bit locations of the polar code, and wherein the reliability order is determined based at least in part on a recursive model that includes at least one mutual information transfer function that is applied at each polarization stage of a plurality of polarization stages of the polar code; and
encode the information bit vector mapped to the set of bit locations using the polar code to obtain a codeword; and
a transmitter coupled to the processor and the memory, the transmitter configured to:
transmit the codeword over a wireless channel.

51. The apparatus of claim 50, wherein a first bit location of the bit locations corresponds to a punctured bit.

52. The apparatus of claim 51, wherein mutual information of the first bit location at a first polarization stage of the plurality of polarization stages is calculated based at least in part on the at least one mutual information transfer function and mutual information associated with the punctured bit.

53. The apparatus of claim 52, wherein the mutual information associated with the punctured bit is set to zero for non-shortening-based puncturing or is set to a unity value for shortening-based puncturing.

54. The apparatus of claim 51, wherein a target mutual information for bit channels corresponding to bit locations other than the punctured bit is determined based at least in part on a number of information bits to be encoded and a number of the bit locations excluding a bit channel associated with the punctured bit.

55. The apparatus of claim 50, wherein the at least one mutual information transfer function is based at least in part on a binary erasure channel (BEC) function and a correction term.

56. The apparatus of claim 50, wherein the codeword comprises at least one repeated bit of a bit location of the polar code, and wherein a target mutual information for bit channels of the polar code is determined based at least in part on a number of information bits to be encoded and a number of bit locations in the codeword including the repeated bit location.

57. The apparatus of claim 50, the processor further configured to:
calculate mutual information of a first subset of the bit locations for a current polarization stage of the plurality of polarization stages based at least in part on mutual information of a second subset of bit locations from a preceding polarization stage of the plurality of polarization stages.

58. The apparatus of claim 50, wherein the reliability order of the bit locations of the polar code is constructed based at least in part on the recursive model and a plurality of different target mutual information values.

59. The apparatus of claim 58, the processor further configured to:
perform a sweep over the plurality of different target mutual information values to determine at least portions of respective output mutual information value curves for each of the bit locations of the polar code, and
determine the reliability order of the bit locations of the polar code corresponding to an order in which each of the respective output mutual information value curves reaches a defined output mutual information value with respect to the plurality of different target mutual information values.

60. The apparatus of claim 58, wherein a first subset of the set of bit locations is determined based at least in part on a first reliability order determined from applying the recursive model for a first target mutual information value and a second subset of the set of bit locations is determined based at least in part on a second reliability order determined from applying the recursive model for a second target mutual information value.

61. The apparatus of claim 60, wherein the first target mutual information value is based at least in part on a first number of information bits to be encoded and a number of the bit locations, and the second target mutual information value is based at least in part on a second number of information bits to be encoded and the number of the bit locations.

62. The apparatus of claim 50, wherein the recursive model is a Gaussian approximation density-based evolution model, and wherein the reliability order of the bit locations of the polar code is constructed based at least in part on the Gaussian approximation density-based evolution model and a plurality of different target signal to noise ratio (SNR) values.

63. The apparatus of claim 62, the processor further configured to:
  perform a sweep over the plurality of different target SNR values to determine at least portions of respective error rate value curves for each of the bit locations of the polar code, and
  determine the reliability order of the bit locations of the polar code corresponding to an order in which each of the respective error rate value curves reaches a defined error rate value with respect to the plurality of different SNR values.

64. The apparatus of claim 50, wherein when the processor is configured to identify the set of bit locations of the polar code corresponding to the information bits of the encoded information bit vector, the processor is further configured to:
  retrieve the set of bit locations from a table that includes a plurality of sets of bit locations.

65. The apparatus of claim 50, the processor further configured to:
  store a table that lists a plurality of sets of bit locations, wherein identifying the set of bit locations of the polar code corresponding to the information bits of the encoded information bit vector further comprises instructions executable by the processor to:
  determine that a first bit location of the bit locations corresponds to a punctured bit;
  determine not to retrieve any of the plurality of sets of bit locations from the table; and
  apply the recursive model is performed by an encoder to identify the set of bit locations.

66. An apparatus for wireless communication, comprising:
  means for receiving a codeword over a wireless channel, the codeword encoded using a polar code;
  means for identifying a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one transfer function that is applied at each polarization stage of a plurality of polarization stages of the polar code; and
  means for decoding the received codeword to obtain the information bit vector at the set of bit locations.

67. An apparatus for wireless communication, comprising:
  means for identifying an information bit vector for encoding using a polar code;
  means for identifying a set of bit locations of the polar code to be used for information bits of the information bit vector, wherein the set of bit locations is determined based at least in part on a reliability order of the bit locations of the polar code, and wherein the reliability order is determined based at least in part on a recursive model that includes at least one transfer function that is applied at each polarization stage of a plurality of polarization stages of the polar code;
  means for encoding the information bit vector mapped to the set of bit locations using the polar code to obtain a codeword; and
  means for transmitting the codeword over a wireless channel.

68. A non-transitory computer readable medium storing code for wireless communication, the code comprising instructions executable by a processor to:
  receive a codeword over a wireless channel, the codeword encoded using a polar code;
  identify a set of bit locations of the polar code corresponding to information bits of an encoded information bit vector, wherein the set of bit locations is determined based at least in part on a reliability order of the bit locations of the polar code, and wherein the reliability order is determined based at least in part on a recursive model that includes at least one transfer function that is applied at each polarization stage of a plurality of polarization stages of the polar code; and
  decode the received codeword to obtain the information bit vector at the set of bit locations.

69. A non-transitory computer readable medium storing code for wireless communication, the code comprising instructions executable by a processor to:
  identify an information bit vector for encoding using a polar code;
  identify a set of bit locations of the polar code to be used for information bits of the information bit vector, wherein the set of bit locations is determined based at least in part on a reliability order of the bit locations of the polar code, and wherein the reliability order is determined based at least in part on a recursive model that includes at least one transfer function that is applied at each polarization stage of a plurality of polarization stages of the polar code;
  encode the information bit vector mapped to the set of bit locations using the polar code to obtain a codeword; and
  transmit the codeword over a wireless channel.

* * * * *